(12) United States Patent
Choi et al.

(10) Patent No.: US 7,785,672 B2
(45) Date of Patent: Aug. 31, 2010

(54) METHOD OF CONTROLLING THE FILM PROPERTIES OF PECVD-DEPOSITED THIN FILMS

(75) Inventors: Soo Young Choi, Fremont, CA (US); John M. White, Hayward, CA (US); Qunhua Wang, San Jose, CA (US); Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1260 days.

(21) Appl. No.: 11/021,416

(22) Filed: Dec. 22, 2004

(65) Prior Publication Data

US 2005/0255257 A1 Nov. 17, 2005

Related U.S. Application Data

(63) Continuation-in-part of application No. 10/962,936, filed on Oct. 12, 2004, which is a continuation-in-part of application No. 10/829,016, filed on Apr. 20, 2004, now Pat. No. 7,125,758, application No. 11/021,416, which is a continuation-in-part of application No. 10/897,775, filed on Jul. 23, 2004, which is a continuation-in-part of application No. 10/889,683, filed on Jul. 12, 2004.

(60) Provisional application No. 60/570,876, filed on May 12, 2004.

(51) Int. Cl.
H05G 1/24 (2006.01)
H05H 1/02 (2006.01)
(52) U.S. Cl. ...................... 427/569; 427/574
(58) Field of Classification Search .............. None
See application file for complete search history.

(56) References Cited

U.S. PATENT DOCUMENTS 5,399,387 A * 3/1995 Law et al. ............ 427/574
5,439,524 A 8/1995 Cain et al.

(Continued)

FOREIGN PATENT DOCUMENTS

EP 1168427 1/2002

(Continued)

OTHER PUBLICATIONS

S. K. Kim et al., "A Novel Self-Aligned Coplanar Amorphous Silicon Thin Film Transistor", ISSN0098-0966X/98/2901 (1998).

(Continued)

Primary Examiner—Timothy Meeks
Assistant Examiner—Kelly M Gambetta
(74) Attorney, Agent, or Firm—Shirley L. Church

(57) ABSTRACT

We have discovered methods of controlling a combination of PECVD deposition process parameters during deposition of thin films which provides improved control over surface standing wave effects which affect deposited film thickness uniformity and physical property uniformity. By minimizing surface standing wave effects, the uniformity of film properties across a substrate surface onto which the films have been deposited is improved. In addition, we have developed a gas diffusion plate design which assists in the control of plasma density to be symmetrical or asymmetrical over a substrate surface during film deposition, which also provides improved control over uniformity of deposited film thickness.

20 Claims, 30 Drawing Sheets

U.S. PATENT DOCUMENTS

| | | | |
|---|---|---|---|
| 5,614,055 A | 3/1997 | Fairbairn et al. | |
| 5,628,869 A | 5/1997 | Mallon | |
| 5,819,434 A | 10/1998 | Herchen et al. | |
| 5,876,838 A | 3/1999 | Mallon | |
| 5,928,732 A | 7/1999 | Law et al. | 427/579 |
| 5,990,016 A | 11/1999 | Kim et al. | |
| 6,113,700 A | 9/2000 | Choi | |
| 6,174,822 B1 * | 1/2001 | Nagano et al. | 438/763 |
| 6,182,603 B1 | 2/2001 | Shang et al. | |
| 6,228,438 B1 | 5/2001 | Schmitt | |
| 6,281,469 B1 | 8/2001 | Perrin et al. | |
| 6,344,420 B1 | 2/2002 | Miyajima et al. | |
| 6,383,573 B1 | 5/2002 | Beck et al. | |
| 6,454,855 B1 | 9/2002 | Von Kanel et al. | |
| 6,502,530 B1 | 1/2003 | Turlot et al. | |
| 6,556,536 B1 | 4/2003 | Reynolds et al. | |
| 6,619,131 B2 | 9/2003 | Walchli et al. | |
| 6,631,692 B1 | 10/2003 | Matsuki et al. | |
| 6,740,367 B2 | 5/2004 | Matsuki et al. | |
| 6,793,733 B2 | 9/2004 | Janakiraman et al. | |
| 6,814,838 B2 | 11/2004 | Weichart | |
| 6,852,168 B2 | 2/2005 | Park | |
| 6,873,764 B2 | 3/2005 | Maisenholder et al. | |
| 6,916,407 B2 | 7/2005 | Voser et al. | |
| 6,918,352 B2 | 7/2005 | Von Kanel et al. | |
| 6,961,490 B2 | 11/2005 | Maisenholder et al. | |
| 2001/0021422 A1 * | 9/2001 | Yamakoshi et al. | 427/569 |
| 2001/0023742 A1 | 9/2001 | Schmitt | |
| 2002/0011215 A1 | 1/2002 | Tei et al. | |
| 2002/0146879 A1 | 10/2002 | Fu et al. | 438/230 |
| 2003/0089314 A1 | 5/2003 | Matsuki et al. | |
| 2004/0129211 A1 | 7/2004 | Bonigan et al. | |
| 2005/0066898 A1 | 3/2005 | Schmitt et al. | |

FOREIGN PATENT DOCUMENTS

| | | |
|---|---|---|
| EP | 1286386 A1 * | 2/2003 |
| JP | 01/004481 A | 6/1987 |
| JP | 01149964 A2 | 6/1989 |

OTHER PUBLICATIONS

L. Kyung-ha, "A Study on Laser Annealed Polycrystalline Silicon Thin Film Transistors (TFTs) with SiNx Gate Insulator", Kyung Hee University, Ch. 2 & 4 (1998).

M. A. Lieberman et al., "Standing wave and skin effects in large-area, high-frequency capacitive discharges", Plasma Sources Sci. Technol., vol. 11, pp. 283-293 (2002).

Y. Park, "Bulk and interface properties of low-temperature silicon nitride films deposited by remote plasma enhanced chemical vapor deposition", Journal of Materials Science: Materials in Electronics, vol. 12, pp. 515-522 (2001).

A. Sazonov et al., "Low Temperature a-Si:H TFT on Plastic Films: Materials and Fabrication Aspects", Proc. $23^{rd}$ International Conference on Microelectronics (MIEL 2002), vol. 2, Niš, Yugoslavia (May 2002).

D. B. Thomasson et al., "High Mobility Tri-Layer a-Si:H Thin Film Transistors with Ultra-Thin Active Layer", 1997 Society for Information Display International Symposium Digest of Technical Papers, vol. 28, pp. 176-179 (May 1997).

* cited by examiner

METHOD OF CONTROLLING THE FILM PROPERTIES OF PECVD-DEPOSITED THIN FILMS

RELATED APPLICATIONS

This application is a continuation-in-part of U.S. application Ser. No. 10/962,936, filed Oct. 12, 2004, which is currently pending, which is a continuation-in-part of U.S. application Ser. No. 10/829,016, filed Apr. 20, 2004, which was pending at the time of filing the present application, and issued as U.S. Pat. No. 7,125,758, on Oct. 24, 2006. This application is also a continuation-in-part of U.S. application Ser. No. 10/897,775, filed Jul. 23, 2004, which is currently pending. This application is also a continuation-in-part of U.S. application Ser. No. 10/889,683, filed Jul. 12, 2004, which is currently pending, and which claims benefit of priority U.S. Provisional Application Ser. No. 60/570,876, filed May 12, 2004, which was pending at the time of filing of the present application, but has since become expired. This application also claims benefit of priority of U.S. Provisional Application Ser. No. 60/570,876. Each of the aforementioned applications share at least one inventor in common with the present application. Each of the aforementioned applications are hereby incorporated by reference in their entireties.

BACKGROUND OF THE INVENTION

1. Field of the Invention

The invention generally relates to a method of controlling process variables during PECVD deposition of a thin film. One important functional result of the variable control is an improvement in the uniformity of film properties of the deposited film across the substrate surface.

2. Brief Description of the Background Art

Current interest in thin film transistor (TFT) arrays is particularly high because these devices are used in liquid crystal active matrix displays (LCDs) of the kind often employed for computer and television flat panels. The liquid crystal active matrix displays may also contain light-emitting diodes (LEDs) for back lighting. As an alternative to LCD displays, organic light-emitting diodes (OLEDs) have also been used for active matrix displays, and these organic light-emitting diodes require TFTs for addressing the activity of the displays.

PECVD is generally accomplished by introducing a precursor gas or gas mixture into a vacuum chamber that contains a substrate. The precursor gas or gas mixture is typically directed downwardly through a distribution plate situated adjacent to a substrate on which a film is to be deposited. The precursor gas or gas mixture in the chamber is energized (e.g., excited) into a plasma by applying energy to the gas mixture. One commonly used method of energy application (by way of example and not by way of limitation) is the introduction of radio frequency (RF) power into the chamber from one or more RF sources coupled to the chamber. The excited gas or gas mixture reacts to form a layer of material on a surface of the substrate that is positioned on a temperature controlled substrate support. Volatile by-products produced during the reaction are pumped from the chamber through an exhaust system.

The TFT arrays created using PECVD are typically created on a flat substrate. The substrate may be a semiconductor substrate, or may be a transparent substrate, such as a glass, quartz, sapphire, or a clear plastic film. TFT arrays typically employ silicon-containing films, and, in particular, silicon nitride-containing films are often used for dielectric layers. A first silicon nitride-comprising film is referred to as the gate dielectric because it overlies the conductive gate electrode. A second silicon nitride-comprising film is referred to as the passivation dielectric and overlies the upper surface of a second conductive electrode, to electrically isolate the second conductive electrode from the ambient surrounding the upper surface of the TFT device (where the lower surface of the TFT device is the glass, quartz, sapphire, plastic, or semiconductor substrate).

FIG. 1 illustrates a schematic cross-sectional view of a thin film transistor structure of the kind which may employ both a silicon nitride-comprising gate dielectric film and a silicon nitride-comprising passivation dielectric film. This kind of thin film transistor is frequently referred to as an inverse staggered α-Si TFT with a $SiN_x$ layer as a gate insulator, or as a back channel etch (BCE) inverted staggered (bottom gate) TFT structure. This structure is one of the more preferred TFT structures because the gate dielectric ($SiN_x$) and the intrinsic as well as n+ (or p+) doped amorphous silicon films can be deposited in a single PECVD pump-down run. The BCE TFT shown in FIG. 1 involves only four or five patterning masks.

As previously mentioned, the substrate 101 for a TFT structure typically comprises a material that is essentially optically transparent in the visible spectrum, such as glass, quartz, sapphire, or a clear plastic. The substrate may be of varying shapes or dimensions. Typically, for TFT applications, the substrate is a glass substrate with a surface area greater than about 500 $cm^2$. A surface area of greater than about 45,000 $cm^2$ is not uncommon. A gate electrode layer 102 is formed on the substrate 101. The gate electrode layer 102 may comprise a metal layer such as, for example, aluminum (Al), tungsten (W), chromium (Cr), tantalum (Ta), molybdenum (Mo), molybdenum tungsten (MoW), titanium (Ti), or combinations thereof, among others. The gate electrode layer 102 may be formed using conventional deposition, lithography, and etching techniques. Between the substrate 101 and the gate electrode layer 102, there may be an optional (not shown) insulating layer, for example, such a silicon oxide or silicon nitride, which may also be formed using a PECVD system of the kind which will be described later herein.

A gate dielectric layer 103 is formed on the gate electrode layer 102. The gate dielectric layer may be silicon oxide, silicon oxynitride, or silicon nitride, deposited using such a PECVD system. The gate dielectric layer 103 may be formed to a thickness in the range of about 100 Å to about 6000 Å.

A bulk semiconductor layer 104 is formed on the gate dielectric layer 103. The bulk semiconductor layer 104 may comprise polycrystalline silicon (polysilicon), microcrystalline silicon (μc-Si), or amorphous silicon (α-silicon), which films can also be deposited using a PECVD system or other conventional methods known in the art. Bulk semiconductor layer 104 may be deposited to a thickness in the range of about 100 Å to about 3000 Å. A doped semiconductor layer 105 is formed on top of the semiconductor layer 104. The doped semiconductor layer 105 may comprise n-type (n+) or p-type (p+) doped polycyrstalline, microcrystalline, or amorphous silicon. Doped semiconductor layer 105 may be deposited to a thickness within a range of about 100 Å to about 3000 Å. An example of the doped semiconductor layer 105 is n+ doped α-silicon film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surfaces of gate dielectric layer 103, semiconductor layer 104, and doped semiconductor layer 105. The conductive layer 106 may comprise a metal such as, for example, aluminum, tungsten, molybdenum, chromium, tantalum, and combinations thereof, among others. The conductive layer 106 may be formed using conventional deposition techniques. Both the conductive layer 106 and doped semiconductor layer 105 may be lithographically patterned to define source and drain contacts of the TFT, 106a and 106b, respectively, in FIG. 1. After formation of the source and drain contacts 106a and 106b, a passivation dielectric layer 107 is typically applied. The passivation dielectric layer may be, for example, silicon oxide or silicon nitride. The passivation layer 107 may be formed using, for example, PECVD or other conventional methods known in the art. The passivation layer 107 may be deposited to a thickness in the range of about 1000 Å to about 5000 Å. The passivation layer 107 is then lithographically patterned and etched using conventional techniques, to open contact holes in the passivation layer.

A transparent electrically conductive layer 108 is then deposited and patterned to make contacts with the conductive layer 106. The transparent conductor layer 108 comprises a material that is essentially optically transparent in the visible spectrum. Transparent conductor 108 may comprise, for example, indium tin oxide (ITO) or zinc oxide among others. Patterning of the transparent electrically conductive layer 108 is accomplished by conventional lithographic and etching methods.

There are a number of additional TFT structures which may employ silicon nitride gate insulators, and several of these are presented in a disclosure entitled "A Study on Laser Annealed Polycrystalline Silicon Thin Film Transistors (TFTs) with SiNx Gate Insulator", by Dr. Lee Kyung-ha (Kyung Hee University, 1998). This disclosure is available at http://tftcd.khu.ac.kr/research/polySi. Dr. Lee Kyung-ha's disclosure pertains mainly to the use of laser annealed poly-Si TFTs, which is not the subject matter of the present invention, but the TFT structures are of interest as background material. The structures of interest are presented in Chapter 2 of the disclosure.

D. B. Thomasson et al., in an article entitled: "High Mobility Tri-Layer a-Si:H Thin Film Transistors with Ultra-Thin Active Layer" (1977 Society for Information Display International Symposium Digest of Technical Papers, volume 28, pages 176-179), describe active matrix liquid crystal displays where the TFT has an active layer thickness of about 13 nm. The TFT structure is a glass substrate with a molybdenum bottom electrode, a silicon nitride gate dielectric layer, an a-Si:H layer overlying the silicon nitride gate dielectric layer, n+ μc-Si:H doped source and drain regions, separated by a silicon nitride dielectric mesa, and with an aluminum contact layer overlying each source and drain region. This is referred to as a Tri-layer a-Si:H TFT structure. The authors claim that such hydrogenated amorphous silicon thin-film transistors with active layer thickness of 13 nm perform better for display applications than devices with thicker (50 nm) active layers. The linear ($V_{DS}$=0.1V) and saturation region mobility of a 5 μm channel length device is said to increase from 0.4 $cm^2/V \cdot sec$ and 0.7 $cm^2/V \cdot sec$, for a 50 nm a-Si:H device, to 0.7 $cm^2/V \cdot sec$ and 1.2 $cm^2/V \cdot sec$, for a 13 nm a-Si:H layer device fabricated with otherwise identical geometry and processing. The gate dielectric silicon nitride was deposited from a reactant gas mixture of $SiH_4$, $NH_3$, and Ar at 100 $mW/cm^2$, −150 V, 0.5 Torr, and 300° C. The passivation silicon nitride dielectric layer was deposited at the same conditions as the gate dielectric, with the exception of the substrate temperature, which was 250° C.

Young-Bae Park et al., in an article entitled: "Bulk and interface properties of low-temperature silicon nitride films deposited by remote plasma enhanced chemical vapor deposition" (Journal of Materials Science: Materials in Electronics 23 (2001), pp. 515-522), describe problems which occur when a gate dielectric, rather than being $SiN_x$, is a hydrogenated silicon nitride film (a-$SiN_x$:H). PECVD a-$SiN_x$:H thin films are said to be widely used as a gate dielectric for a-Si:H TFT applications, due to the good interfacial property between an a-Si:H layer and an a-$Si:N_x$:H layer. However, the a-Si:H TFTs with $SiN_x$:H gate dielectric are said to have instability problems, such as the threshold voltage shift and the inverse subthreshold slope under a DC gate voltage bias. These instability problems are said to be caused by the high trap density in the $SiN_x$:H film and the defects created at the a-Si:H/$SiN_x$:H interface. Charge trapping in the $SiN_x$:H is said to be from the electron injection under an applied field and due to the localized states of the Si dangling bonds, Si—H and N—H bonds in the forbidden gap. The authors claim that PECVD $SiN_x$:H dielectric films are not useful as a gate insulator because they contain large amounts of bonded hydrogen (20%-40%) in the form of N—H and Si—H bonds.

The authors propose that a remote plasma enhanced chemical vapor deposition of the gate dielectric layer be carried out. The $NH_3$ precursor is excited in a remote plasma zone (at the top of the chamber) to produce NH* or $NH_2$*+H*, after which the activated species* from the plasma zone react with $SiH_4$ introduced downstream through a gas dispersal ring to form the $SiN_x$:H electrical insulator with a reduction in the amounts of bonded hydrogen in the form of Si—H bonds, which are said to easily lose hydrogen to form a dangling bond of the kind known to reduce performance of the TFT device over time.

A presentation entitled: "Low Temperature a-Si:H TFT on Plastic Films: Materials and Fabrication Aspects", by Andrei Sazonov et al. (Proc. 23rd International Conference on Microelectronics (MIEL 2002), Vol. 2, NIS, Yugoslavia, 12-15 May 2002), related to fabrication technology for a-SiH thin film transistors at 120° C. for active matrix OLED displays on flexible plastic substrates. The TFTs produced were said to demonstrate performance very close to those fabricated at 260° C. The authors claim that, with the proper pixel integration, amorphous hydrogenated silicon (a-Si:H) TFTs are capable of supplying sufficiently high current to achieve required display brightness and thus can be a cost-effective solution for active matrix OLED displays.

The silicon nitride films used to produce the fabricated TFT samples were amorphous silicon nitride deposited at 120° C. by PECVD from $SiH_4$ and $NH_3$ gaseous precursors. The film is said to have a lower mass density and higher hydrogen concentration in comparison with films fabricated at 260° C. to 320° C. In the study, a series of a-$SiN_x$:H films with [N]/[Si] ratio ranging from 1.4 to 1.7 were deposited (at 120° C.). The hydrogen content in the films was in the range of 25-40 atomic percent. Generally, the films with higher [N]/[Si] are said to have higher mass density and higher compressive stress. The resistivity of a-$SiN_x$:H films estimated at the field of 1 MV/cm was said to be in the range of $10^{14}$-$10^{16}$ Ohm·cm, and the films with higher [N]/[Si] were said to have a higher breakdown field and dielectric constant than their lower N-content counterparts. A table of data supporting these conclusions is presented.

Compared to their higher temperature counterparts, the lower temperature a-$SiN_x$ films are characterized by higher hydrogen content. The nitrogen-rich films with a hydrogen concentration of about 40% or more exhibit hydrogen bonded predominantly to nitrogen atoms, with a high [N]/[Si] ratio achieved solely due to the high concentration of N—H bonds. The TFTs produced an a plastic film substrate at lower temperatures require a higher threshold voltage (4-5 V) than the TFTs produced on glass at the higher temperatures. As a result, the ON current observed for TFTs produced at the lower temperatures is lower. Although the performance properties of these TFTs complies with the requirements for OLED applications, it is apparent that it would be beneficial to lower the threshold voltage of the TFTs produced at the 120° C. temperature.

As indicated above, the performance capabilities of the TFT are a direct result of the structural characteristics of the films formed during fabrication of the TFTs. The structural characteristics of the films depend directly upon the process conditions and relative amounts of precursors which are used during formation of the films which make up the TFTs. As the size of flat panel displays increase, it becomes increasingly difficult to control the uniformity of the individual films produced across the increased surface area. With respect to PECVD deposited silicon-nitride comprising films, which are used either as the gate dielectric layer or as the passivation dielectric layer, control of uniformity of the film across the substrate becomes particularly difficult when the PECVD is carried out in a process chamber having parallel-plate capacitively-coupled electrodes over about one meter by one meter. At the higher RF power applications, the RF power appears to concentrate at the center of the electrode area, resulting in a dome-shaped thickness profile, and film properties are indicative of the non-uniform power distribution across the electrodes. This kind of phenomenon is more pronounced at the higher RF power which is used to obtain film deposition rates (D/R) which are in excess of about 1000 Å/min.

Conventional PECVD processes for producing a-SiN$_x$:H films employ a precursor gas mixture which is highly diluted with nitrogen ($N_2$) to obtain desired film properties. Such desired film properties are: a compressive film stress in the range of about 0 to $-10^{10}$ dynes/cm$^2$; low Si—H content of typically less than about 15 atomic %; and a low wet etch rate in HF solution (WER) of less than about 800 Å/min (normalized to thermal oxide at 1000 Å/min). However, a plasma produced at high concentrations of $N_2$ (where $N_2$:SiH$_4$ is greater than 2:1) in the precursor gas produces a particularly non-uniform plasma over a large surface area, for example a substrate having dimensions larger than about 1000 mm×1000 mm (1 m$^2$). This is believed to be due to the higher energy required to achieve dissociation of $N_2$ molecules. To overcome this problem with respect to the production of flat panel displays having large surface areas, the $N_2$ precursor gas was replaced by NH$_3$ precursor gas, which dissociates more easily.

More recently, there has been increased demand for even larger flat panel displays, for example, those with substrates having dimensions larger than about 1800 mm×2200 mm. Initial efforts to produce flat panel displays of this size using an NH$_3$ precursor to supply nitrogen during formation of the a-SiN$_x$:H gate dielectric films resulted in the formation of a-SiN$_x$:H films exhibiting a higher hydrogen content in the film. As discussed above, this higher hydrogen content leads to a higher threshold voltage requirement for the TFT, which is harmful to performance of the TFT. There is presently a need for a process which permits formation of the a-SiN$_x$:H gate dielectric films over large surface area substrates.

The doped or un-doped (intrinsic) amorphous silicon (a-Si), silicon dioxide (SiO$_2$), silicon oxynitride (SiON) and silicon nitride (SiN) films used in liquid crystal displays (or flat panels) could all be deposited using an embodiment of a plasma enhanced chemical vapor deposition (PECVD) system described in this invention. The TFT structure described here is merely used as an example. The current invention applies to manufacturing any devices that are applicable.

In the past, the basic principle behind the scale-up of PECVD processes was to maintain the intensive deposition parameters (such as process chamber pressure, electrode spacing, and substrate temperature) constant, while proportionately increasing the extensive deposition parameters (such as process gas flow rates and RF power to the plasma). However, due to ever increasing substrate sizes, which now approach a surface area of 40,000 cm$^2$, most PECVD processes do not properly scale up by adjustment of extensive deposition parameters alone, for various reasons. Furthermore, with respect to the extensive deposition parameters, fundamental problems may arise in the uniformity of film thickness and other film properties across the substrate surface as a consequence of non-uniform RF power density within the processing chamber.

One example of a problem which arises as surface area of the substrate increases is that of surface wave effects. A description of various surface wave effects which may affect power density distribution appears in an article by M. A. Lieberman et al., "Standing wave and skin effects in large-area, high-frequency capacitive discharges", *Plasma Sources Sci. Technol.*, Vol. 11, pp. 283-293 (2002), and M. A. Lieberman, *Principles of Plasma Discharges and Materials Processing*, Wiley-Interscience, New York (1994), for example.

The most important of the plasma surface wave effects are surface standing wave effects, which become significant when the total substrate surface area increases beyond about 1 square meter. Surface standing wave effects can have a significant effect on the uniformity of film thickness and other film properties across the substrate surface.

There is presently a need for a process which provides a broad operational window, so that scale-up is possible without loss of uniformity in the film properties across a substrate surface.

SUMMARY OF THE INVENTION

We have discovered and further developed methods of PECVD deposition which are useful in the manufacture of TFT structures having surface areas as large as about 1870 mm×2200 mm (and potentially larger), where the uniformity of the film thickness and uniformity of film properties, including chemical composition, is surprisingly consistent. In particular, the film deposition rate is typically greater than 1000 Å/min, and frequently, greater than about 2000 Å/min, while film thickness and film properties are maintained within specified tolerances for uniformity, which are discussed subsequently herein.

For example, by way of illustration, with respect to a gate dielectric layer, such as an a-SiN$_x$:H film, the following film variables are controlled: the Si—H bonded content of the a-SiN$_x$:H film is controlled to be less than about 15 atomic %; the film stress ranges from about 0 to about $-10^{10}$ dynes/cm$^2$; the film thickness across the substrate surface area varies by less than about 17%; the refractive index (RI) of the film ranges from about 1.85 to about 1.95; and, the wet etch rate in HF solution (which is an indication of film density) is less than 800 Å/min. In addition, the chemical composition of the film, in terms of Si—H bonded content, is consistently below the 15 atomic % maximum preferred. An a-SiN$_x$:H gate dielectric film exhibiting the physical characteristics listed above provides excellent performance capabilities.

In a previous effort to obtain a uniform distribution across a substrate having the dimensions of 1200 mm×1300 mm, while providing an a-SiN$_x$:H gate dielectric film exhibiting a low threshold voltage (low hydrogen content), we used a precursor source gas (precursor gas mixture) having a NH$_3$:SiH$_4$ ratio ranging from 3.1 to 8.6, a N$_2$:SiH$_4$ ratio ranging from 10.0 to 35.8, and a N$_2$:NH$_3$ ratio ranging from 2.4 to 10.0. A nitrogen content at this level did not cause a problem with film uniformity in terms of thickness and properties, including chemical composition across the substrate. However, we discovered that when the substrate size was increased to dimensions of 1500 mm to 1800 mm, this precursor source gas produced a non-uniform film thickness which varied by as much as about 25%; produced film structures where the Si—H bonded content exceeded 23 atomic %; and, produced films where the wet etch rate in HF solution (normalized to thermal oxide 1000 Å/min) exceeded 2400 Å/min in some instances. Based on our earlier experience, the nitrogen content of the precursor source gas needed to be reduced to produce a more uniform film thickness across the substrate.

We discovered that by increasing the NH$_3$:SiH$_4$ ratio to range between 5.3 to 10.0, while decreasing the N$_2$:SiH$_4$ ratio to range between 5.5 and 18.7, and decreasing the spacing between electrodes by an amount between about 20% and 50% from the baseline 1000 mils, we were able to deposit an a-SiN$_x$:H dielectric film with a film thickness which varied by less than about 17% over the substrate surface, while maintaining an Si—H bonded content in the film of less than 15 atomic %. The N$_2$:NH$_3$ ratio which provided excellent results ranged from about 0.6 to about 2.5, preferably 0.6 to about 2.3, which compared with the previous N$_2$:NH$_3$ ratio of 2.4 to 10. We also maintained a wet etch rate below about 800 Å/min over the a-SiN$_x$:H dielectric film surface using the new precursor source gas composition.

With respect to the deposition of an a-SiN$_x$:H dielectric film used as a passivation layer is that the substrate temperature during deposition of the passivation layer, one critical requirement is less than about 300° C., to prevent damage to TFT channel ion migration characteristics and to reduce damage to the source/drain (S/D) metal as well. With this in mind, the passivation layer is deposited at a substrate temperature ranging between about 150° C. and about 300° C., and preferably between about 260° C. and 280° C. The general requirement in the industry for performance of the passivation layer is that the breakdown voltage not fall below about 5 MV/cm. The step coverage of the a-SiN$_x$:H dielectric film used as a passivation layer needs to be better than for the gate dielectric film, to provide conformality over the S/D channel regions of the TFT device. The mechanical properties of the passivation layer are also important. For example, film stress for the passivation layer should be lower than for a gate dielectric layer. The film stress for the passivation layer should range between about +3×10$^{10}$ dynes/cm$^2$ to about −3×10$^{10}$ dynes/cm$^2$. Due to the decrease in deposition temperature, the wet etch rate of the deposited film typically increases (the density of the film decreases). One skilled in the art will need to balance the change in breakdown voltage, step coverage, and mechanical properties against other changes in device structure and properties to determine the best substrate temperature for deposition, based on the device performance requirements.

The combination process parameters required to produce the a-SiN$_x$:H gate dielectric film having the properties and uniformity described above include the following:

controlling the plasma density across the substrate surface during film deposition;

a substrate temperature during film deposition ranging from about 120° C. to about 370° C. in general, and from about 320° C. to about 340° C. when the substrate is glass;

a process pressure of less than about 2.0 Torr, and typically ranging from about 0.7 Torr to about 1.5 Torr at the substrate surface;

a plasma density ranging between about 0.2 W/cm$^2$ and about 0.6 W/cm$^2$;

a plasma precursor gas mixture in which the precursors gases include N$_2$, NH$_3$, and SiH$_4$, and where the component ratios are: NH$_3$:SiH$_4$ ranging from about 5.3 to about 10.0, N$_2$:SiH$_4$ ranging from about 5.5 to about 18.7, and N$_2$:NH$_3$ ranging from about 0.6 to about 2.3, and typically from about 0.6 to about 1.9;

an electrode spacing in the PECVD process chamber which ranges from about 400 mm to about 1000 mm, depending on the substrate size; and, a total precursor gas flow rate which is appropriate to maintain the desired nominal residence time of reactive species in the processing volume of the substrate.

The combination process parameters required to produce the a-SiN$_x$:H passivation dielectric film are different from those required to produce a gate dielectric film. This is because the desired performance properties of the passivation dielectric layer are different, and because the device surface upon which the passivation dielectric layer is deposited is far more sensitive to substrate temperature at the time of film deposition of the passivation dielectric layer. For example, the important performance characteristics of the passivation dielectric layer are not ion mobility and voltage threshold (as for the gate dielectric film), but are, instead, breakdown voltage, step coverage, and mechanical properties (such as residual film stress). An acceptable passivation layer may exhibit, for example, a WER of 5000 Å/min or higher and a S—H bonded structure content of 20% or higher, and still be acceptable. As a result, the ratios of precursor gases used for PECVD of a passivation layer of a-SiN$_x$:H are different. For example, the ratio of NH$_3$:SiH$_4$ may easily range (not by way of limitation) from about 5.6 to about 11.1, typically from about 5.6 to about 10.6. The ratio of N$_2$:SiH$_4$ may range, for example and not by way of limitation, from about 5.8 to about 20.8, and typically from about 5.8 to about 19.9. The ratio of N$_2$:NH$_3$ may range, for example and not by way of limitation, from about 0.4 to about 2.3, and typically from about 0.6 to about 1.9.

We have also discovered that adding H$_2$ to the precursor gas composition used for PECVD deposition of a-SiN$_x$:H films is effective in improving the wet etch rate and wet etch rate uniformity of a-SiN$_x$:H films across a substrate surface upon which the films have been PECVD deposited. Wet etch rate is an indication of film density. Typically, the lower the wet etch rate, the denser the film. The addition of H$_2$ to the SiH$_4$/NH$_3$/N$_2$ precursor gas composition results in greater control over the density uniformity of PECVD deposited a-SiN$_x$:H films than was previously achievable using prior art precursor gas compositions. The addition of H$_2$ to the film-forming precursor gas composition did not significantly increase the variation in deposited film thickness uniformity across the surface of the substrate, when all of the other variables described above were controlled as described. However, adding too much H$_2$ to the precursor gas composition may result in reduced film deposition rates and increased variation in film thickness uniformity.

H₂ is typically provided to the deposition chamber in an amount which does not exceed 30 volume % of the total gas flow to the chamber. H₂ is typically provided to the deposition chamber at about 15 to about 25 volume % of the total gas flow to the chamber.

We have developed relationships between process variables, control of which may be used to improve film deposition uniformity across large substrates (of the kind described herein). During the PECVD deposition of silicon-containing thin films, we improved the uniformity of film thickness and other film properties (while maintaining other performance requirements) by controlling a combination of process parameters to minimize surface standing wave effects during film deposition. Surface standing wave effects can be controlled by controlling the following parameters: the plasma density at point locations on the substrate surface; the thickness of a plasma sheath relative to the plasma width (where a relative increase in plasma sheath thickness tends to reduce standing wave effects); the RE frequency of the plasma source power (where a reduction in frequency tends to reduce standing wave effects); the amount of RF power applied to the plasma source (source gases) (where a reduction in the amount of power tends to reduce standing wave effects); the process chamber pressure (where a reduction in process chamber pressure tends to reduce standing wave effects); and the composition of the plasma source gases (where an increase in NH₃ flow rate relative to N₂ flow rate during the formation of an a-SiN$_x$:H film is beneficial in reducing standing wave effects), for example.

An increase in the thickness of the plasma sheath is one process variable which improves uniform film deposition by minimizing surface standing wave effects. The thickness of the plasma sheath can be increased, for example (and not by way of limitation), by decreasing the spacing between the upper and lower electrodes in a parallel plate processing chamber.

Other process variables which affect surface standing wave effects include electrode spacing and frequency of the RF power applied to create and maintain the plasma. When the PECVD processing chamber is a parallel plate processing chamber, such as an AKT™ PECVD 25KA System or a PECVD 40K System, the electrode spacing should be less than about 1200 mils, and typically ranges between about 400 mils about 1100 mils. The RF power frequency should range between about 27.12 MHz and about 7 MHz, and may be lower; however a frequency of 2 MHz and lower is known to cause film roughness due to ion bombardment. The process chamber pressure should range between about 0.5 Torr and about 3 Torr (more typically, within the range of about 0.7 Torr to about 1.8 Torr). The power density of RF power applied to the plasma source gas per substrate surface area should range from about 0.2 W/cm² to about 0.6 W/cm². In addition, the total precursor gas flow rate should range from about 20,000 sccm to about 70,000 sccm for an AKT™ PECVD 25KA System. This provides a chamber volume turnover ranging from about 0.02/min to about 0.07/min. Our recommendation is that the gas flow rate be such that a chamber volume turnover of about 0.015 or greater is achieved.

One skilled in the art, upon reading this disclosure, can calculate a plasma density distribution, an equivalent electrode spacing, an overall amount of RF power applied to the plasma source gases, and the total precursor gas flow rate necessary to compensate for a plasma processing chamber which is different from the processing chamber specified above.

As mentioned above, a reduction in the overall RF power to the plasma source to within the range of about 0.2 W/cm² to about 0.6 W/cm² can aid in improving film thickness uniformity. Although a decrease in RF power also decreases the film deposition rate, we have found that, for a silicon-containing PECVD deposited film, this range of RF power typically provides an acceptable film deposition rate of at least 1000 Å/min (by way of example and not by way of limitation).

The method is particularly useful when the substrate surface equivalent radius is about 0.5 meter or greater. The PECVD process parameters described above, when used in combination, provide better control over surface standing wave effects and film thickness uniformity in the deposition of silicon-containing films such as silicon nitride, silicon oxide, silicon oxynitride, amorphous silicon, and doped silicon (by way of example and not by way of limitation).

Of the parameters listed above which affect surface standing wave effects, controlling the plasma density at point locations on the substrate surface has the most significant impact on surface standing wave effects. We have found that, as substrate surface area is increased over 30,000 cm², to 40,000 cm² and beyond, process modifications are not always enough to compensate for surface standing wave effects which are caused by variations in plasma density across the substrate surface.

We have discovered that control of plasma density distribution over the substrate surface can be achieved, for example (and not by way of limitation), by equipment modifications, such as by modifying openings in the gas distribution diffuser plate so that there is an increase in hollow cathode effect from the center toward the edge of the diffuser plate. This increase in hollow cathode effect may be provided by gradually increasing diameters or depths, or combinations thereof, of the openings (hollow cathode cavities) from the center toward the edge of the diffuser plate. By increasing either the volume of the hollow cathode cavity from the center toward the edge of the diffuser plate or the number of gas passages present from the center toward the edge of the diffuser plate, hollow cathode effect is increased in this direction. This provides an increased surface area for hollow cathode cavity effect from the center toward the edge of the diffuser plate. To further increase the hollow cathode effect, the ratio of surface area to volume of the cavity may be increased. The increased hollow cathode effect adjusts the plasma density so that more uniformity is achieved from center to edge of the substrate. We have found that, by increasing the hollow cathode effect from the center toward the edge of the diffuser plate, modifications to other PECVD process variables, such as the precursor gas recipe may not be necessary to obtain a uniform film deposition.

A number of diffuser plate designs may be used to provide increased hollow cathode effect. In one embodiment, a gas distribution plate assembly for a plasma processing chamber comprises a diffuser plate having an upstream side and a downstream side, where the plasma source gases enter at the upstream side and plasma exits at the downstream side. Gas passages are present between the upstream and downstream sides of the diffuser plate which include hollow cathode cavities at the downstream side. By increasing the number of gas passages from the center of the diffuser plate toward the edge, the density of the hollow cathode volume can be increased from the center toward the edge of the diffuser plate, providing increased surface area and an increased hollow cathode effect. The increased hollow cathode effect toward the edge of the diffuser plate produces an increased plasma density toward the edge of the diffuser plate, which translates to an increased plasma density near the substrate surface toward the edges of the substrate surface. This adjusted plasma density is used to compensate for the effects of other processing variables of the kind described herein, so that a uniform film deposition is obtained over the entire substrate surface.

In another embodiment, a gas distribution plate assembly for a plasma processing chamber comprises a diffuser plate where the shape of the hollow cathode cavity is designed to provide an increased surface to volume ratio, so that the density of hollow cathode surface area per hollow cathode cavity is increased. This enables production of an increased hollow cathode effect at particular locations without the need to increase the number of hollow cathode cavities.

By gradually increasing the hollow cathode diameters or depths or combinations thereof, the density of hollow cathode cavity surface area and/or hollow cathode cavity volume can be increased from the center toward the edge of the diffuser plate, for example, increasing the plasma density toward the edge of the diffuser plate. Various embodiments of modified diffuser plate designs are described in detail in the "Detailed Description of the Preferred Embodiments" herein.

In the alternative, one skilled in the art will understand that it is possible to adjust the plasma density at various locations within the chamber by other types of modifications to the processing chamber, such as (by way of example and not by way of limitation) the use of magnets or other conductive elements at particular locations within the chamber.

Accordingly, disclosed herein is a method of improving film deposition uniformity of a PECVD deposited film over a substrate surface having an equivalent radius of about 0.5 meter or greater, where the method comprises controlling a plasma density across the substrate surface during film deposition. Particular process conditions for PECVD deposition of various silicon-containing films (in particular, silicon nitride and a-Si films) are provided in the "Detailed Description" below.

Also disclosed herein is a method of improving film deposition uniformity of a PECVD deposited film, where the plasma density is controlled across the substrate surface by employing apparatus which includes a gas distribution plate which provides a varying hollow cathode cavity effect at various points across the gas distribution plate. Also disclosed herein is a method of improving film deposition uniformity of a PECVD deposited film over a substrate surface, where the method comprises controlling surface standing wave effects across the substrate surface during film deposition.

Also described in detail herein is a gas diffusion plate for use in a PECVD film deposition apparatus, where the gas diffusion plate comprises a series of openings in which a hollow cathode effect is created. The hollow cathode effect is varied at points within the diffusion plate by varying the surface area or volume of particular hollow cathode cavities within the gas diffusion plate.

BRIEF DESCRIPTION OF THE DRAWINGS

The teachings of the present invention can be readily understood by considering the following detailed description in conjunction with the accompanying drawings.

FIG. 6A represents film uniformity available prior to the present invention and is a comparative example. FIGS. 6B and 6C represent film uniformity available after the present invention.

To facilitate understanding, identical reference numerals have been used, where possible, to designate identical elements that are common to the figures.

DETAILED DESCRIPTION OF EXEMPLARY EMBODIMENTS

Figure 1:
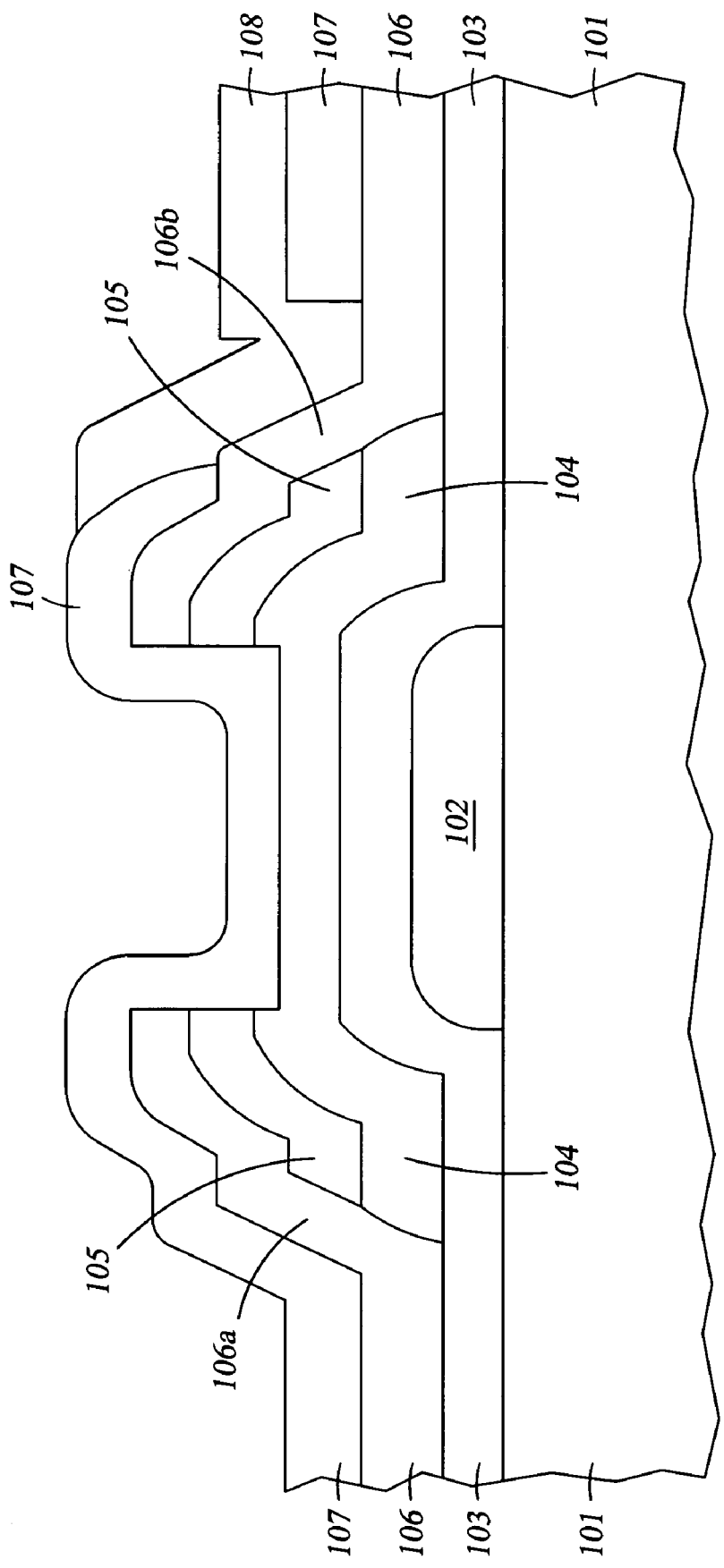
FIG. 1 shows a schematic cross-sectional view of one embodiment of a TFT device of the kind which employs the a-SiN$_x$:H gate and passivation dielectric films of the present invention.

As a preface to the detailed description presented below, it should be noted that, as used in this specification and the appended claims, the singular forms "a", "an", and "the" include plural referents, unless the context clearly dictates otherwise.

We developed a method of PECVD depositing silicon-containing films, and, by way of example and not by way of limitation, we describe in detail herein the deposition of particularly valuable a-SiN$_x$:H films which are useful as TFT device gate dielectric films or passivation layers. The method is especially useful when a series of TFT devices are arrayed over a substrate having a surface area larger than about 10,000 cm$^2$. The a-SiN$_x$:H films deposited using the method provide a uniformity of film thickness and uniformity of film properties, including chemical composition, which are difficult to produce over large surface areas.

One of the embodiments of the invention which was of great interest was the uniform deposition of an a-SiN$_x$:H gate film. For a PECVD precursor (plasma source) gas comprising SiH$_4$, NH$_3$ and N$_2$, we were surprised to discover that by increasing the NH$_3$:SiH$_4$ ratio to range between 5.3 to 10.0, while decreasing the N$_2$:SiH$_4$ ratio to range between 5.5 and 18.7, and decreasing the spacing between electrodes by an amount between about 20% and 50% from the baseline 1000 mils, we were able to produce an a-SiN$_x$:H film which contained less Si—H bonded structure (improved low threshold voltage), while maintaining film deposition uniformity. The film exhibited a thickness which varied by less than about 16% over the substrate surface, while maintaining a Si—H bonded content in the film of less than 15 atomic %. We also maintained a wet etch rate of the a-Si$_x$NH deposited film below about 800 Å/min. The N$_2$:NH$_3$ ratio which provided excellent results ranged from about 0.6 to about 2.5, preferably 0.6 to 2.3, which compared with the previous N$_2$:NH$_3$ ratio of 2.4 to 10.

In addition to developing a method of producing an a-SiN$_x$:H dielectric film which functions well as a TFT gate dielectric, we developed an a-SiN$_x$:H dielectric film which functions well as a passivation layer overlying the upper conductive electrode of the TFT device. The critical requirement for deposition of an a-SiN$_x$:H passivation dielectric layer is that the substrate temperature during deposition is less than about 300° C. (on a glass substrate), to prevent damage to TFT channel ion migration characteristics and to reduce damage to the source/drain (S/D) metal as well. With this in mind, the passivation layer is deposited at a substrate temperature ranging between about 150° C. and about 300° C., and preferably between about 260° C. and 280° C. The general requirement for performance of the passivation layer is that the breakdown voltage not fall below about 5 MV/cm. The step coverage of the a-SiN$_x$:H dielectric passivation layer needs to be better than for the gate dielectric film, to provide conformality over the S/D channel regions of the TFT device. The mechanical properties of the passivation layer are also important. For example, the film stress for the passivation layer should range between about +3×10$^{10}$ to about −3×10$^{10}$. Due to the decrease in deposition temperature, the wet etch rate of the deposited film typically increases (the density of the film decreases). One skilled in the art will need to balance the change in breakdown voltage, step coverage, and mechanical properties against other changes in device structure and properties to determine the best substrate temperature for deposition, based on the device performance requirements.

As previously described in commonly owned, copending U.S. application Ser. No. 10/897,775, filed Jul. 23, 2004 (the disclosure of which is hereby incorporated by reference in its entirety), we have also discovered that adding H$_2$ to the precursor gas composition used for PECVD deposition of a-SiN$_x$:H films is effective in improving the wet etch rate and wet etch rate uniformity of a-SiN$_x$:H films. Wet etch rate is an indication of film density. Typically, the lower the wet etch rate, the denser the film. The addition of H$_2$ to the SiH$_4$/NH$_3$/N$_2$ precursor gas composition results in greater control over the density uniformity of PECVD deposited a-SiN$_x$:H films than was previously achievable using prior art precursor gas compositions.

The addition of H$_2$ to the film-forming precursor gas composition did not significantly increase the variation in deposited film thickness across the surface of the substrate, indicating that surface standing wave effects due to an increased presence of hydrogen are minimal. Addition of about 15 to about 25 volume % H$_2$ to the precursor gas composition resulted in a lowered rate of film deposition, but the decrease was only about 5-13%. However, a-SiN$_x$:H films which were deposited using a precursor gas composition which included H$_2$ typically exhibited improved wet etch rate uniformities rates than a-SiN$_x$:H films which were deposited without H$_2$. In addition, the films deposited using a precursor gas composition which included H$_2$ exhibited wet etch rates which were significantly lower than the films which were deposited without H$_2$.

H$_2$ is typically provided to the deposition chamber in an amount which does not exceed 30 volume % of the total gas flow to the chamber. More typically, when control over film density is important, H$_2$ is provided to the deposition chamber at about 15 to about 25 volume % of the total gas flow to the chamber. Adding too much H$_2$ to the precursor gas composition may result in reduced film deposition rates and increased variation in film thickness uniformity.

However, when substrate surface area exceeds 30,000 cm$^2$, as discussed in the "Background of the Invention", most PECVD processes do not properly scale up by adjustment of extensive deposition parameters alone, for various reasons. One example of a problem which arises as surface area of the substrate increases is that of surface wave effects. There are three components of plasma surface wave effects: (1) surface standing wave effects, where the capacitive power deposition is maximum at the center and gradually decays toward the edge; (2) surface wave skin effects, where the inductive power deposition is maximum at the edge and gradually decays toward the center, where it is essentially 0; and, (3) evanescent wave skin effects, which are plasma edge effects sensitive to the actual boundary conditions.

Figures 2A, 2B:
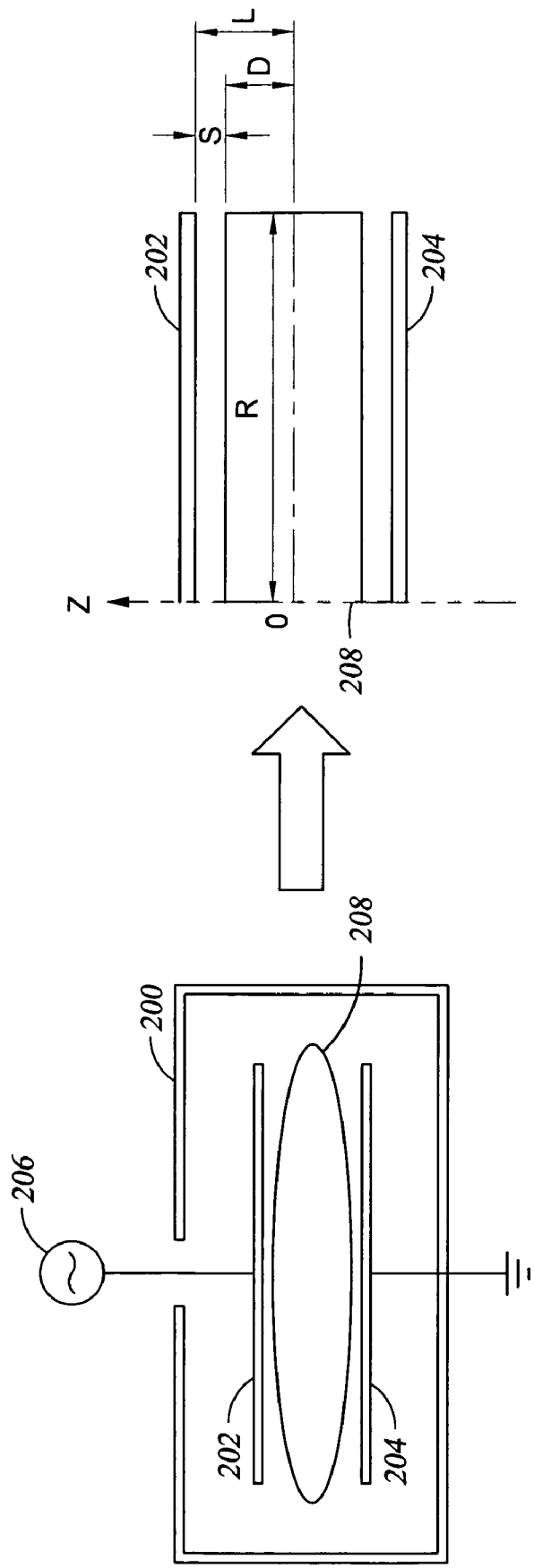
FIG. 2A is a cross-sectional schematic of a cylindrical parallel plate, capacitively coupled reactor.
FIG. 2B is a cross-sectional view of the reactor shown in FIG. 2A, taken from the center of the plasma region toward the edge (from the electrode center toward the edge of the electrode).

FIGS. 2A and 2B illustrate theoretic modeling of a cylindrical parallel plate, capacitively coupled reactor. The reactor 200, shown in cross-section in FIG. 2A, includes an upper electrode 202 and a lower electrode 204, which typically supports a substrate (not shown). RF power source 206 provides power to upper electrode 202, to generate a plasma 208 between upper electrode 202 and lower electrode 204. FIG. 2B shows a cross-section taken at the center of the plasma region 208, where R is the radius of the electrode (in meters), d is half the plasma width (in millimeters), L is the half-spacing between the electrodes (in millimeters), and s is the plasma sheath thickness (in millimeters).

Evanescent wave skin effects exhibit a sharp maximum at the edge of the reactor, then rapidly decay toward the center. With proper engineering of the plasma reactor periphery, evanescent wave skin effects can typically be expressed outside the area of the substrate surface.

Surface wave skin effects begin to have a significant effect on plasma uniformity when the plasma electron density ($n_e$) reaches a certain threshold, which was determined to be $n_e=1.39\times10^{11}/(dR)$ cm$^{-3}$ (where d is half of the plasma width in mm, and R is the radius of the electrode in meters). In typical PECVD film deposition processes, $n_e \leq 10^9$/cm$^3$. Therefore, this criterion is satisfied for most PECVD chambers, even for the larger rectangular substrates where the equivalent R (the half diagonal dimension of the substrate) is equivalent to 1.39 meters or greater, and the half-width of the plasma, d, is about 10 millimeters. Therefore, the non-uniform RF surface wave skin effects are generally negligible in a PECVD process scale up.

The most important of the plasma surface wave effects are surface standing wave effects, which become significant when the total substrate surface area increases beyond about 10,000 cm$^2$. Surface standing wave effects can have a significant effect on the uniformity of film thickness and other film properties across the substrate surface.

We have developed a method of PECVD depositing a thin film (such as a-Si or a-SiN$_x$:H film, by way of example and not by way of limitation) which provides improved control over surface standing wave effects during film deposition. The method involves controlling a combination of PECVD deposition process parameters. Although several of the examples described below pertain primarily to the deposition of silicon nitride films, the same process parameters can be manipulated in order to provide improved film uniformity during PECVD deposition of other silicon-containing thin films, such as silicon oxide, silicon oxynitride, a-Si, and doped a-Si (for example and not by way of limitation). This is illustrated by the close similarity of effect when an a-Si film is deposited by PECVD using the same process conditions. Proper control of these process variables provides a reduction in surface standing wave effects (and, hence, uniformity of film thickness and other film properties) across a substrate surface.

We have developed relationships between process variables, and control of the process variables can be used to minimize surface standing wave effects, providing improved film deposition uniformity across large substrates (of the kind described herein). Surface standing wave effects can be controlled by controlling the following parameters: the plasma density at point locations on the substrate surface; the thickness of a plasma sheath relative to the plasma width (where a relative increase in plasma sheath thickness tends to reduce standing wave effects); the RF frequency of the plasma source power (where a reduction in frequency tends to reduce standing wave effects); the amount of RF power applied to the plasma source (source gases) (where a reduction in the amount of power tends to reduce standing wave effects); the process chamber pressure (where a reduction in process chamber pressure tends to reduce standing wave effects); and the composition of the plasma source gases (where an increase in $NH_3$ flow rate relative to $N_2$ flow rate during the formation of an a-SiN$_x$:H film is beneficial in reducing standing wave effects), for example.

The most significant process variables affecting surface standing wave effects is the plasma density at point locations over the substrate surface. We have developed apparatus which enables control of plasma density distribution over the substrate surface and this will be discussed in detail after a discussion of other process variables.

As discussed above, surface standing wave effects become significant when the total substrate surface area increases beyond about 1 square meter. Referring back to FIG. 2B, the criterion for avoiding significant surface standing wave effects is:

$$\lambda_0 \gg 2.6(L/s)^{1/2} R$$

where $\lambda_0$ is the RF free space wavelength, L is the half-spacing between the electrodes (in millimeters), s is the thickness of the plasma sheath (in millimeters), and R is the equivalent radius of the electrode (in meters). Table One, below, shows the wavelengths $\lambda_0$, associated with various RF frequencies.

TABLE ONE

Wavelengths ($\lambda_0$) Associated with Various RF Frequencies

| RF Frequency (MHz) | Wavelength ($\lambda_0$) |
|---|---|
| 13.56 | 22.11 |
| 27.12 | 11.05 |
| 40.7 | 7.37 |
| 60 | 5 |
| 81.38 | 3.68 |

Table Two, below, shows the values of 2.6 (L/S)$^{1/2}$ R for various substrate sizes.

TABLE TWO 2.6 (L/s)$^{1/2}$ R for Various Substrate Sizes

| Substrate Size (mm) | R, equivalent, (m) | 2.6 (L/s)$^{1/2}$ R |
|---|---|---|
| 1100 × 1250 | 0.83 | 5.6 |
| 1500 × 1850 | 1.19 | 8 |
| 1870 × 2200 | 1.44 | 9.7 |

Where 2L=800 mils, that is 20 mm; s=1.5 mm

As the substrate size increases, the value of $\lambda_0$ needs to increase, to meet the requirement for avoiding significant surface standing wave effects. With this in mind, we carried out the experimentation described herein using an RF frequency of 13.56 MHz. We have found that reducing the RF frequency as low as 7 MHz (and possibly lower) can aid in controlling standing wave effects during PECVD thin film deposition (however, a frequency of 2 MHz and lower is known to cause film roughness due to ion bombardment).

A smaller electrode spacing (2L) and a thicker plasma sheath have been shown to reduce surface standing wave effects. Closer electrode spacing combined with an increased plasma sheath thickness (affected by power density, reactant concentrations and ratios, process chamber pressure, for example) effectively modify the plasma boundary conditions, thereby minimizing the non-uniformity of PECVD-deposited films.

An increase in the thickness of the plasma sheath, which is one of the factors which improves uniform film deposition, can be achieved, for example (and not by way of limitation), by decreasing the spacing between the upper and lower electrodes in a parallel plate processing chamber. Typically, the sheath thickness should be about 20 mils or greater.

When the PECVD processing chamber is a parallel plate processing chamber where the substrate surface area processed may be about 25,000 cm$^2$ to about 30,000 cm$^2$, such as the processing chamber used for processing substrates described in Examples One and Two, below, the electrode spacing was typically in the range from about 400 mils to about 800 mils. The sheath thickness "s" was about 20 mils or greater. In addition, the total precursor gas flow rate ranged from about 20,000 sccm to about 70,000 sccm, which typically provides a chamber precursor gas turnover ranging from about 0.015/min to about 0.07/min.

When the PECVD processing chamber is a parallel plate processing chamber where the substrate surface area processed may be in excess of 30,000 cm$^2$, such as the processing chamber used for processing the substrates described in Example Four, below, the electrode spacing was typically in the range from about 400 mils to about 1200 mils. The sheath thickness "s" was about 20 mils or greater. In addition, the total precursor gas flow rate ranged from about 40,000 sccm to about 150,000 sccm, which typically provides a chamber precursor gas turnover ranging from about 0.017/min to about 0.06/min.

We have also found that, during deposition of a silicon-containing film, reducing the RF power/substrate area which is applied to the plasma source so that it is within the range of about 0.2 W/cm$^2$ to about 0.6 W/cm$^2$ can aid in improving film thickness uniformity, while maintaining an acceptable film deposition rate of at least 1000/min.

Reducing the process chamber pressure to within the range of about 0.7 Torr to about 1.5 Torr (more typically, within the range of about 0.7 Torr to about 1.0 Torr) at the substrate surface also provides beneficial effects in terms of minimizing surface standing wave effects.

The PECVD process parameters described above, when used in combination, provide better control over surface standing wave effects and film thickness uniformity than was previously achievable. As previously discussed herein, one skilled in the art can calculate an equivalent electrode spacing, amount of RF power applied to the plasma source gases, and the total precursor gas flow rate when the plasma processing chamber is different from the processing chambers discussed herein.

We would now like to address plasma density at point locations over the substrate surface. Controlling the plasma density at point locations on the substrate surface has the most significant impact on surface standing wave effects, particularly as substrate sizes increase over 10,000 cm² (one square meter). The plasma density can be varied across the substrate surface, for example (and not by way of limitation), by equipment modifications, such as by modifying the diffuser plate used for gas distribution to provide increased hollow cathode effect toward the outer edges of the diffuser plate. By increasing either the volume of the hollow cathode cavity from the center toward the edge of the diffuser plate or the number of gas passages present from the center toward the edge of the diffuser plate, hollow cathode effect is increased in this direction. To further increase the hollow cathode effect, the ratio of surface area to volume of the cavity may be increased. We have found that, by increasing the hollow cathode effect from the center toward the edge of the diffuser plate, modifications to other PECVD process variables, such as the precursor gas recipe may not be necessary to obtain a uniform film deposition.

A number of diffuser plate designs may be used to provide increased hollow cathode effect. In one embodiment, a gas distribution plate assembly for a plasma processing chamber comprises a diffuser plate having an upstream side and a downstream side, where the plasma source gases enter at the upstream side and plasma exits at the downstream side. Gas passages are present between the upstream and downstream sides of the diffuser plate which include hollow cathode cavities at the downstream side. By increasing the number of gas passages from the center of the diffuser plate toward the edge, the density of the hollow cathode volume can be increased from the center toward the edge of the diffuser plate, providing increased surface area and an increased hollow cathode effect. The increased hollow cathode effect toward the edge of the diffuser plate produces an increased plasma density toward the edge of the diffuser plate, which translates to an increased plasma density near the substrate surface toward the edges of the substrate surface. This adjusted plasma density is used to compensate for the effects of other processing variables of the kind described herein, so that a uniform film deposition is obtained over the entire substrate surface.

In another embodiment, a gas distribution plate assembly for a plasma processing chamber comprises a diffuser plate where the shape of the hollow cathode cavity is designed to provide an increased surface to volume ratio, so that the density of hollow cathode surface area per hollow cathode cavity is increased. This enables production of an increased hollow cathode effect at particular locations without the need to increase the number of hollow cathode cavities.

By gradually increasing the hollow cathode diameters or depths or combinations thereof, the density of hollow cathode cavity volume can be increased from the center toward the edge of the diffuser plate, for example, increasing the plasma density toward the edge of the diffuser plate.

In another embodiment, the number densities or the shape/surface areas of hollow cathode cavities are varied at points across the substrate surface to compensate for peculiarities in the processing chamber and internal apparatus which affect the uniformity of the plasma density across the substrate.

In a typical symmetrical gas diffusion plate design, the diffuser plate may be divided into a number of concentric zones, where the gas entry passages in each of the zones are identical; however, the number density, the volume, or surface area of hollow cathode cavities of gas passages in each zone gradually increase from the center to the edge of the diffuser plate.

In another embodiment, a diffuser plate comprises a body having a top surface and a bottom surface, a plurality of gas passages between the top surface the bottom surface, and an outer region and an inner region wherein the body between the top and the bottom of the outer region is thicker than the body between the top and the bottom of the inner region.

In another embodiment, a method of making a gas diffuser plate for a plasma processing chamber comprises making a gas diffuser plate to have an upstream side and a down stream side, and a plurality of gas passages passing between the upstream and downstream sides of the diffuser plate, and machining the downstream surface to make the downstream surface or portions of the downstream surface concave. This machining changes the volume/shape/surface area of hollow cathode cavities present in the machined areas at the downstream surface of the gas diffuser plate.

Diffusion plate fabrication techniques may vary as well. In one method of making a symmetrical gas diffuser plate including an upstream side and a downstream side, and a plurality of gas passages passing between hollow cathode cavities at the downstream side of the diffuser plate, the diffuser plate is deformed to provide a smooth convex surface on the downstream side, with subsequent machining of the convex surface to flatten the surface, whereby the volumes and resultant surface areas of the hollow cathode cavity surface areas at the downstream side of the diffuser plate gradually increase from the center toward the edge of the diffuser plate.

In another fabrication embodiment, the gas diffuser plate is directly machined to have an upstream side and a downstream side, and a plurality of gas passages passing between, with hollow cathode cavities at the downstream side, wherein number densities, volumes, or surface areas of the hollow cathode cavities are machined to gradually increase from the center to the edge of the diffuser plate or to provide a varying hollow cathode activity which is designed to compensate for other processing parameters which may be peculiar to a given processing apparatus.

In yet another embodiment, a method of making a gas diffuser plate for a plasma processing chamber comprises deforming a diffuser plate to have an upstream side and a downstream side, where the downstream surface is concave and the upstream surface is convex, and creating a plurality of gas passages passing between the upstream and downstream sides of the diffuser plate, the passages including hollow cathode cavities at the downstream side, where the distance from the origination point of the hollow cathode cavities to a fictitious flat downstream surface is constant, with the upstream side gas passages leading to the hollow cathode cavities having a constant orifice size.

The invention employed in a method of depositing a thin film on a substrate comprises placing a substrate in a process chamber with a gas diffuser plate having an upstream side and inner and outer gas passages passing between the upstream and downstream sides of the diffuser plate, where the outer gas passages comprise hollow cathode cavities at the downstream side, and where either the hollow cathode cavity number density, or the hollow cathode cavity volume density, or the hollow cathode cavity surface area density is increased at particular locations on the diffusion plate surface to provide a uniform plasma point density across the substrate surface, and depositing a thin film on the substrate in the process chamber.

In an alternative to modifying the gas distribution plate as discussed above, one skilled in the art will understand that it is possible to adjust the plasma density at various locations adjacent to the substrate surface within the chamber using other types of modifications to the processing chamber, such as (by way of example and not by way of limitation) the use of magnets and/or conductive elements at particular locations outside of the processing volume of the chamber.

I. APPARATUS FOR PRACTICING THE INVENTION

The embodiment example PECVD processes described in Examples One and Two, below, were carried out in a parallel plate processing chamber, the AKT™ PECVD 25 KA System, available from AKT™, a division of Applied Materials, Inc., Santa Clara, Calif. This system, which is illustrated schematically in FIG. 3A, is capable of processing substrates having dimensions of up to 1500 mm×1850 mm.

Figure 3A:
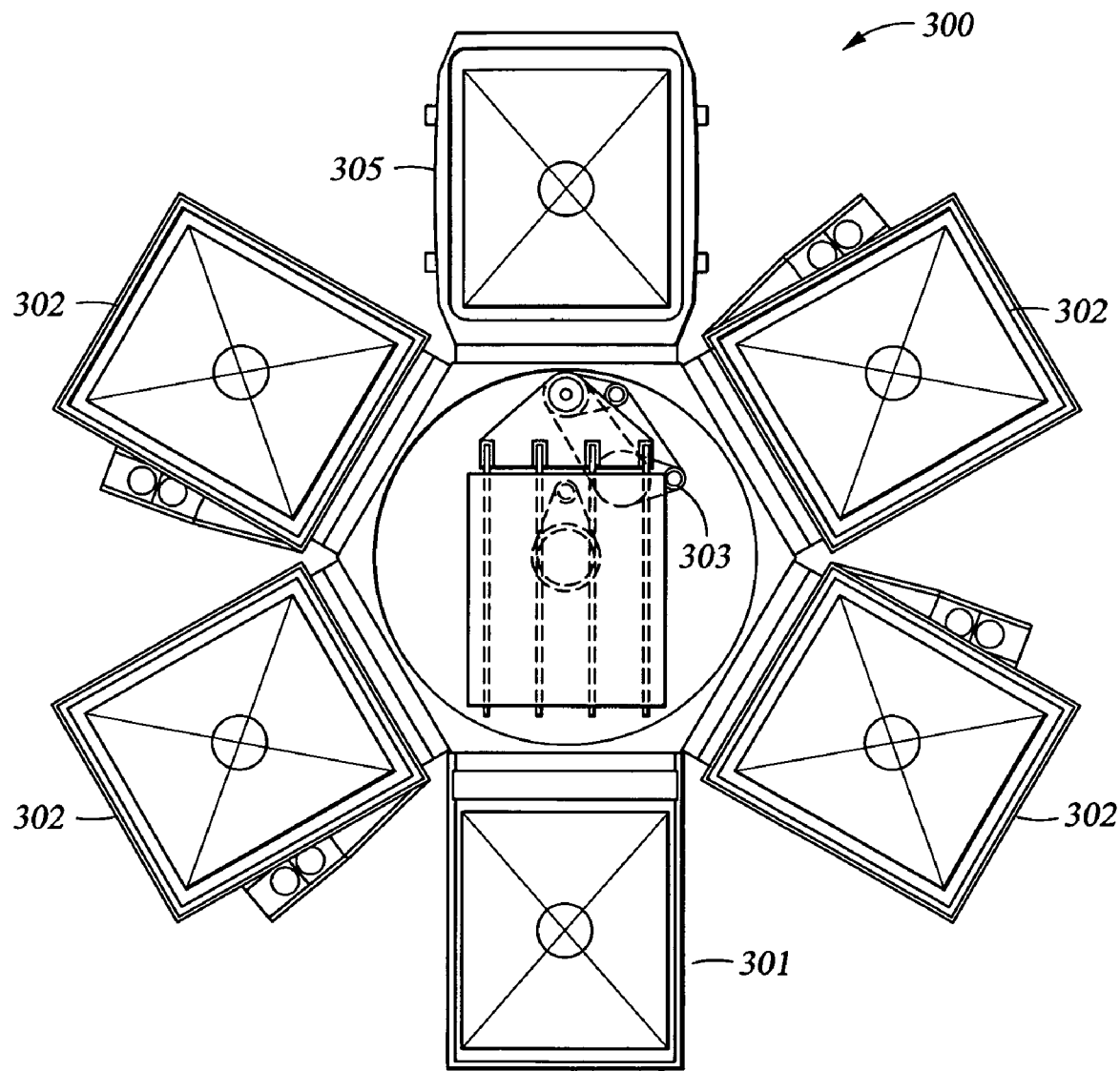
FIG. 3A is a schematic of a top view of a PECVD processing system of the kind which can be used to deposit the films of the present invention. The PECVD processing system shown in FIG. 3A is capable of processing substrates having dimensions of up to 1500 mm×1850 mm.

Referring to FIG. 3A, the system 300 generally includes a loadlock chamber 301 for loading substrates (not shown) into the system; a robot assembly 303 for transferring substrates between chambers in the system; four PECVD processing chambers 302; and an optional substrate heater 305. The AKT™ PECVD 25 KA System is also available with a fifth PECVD processing chamber in place of substrate heater 305.

Figure 3B:
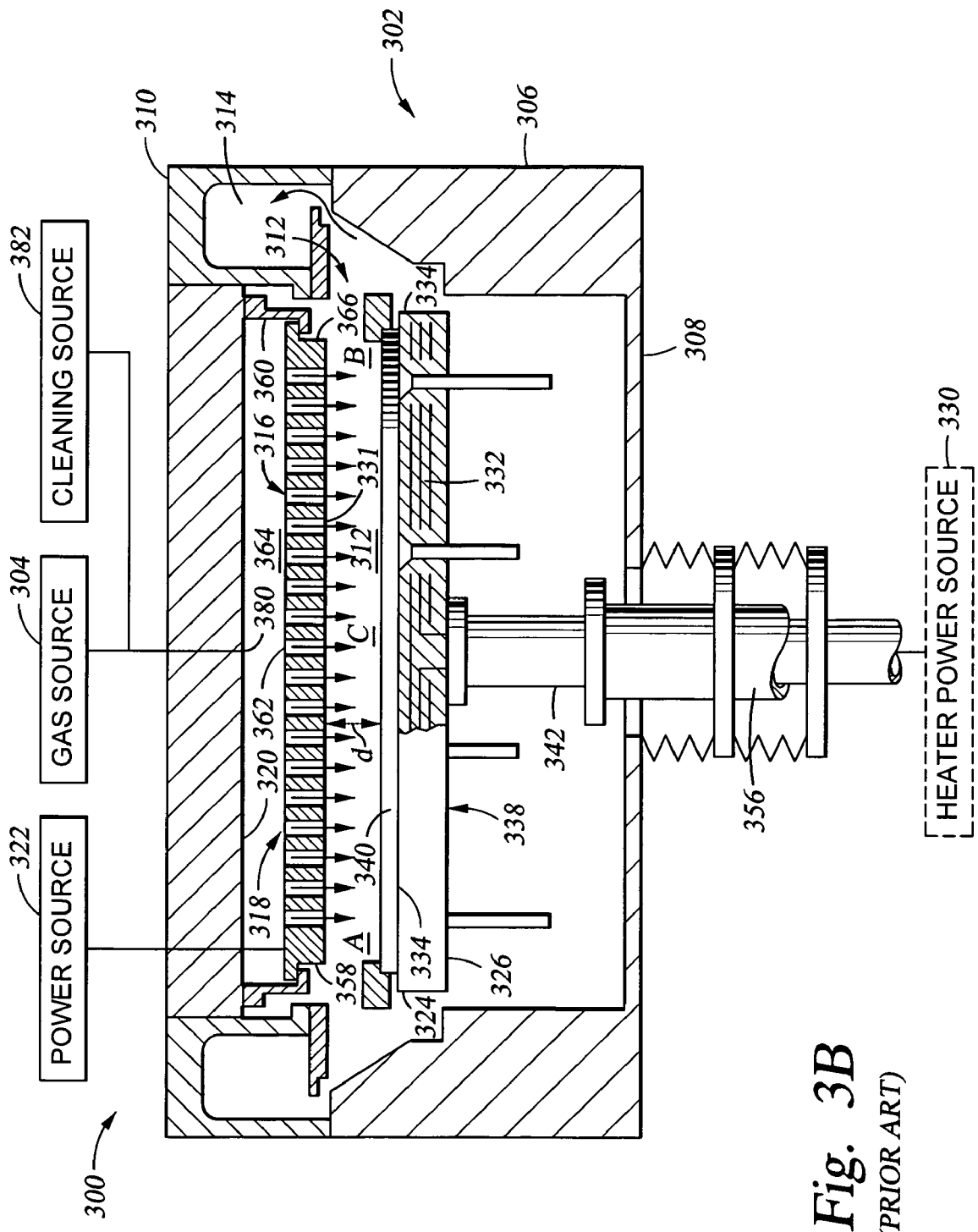
FIG. 3B is a schematic of a side view of a PECVD processing chamber of the kind which can be used to deposit the films of the present invention.

Referring to FIG. 3B, each processing chamber 302 is typically coupled to a gas source 304. The processing chamber 302 has walls 306 and a bottom 308 that partially define a processing volume 312. The processing volume 312 is typically accessed through a port (not shown) in the walls 306 that facilitate movement of a substrate 340 into and out of processing chamber 302. The walls 306 support a lid assembly 310 that contains a pumping plenum 314 that couples the processing volume 312 to an exhaust port (that includes various pumping components, not shown).

A temperature controlled substrate support assembly 338 is centrally disposed within the processing chamber 302. The substrate support assembly 338 supports the glass (for example, but not by way of limitation) substrate 340 during processing. The substrate support assembly 338 typically encapsulates at least one embedded heater 332, such as a resistive element. The heater element 332 is coupled to a power source 330 which is controlled to heat the substrate support assembly 338 and the substrate 340 positioned thereon. Typically, in a CVD process, the heater maintains the substrate 340 at a uniform temperature between about 120° C. and 460° C., depending on the processing parameters required for the particular substrate.

Generally, the substrate support assembly 338 has a lower side 326 and an upper side 334. The upper side 334 supports the glass substrate 340. The lower side 326 has a stem 342 coupled thereto. The stem 342 couples the substrate support assembly 338 to a lift system (not shown) that moves the support assembly 338 between an elevated processing position (as shown) and a lowered position that facilitates substrate transfer to and from the processing chamber 302. The stem 342 additionally provides a conduit for electrical and thermocouple leads between the substrate support assembly 338 and other components of the system 300.

The substrate support assembly 338 is generally grounded such that RF power supplied by a power source 322 to a gas distribution plate assembly 318 positioned between the lid assembly 310 and the substrate support assembly 338 (or other electrode positioned within or near the lid assembly of the chamber) may excite gases present in the processing volume 312 between the substrate support assembly 338 and the distribution plate assembly 318. The RF power from the power source 322 is generally selected commensurate with the size of the substrate, to drive the chemical vapor deposition process. The distance "d" illustrates the spacing between the upper surface 334 of substrate support assembly 338 and the lower surface 331 of distribution plate assembly 318. This is also the spacing between electrode surfaces, since distribution plate 318 acts as a first electrode, while substrate support 338 acts as the second electrode. The spacing "d", in combination with the thickness of the substrate 340, substantially determines the processing volume 312. The spacing "d" (which is equivalent to 2L in FIG. 2B) can be adjusted as necessary to provide the desired processing conditions.

The lid assembly 310 typically includes an entry port 380 through which process gases provided by the gas source 304 are introduced into processing chamber 302. The entry port 380 is also coupled to a cleaning source 382. The cleaning source 382 typically provides a cleaning agent, such as dis-associated fluorine, that is introduced into the processing chamber 302 to remove deposition by-products and films from processing chamber hardware.

The gas distribution plate assembly 318 is coupled to an interior side 320 of the lid assembly 310. The gas distribution plate assembly 318 is typically configured to substantially follow the profile of the substrate 340, for example, polygonal for large area substrates and circular for wafers. The gas distribution plate assembly 318 includes a perforated area 316 through which process and other gases supplied from the gas source 304 are delivered to the processing volume 312. The perforated area 316 of the gas distribution plate assembly 318 is typically configured to provide uniform distribution of gases passing through the gas distribution plate assembly 318 into the processing chamber 302.

The gas distribution plate assembly 318 typically includes a diffuser plate 358 suspended from a hanger plate 360. The diffuser plate 358 and hanger plate 360 may alternatively comprise a single unitary member. A plurality of gas passages 362 are formed through the diffuser plate 358 to allow a predetermined distribution of a precursor source gas passing through the gas distribution plate assembly 318 and into the processing volume 312. The hanger plate 360 maintains the diffuser plate 358 and the interior surface 320 of the lid assembly in a spaced-apart relation, thus defining a plenum 364 therebetween. The plenum 364 allows gases flowing through the lid assembly 310 to uniformly distribute across the width of the diffuser plate 358 so that gas is provided uniformly above the center perforated area 316 and flows with a uniform distribution through gas passages 362.

The diffuser plate 358 is typically fabricated from stainless steel, aluminum (Al), anodized aluminum, yttrium oxide-coated aluminum, nickel (Ni) or other RF conductive material. The diffuser plate 358 may be cast, brazed, forged, hot iso-statically pressed or sintered. Typically, the diffuser plate 358 is configured to have a thickness that maintains sufficient flatness at the edge of the aperture 366 in hanger plate 360 as not to adversely affect substrate processing. The average thickness of the diffuser plate 358 may range from about 0.8 inch to about 2.0 inches. The diffuser plate 358 could be circular for semiconductor wafer manufacturing or polygonal, such as rectangular, for flat panel display manufacturing.

Figure 3C:
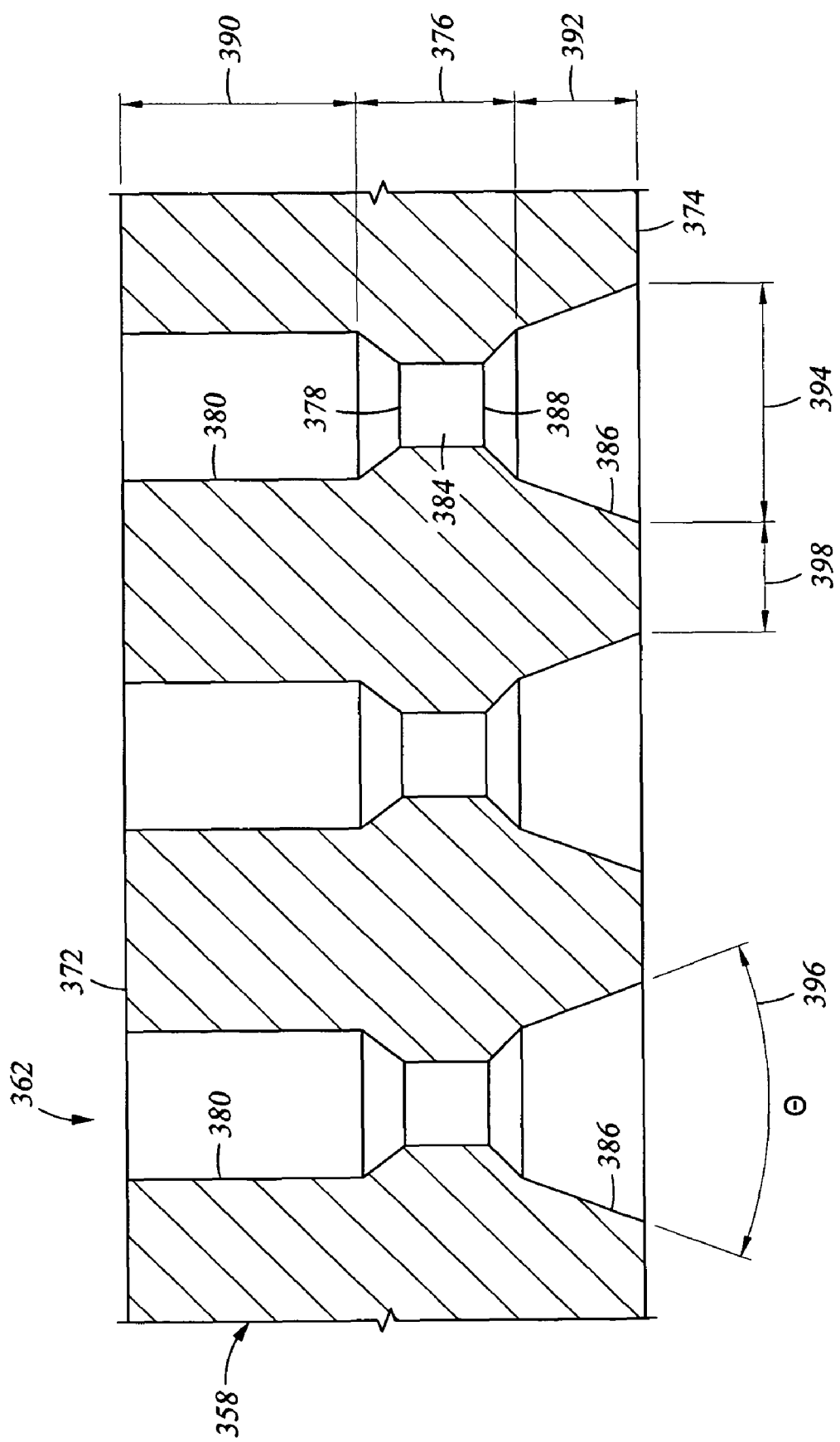
FIG. 3C depicts a cross-sectional schematic view of a gas diffuser plate.

FIG. 3C is a partial sectional view of an exemplary diffuser plate 358 that is described in commonly assigned, copending U.S. patent application Ser. No. 10/417,592, entitled "Gas Distribution Plate Assembly for Large Area Plasma Enhanced Chemical Vapor Deposition", filed Apr. 16, 2003. The diffuser plate 358 includes a first or upstream side 372 facing the lid assembly 310, and an opposing second or downstream side 374 that faces the substrate support assembly 338. Each gas passage 362 is defined by a first bore 380 coupled by an orifice hole 384 to a second bore 386, which combined form a fluid path through the gas distribution plate 358. The first bore 380 extends a first depth 390 from the upstream side 372 of the gas distribution plate 358 to a bottom 378. The bottom 378 of the first bore 380 may be tapered, beveled, chamfered, or rounded to minimize the flow restriction as gases flow from the first bore 380 into the orifice hole 384.

The first bore 380 generally has a diameter of about 0.09 to about 0.22 inches, and in one embodiment, which has been demonstrated to function well in process chamber described herein the diameter of first bore 380 is about 0.16 inches.

The second bore 386 formed in the diffuser plate 358 extends from the downstream side (or end) 374 to a depth 392 of about 0.10 inch to about 2.0 inches. Typically, the depth 392 of second bore 386 is between about 0.1 inch to about 1.0 inch. The diameter 394 of the second bore 386 is generally about 0.1 inch and about 1.0 inch, and may be flared at an angle of about 10 degrees to about 50 degrees. Preferably, the diameter 394 of second bore 386 is between about 0.1 inch to about 0.5 inch, and the flaring angle 396 is between about 20 degrees and about 40 degrees. The surface area of the second bore 386 is between about 0.05 inch$^2$ and about 10 inch$^{2'}$ and typically between about 0.05 inch$^2$ and about 5 inch$^2$. The diameter of second bore 386 refers to the diameter intersecting the downstream surface 374. An example of a diffuser plate used to process 1500 mm×1850 mm substrates has a second bore 386 having a diameter of 0.250 inch and a flare angle 396 of about 22 degrees. The distances 398 between rims 382 of adjacent second bores 386 are between about 0 inch and about 0.6 inch, preferably between about 0 inch and about 0.4 inch. The diameter of the first bore 380 is typically smaller than the diameter of the second bore 386 (by way of example and not by way of limitation). A transition 388 from the second bore 386 to the orifice hole 384 may be tapered, beveled, chamfered, or rounded to minimize the pressure loss of gases flowing out from the orifice hole 384 and into the second bore 386. Typically, the orifice hole 384 helps reduce the amount of surface area of etch gas passage 362 which is exposed to reactive fluorine species during cleaning of the process chamber, thereby reducing the occurrence of fluorine contamination of deposited films.

The orifice hole 384 couples the bottom 378 of the first bore 380 and the bottom 388 of the second bore 386. The orifice hole 384 generally has a diameter ranging from about 0.01 inch to about 0.3 inch, and typically from about 0.01 inch to about 0.1 inch. The length 376 of the orifice hole 384 commonly ranges from about 0.02 inch to about 1.0 inch, and typically from about 0.02 inch to about 0.5 inch. The length 376 and diameter (or other geometric attribute) of the orifice hole 384 is the primary source of back pressure in the plenum chamber 364 above gas distribution plate 358, which plenum chamber promotes even distribution of gas across the upstream side 372 of the gas distribution plate 358. The orifice hole 384 is typically configured uniformly among the plurality of gas passages 362; however, the restriction through the orifice hole 384 may be configured differently among the gas passages 362 to promote more gas flow through one area of the gas distribution plate 358 relative to another area. For example, the orifice hole 384 may have a larger diameter and/or a shorter length 376 in those gas passages 362 of the gas distribution plate 358 which are closer to the wall 306 of the processing chamber 302, so that more gas flows through the edges of the perforated area 316 to increase the deposition rate at the perimeter of the substrate. The thickness of the gas distribution plate 358 is typically between about 0.8 inch and about 3.0 inches, and is typically between about 0.8 inch and about 2.0 inch.

The embodiment example PECVD processes described in Example Four, below, were carried out in a parallel plate processing chamber, the AKT™ PECVD 40 K System, available from AKT™, a division of Applied Materials, Inc., Santa Clara, Calif. This system, which is illustrated schematically in FIG. 19A, is capable of processing substrates having dimensions of up to 1870 mm×2200 mm.

Figure 19A:
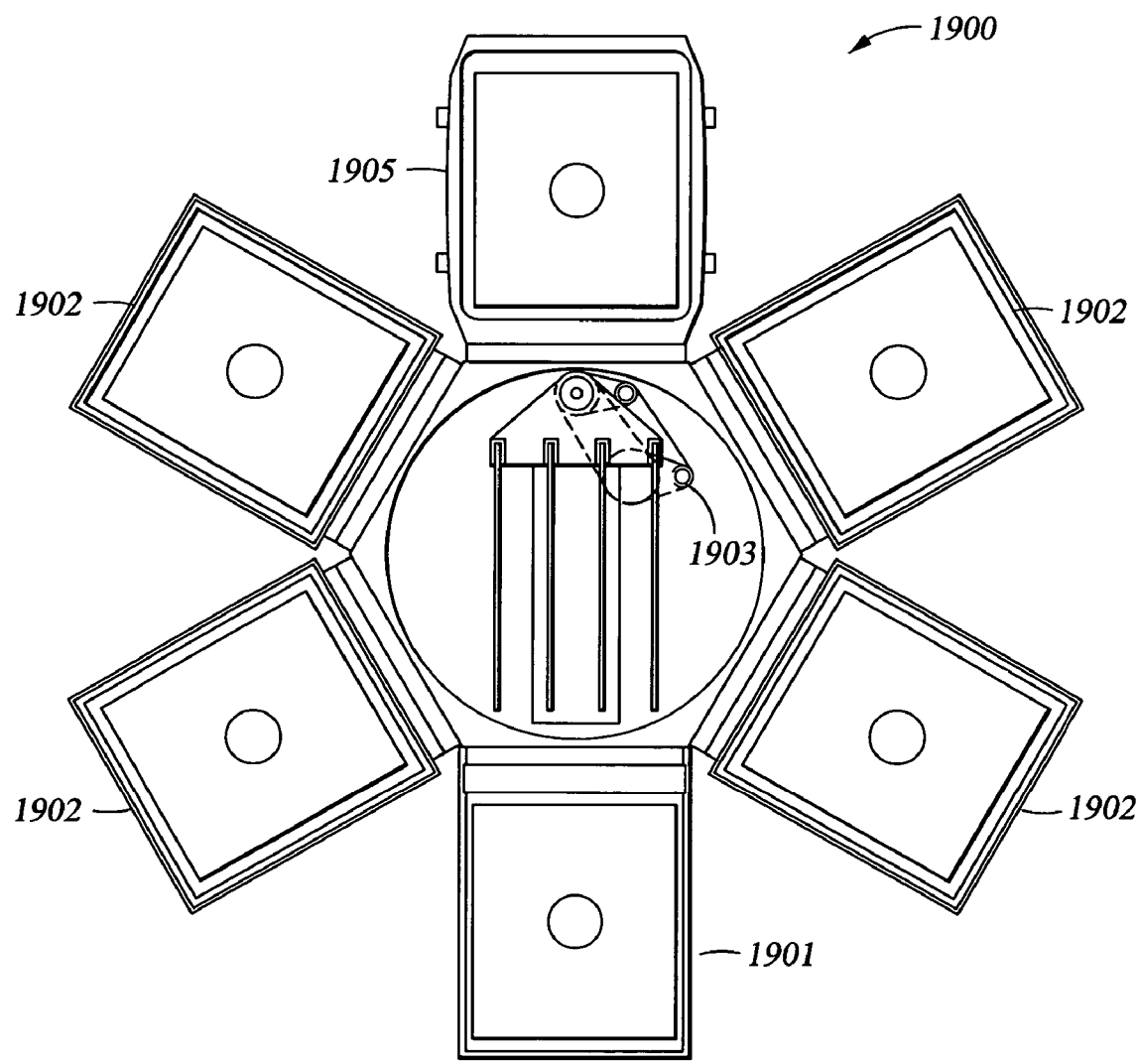
FIG. 19A is a schematic of a top view of a PECVD processing system of the kind which can be used to deposit the films of the present invention. The PECVD processing system shown in FIG. 19A is capable of processing substrates having dimensions of up to 1870 mm×2200 mm.

Referring to FIG. 19A, the system 1900 generally includes a loadlock chamber 1901 for loading substrates (not shown) into the system; a robot assembly 1903 for transferring substrates between chambers in the system; four PECVD processing chambers 1902; and an optional substrate heater 1905. The AKT™ PECVD 40 K System is also available with a fifth PECVD processing chamber in place of substrate heater 1905.

Figure 19B:
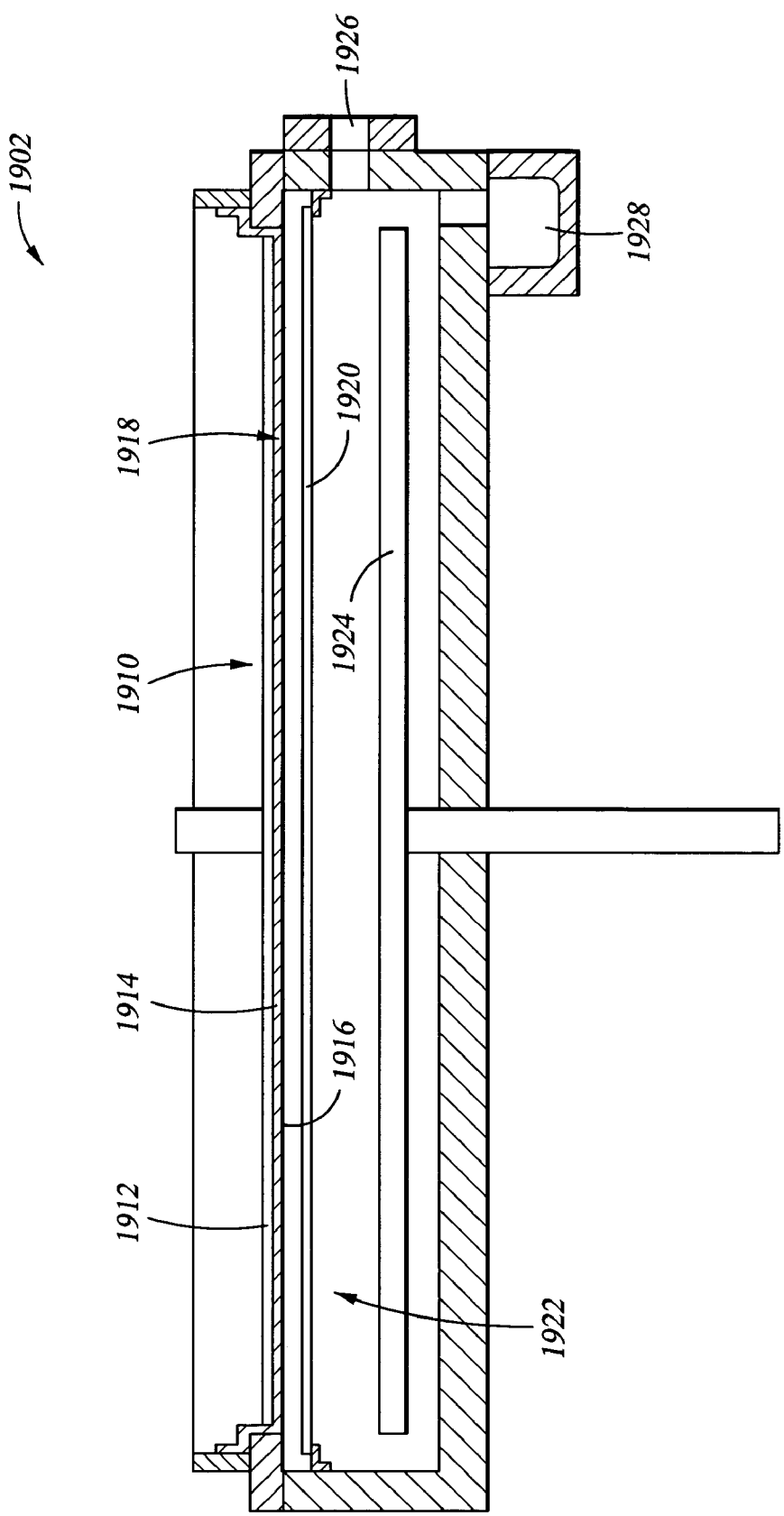
FIG. 19B is a schematic of a side view of the PECVD processing chamber shown in FIG. 19A.

Referring to FIG. 19B, a processing chamber 1902 includes a diffuser plate 1914 having a downstream surface 1916 through which process gases enter processing chamber 1902. An aluminum backing plate 1910, to which RF power is applied, is adjacent to diffuser plate 1914. Diffuser plate 1914 and backing plate 1910 are separated by a space 1912 which forms a plenum chamber into which incoming gas flow is confined. Gas flow restriction by the diffuser plate 1914 results in a significant difference in pressure between the plenum chamber 1912 and the plasma processing region 1918 of processing chamber 1902, allowing a uniform gas flow distribution to be achieved. The processing chamber 1902 also includes a shadow frame 1920 which extends around the perimeter edge of the processing region 1918, a substrate support (susceptor) 1924, a gate valve 1926 through which substrates are transferred into and out of the processing chamber 1902, and a pumping port 1928 for pumping spent processing gases out of the chamber.

Figure 19C:
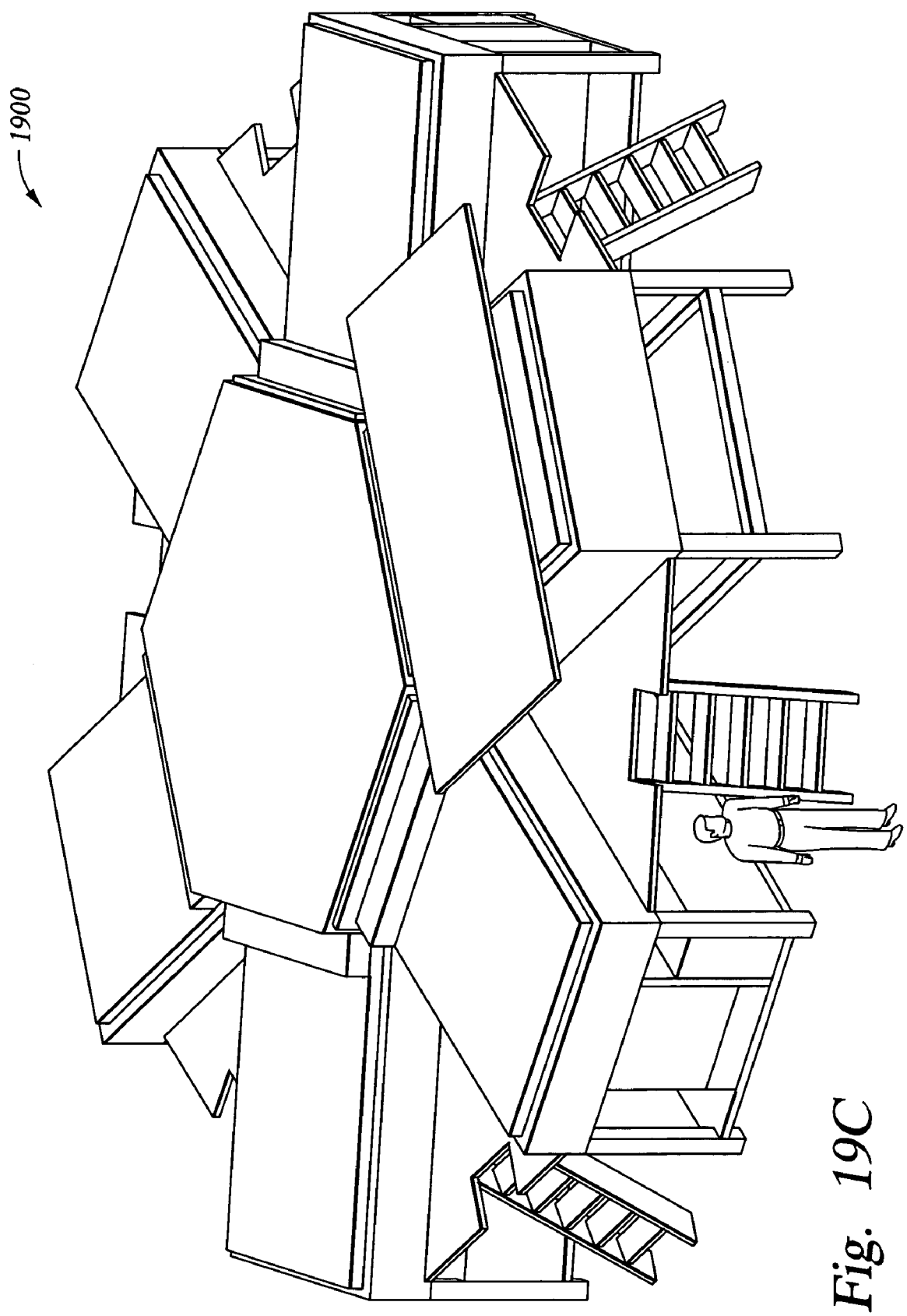
FIG. 19C shows a perspective view of a PECVD processing system of the kind which can be used to deposit thin films on large surface area substrates, in accordance with the method of the present invention. This figure is provided to better illustrate the size of the apparatus which is required to process substrates of the dimension described herein.

FIG. 19C shows a perspective view of a PECVD processing system 1900 of the kind which can be used to deposit thin films on large surface area substrates, in accordance with the method of the present invention. This figure is presented to emphasize the size of the apparatus necessary to produce substrates of the dimension described herein, as this makes it clear why depositing a uniform film thickness over such a large surface area is so difficult.

II. EXAMPLES

To provide a general understanding of the relationship of the PECVD deposited α-SiN$_x$:H gate dielectric film and the a-SiN$_x$:H passivation dielectric film relative to the other components of the TFT, a brief description of the overall fabrication process of the TFT embodiment shown in FIG. 1 is presented below.

Figures 4A, 4B:
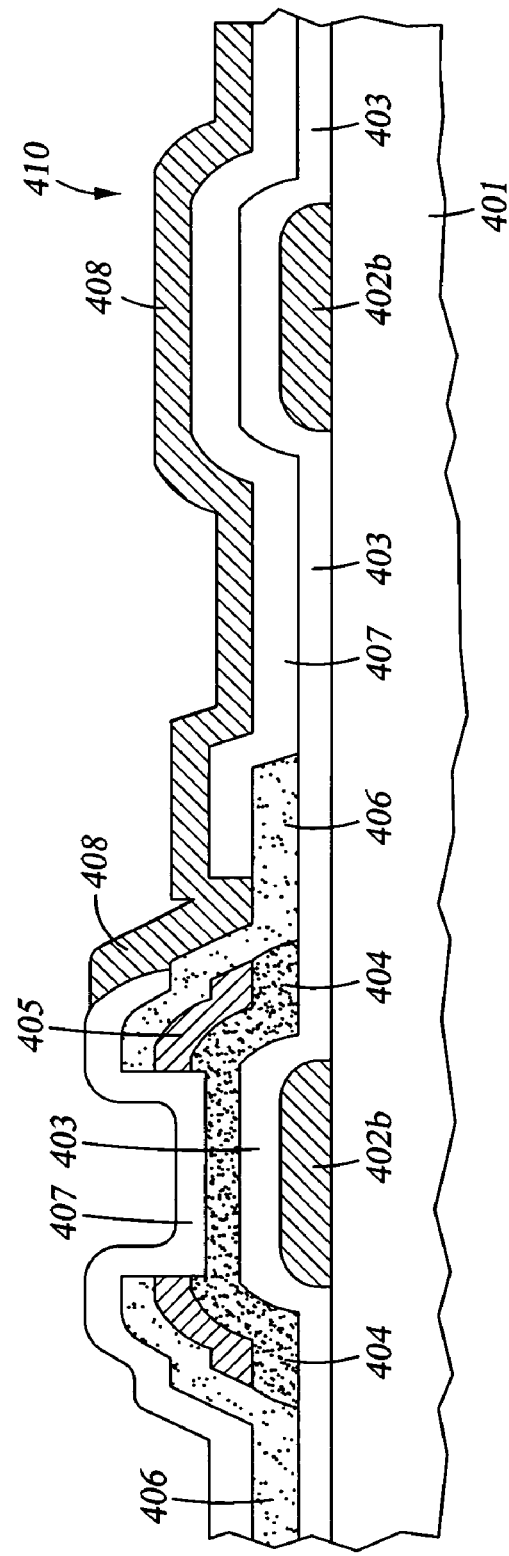
FIG. 4A shows a listing of all the steps which typically would be used to form a TFT structure of the kind shown in FIGS. 4B and 4C.
FIG. 4B shows a schematic cross-sectional view of a substrate including a TFT structure.
Figure 4C:
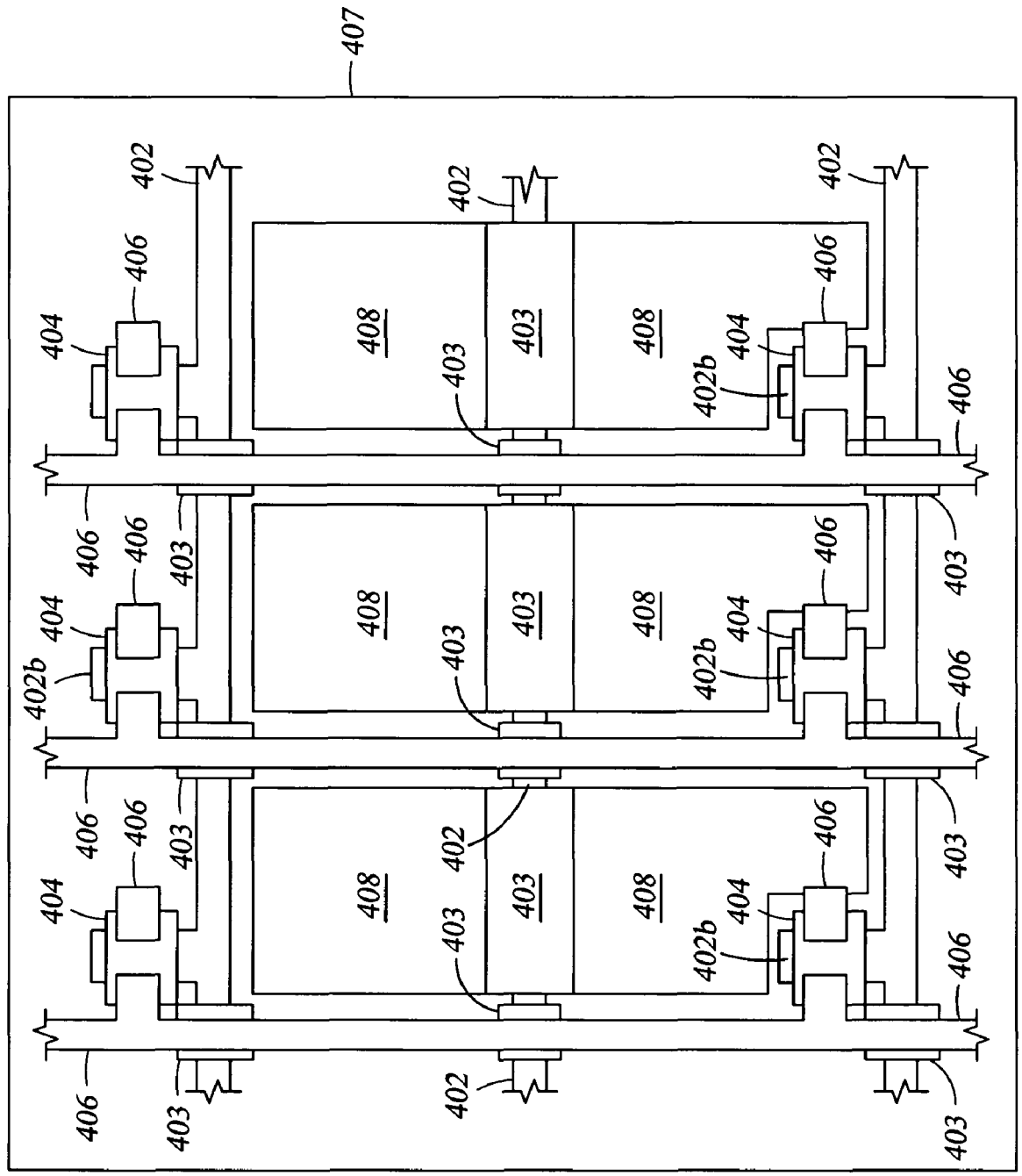
FIG. 4C shows a schematic top view of a substrate of the kind shown in FIG. 4B.

FIG. 4A show a series of process steps 400 which may be carried out to create the TFT device shown in FIGS. 4B and 4C. FIG. 4B provides a schematic cross-sectional view of a substrate including a TFT structure. FIG. 4C provides a schematic top-view 436 of a substrate including several TFT structures.

In the first step, "Gate Metal Sputtering", a conductive layer 402 is sputter deposited over a glass substrate 401 using techniques known in the art. In this particular instance, the substrate 401 is a glass substrate having a thickness of 0.7 mm. The conductive layer 402 is actually a bilayer, where the bottom portion of the layer is a chrome layer, with an overlying layer of an aluminum neodymium alloy.

In the second step, "Gate Pattern (MASK 1)", the conductive layer 402 is pattern etched using a wet etch process known in the art to provide conductive electrodes 402b.

In the third step, "n$^+$ a-Si/a-Si/a-SiN$_x$:H PECVD", a layer 403 of a-SiN$_x$:H is blanket applied by the PECVD process of the present invention, which is described in detail subsequently herein. Following the deposition of layer 403, a layer 404 of a-Si is blanket deposited using a PECVD process which is known in the art. Finally, a layer 405 of n+ doped a-Si is blanket applied by processes known in the art, including a PECVD process, to provide a conductive layer which can later become the source and drain regions for the TFT device.

In the fourth step, "a-Si Pattern (MASK 2)", layers 404 of a-Si and 405 of n+ doped a-Si are pattern dry etched, using techniques known in the art.

In the fifth step in the process, "S/D Sputtering", a blanket sputtering deposition of a chrome layer 406 is carried out using techniques known in the art. A portion of the chrome layer 406 subsequently becomes part of the source and drain regions of the TFT device.

In the sixth step, "S/D Pattern (MASK 3)", chrome layer 406 is pattern dry etched, using techniques known in the art.

In the seventh step in the process, "n⁺ a-Si Etch-Back", the portion of the n⁺ a-Si layer 405 which was exposed by the patterned dry etch in the sixth step is etched back using techniques known in the art. N⁺ a-Si layer 405 is etched completely through, and is "overetched" into underlying layer 404 of a-Si.

In the eighth step in the process, "SiN$_x$:H PECVD", a passivation layer of a-SiN$_x$:H dielectric 407 is applied over the substrate surface using PECVD, according to the method of the present invention.

In the ninth process step, "Passivation Etch (MASK 4)", the passivation layer of a-SiN$_x$:H dielectric 407 is pattern dry etched, using techniques known in the art.

In the tenth process step, "ITO Sputtering", a layer 408 of indium tin oxide is blanket sputter deposited over the substrate using techniques known in the art. The indium tin oxide layer 408 is a conductive optically clear layer when sputter deposited. This optically clear conductive layer enables the use of the TFT device for display applications.

In the eleventh process step, "ITO Pattern (MASK 5)", the indium tin oxide layer 408 is pattern dry etched, using techniques known in the art, to produce a patterned conductive layer which permits addressing of individual TFT structures which are shown in a schematic top view 436.

Example One

PECVD Deposition of a-SiN$_x$:H Gate Dielectric Layers by Increasing the Concentration of NH$_3$ in the Precursor Gas Composition We have previously described all of the performance requirements for the a-SiN$_x$:H gate dielectric layer. We carried out extensive experimentation in an effort to produce a PECVD deposited a-SiN$_x$:H gate dielectric layer which met the performance requirements and which provided a uniformity in film thickness and uniformity in film properties, including structural and chemical composition, when PECVD deposited over a large surface area, larger than 1000 mm×1000 mm, for example. One basic requirement is that the a-SiN$_x$:H film deposition rate is more than 1000 Å/min, and typically more than 1300 Å/min, so that the fabrication throughput for the TFT provides adequate productivity to be economically competitive. The basic requirements for the a-SiN$_x$:H film are that: the Si—H bonded content of the a-SiN$_x$:H film is less than about 15 atomic %; the film stress ranges from about 0 to about $-10^{10}$ dynes/cm$^2$; the refractive index (RI) of the film ranges from about 1.85 to about 1.95, and, the wet etch rate in HF solution (which wet etch rate is an indication of film density) is less than 800 Å/min. (The HF solution is one referred to in the industry as "Buffer Oxide Etchant 6:1", which contains 7% by weight hydrofluoric acid, 34% by weight ammonium fluoride, and 59% by weight water. The wet etching test is carried out at a substrate temperature of about 25° C.) In addition, the chemical composition of the film, in terms of Si—H bonded content is consistently below the 15 atomic % maximum preferred.

In an alternative embodiment structure to that shown in FIG. 1, it is possible to deposit the a-SiN$_x$:H gate dielectric layer at a high deposition rate initially (higher than about 1300 Å/min), where the Si—H bonded content may be as high as about 20 atomic %, and then to deposit the a-SiN$_x$:H gate dielectric layer at a low deposition rate (lower than about 1300 Å/min, and typically lower than 1000 Å/min), where the Si—H bonded content is below the 15 atomic % preferred maximum. This provides a good interface between the a-Si layer which is subsequently deposited over the a-SiN$_x$:H gate dielectric layer and a-SiN$_x$:H layer. The film thickness uniformity across the substrate surface area should vary by less than about 17%. With respect to uniformity of chemical composition of the film across the substrate, it is preferred that the S—H bonded structure not vary by more than 4 atomic %. With respect to uniformity of other film properties across the wafer, it is preferred that the variation in stress be less than about $4\times10^9$ dynes/cm$^2$, and that the wet etch rate (WER), which is also an indication of density, not vary by more than 100 Å/min over the entire surface of the substrate.

Table Three, below, presents data for experimental a-SiN$_x$:H gate dielectric layer PECVD trials. This data is relative to physical properties of the a-SiN$_x$:H gate dielectric layers produced. Table Four, below, presents corresponding process parameter data for the experimental a-SiN$_x$:H gate dielectric layer films which are described in Table One. The "Run" numbers correspond. This process development was carried out in an AKT™ 25 KA PECVD System of the kind previously described herein (and represented in FIGS. 3A and 3B). Examples 1-6 are illustrative of deposited films which did not meet the target for the a-SiN$_x$:H gate dielectric layer which is to interface with an overlying a-Si layer. Examples 7-11 are illustrative of films which did meet the target.

TABLE THREE

Properties of the a-SiN$_x$:H Gate Dielectric Film Deposited by PECVD

| Run No. | Chamber Near Window Side "A" | Chamber Near Center "C" | Chamber Near Slit Valve Side "D" | Maximum Difference | D/R Å/min | Variation in Film Thickness Uniformity, % (excluding 15 mm from edge of substrate) |
|---|---|---|---|---|---|---|
| 1 | | | | | 2015 | 13.2 |
| Thickness Å | 5991 | 5922 | 5895 | 96 | | |
| RI | 1.89 | 1.89 | 1.87 | 0.02 | | |
| Stress* ×10$^9$ dynes/cm$^2$ | 4 | +1.8 | +3.1 | 2.3 | | |

TABLE THREE-continued

Properties of the a-SiN$_x$:H Gate Dielectric Film Deposited by PECVD

|  |  |  |  |  |  |  |
|---|---|---|---|---|---|---|
| N—H at % | 16.6 | 16.5 | 16.9 | 0.4 | | |
| S—H at % | 17.6 | 14.1 | 15.5 | 3.5 | | |
| WER Å/min | 1575 | 960 | 1822 | 862 | | |
| 2 | | | | | 2479 | 21.9 |
| Thickness Å | 6532 | 7970 | 6560 | 1438 | | |
| RI | 1.9 | 1.91 | 1.9 | 0.01 | | |
| Stress* ×10$^9$ dynes/cm$^2$ | +2.0 | −4.4 | −2.4 | 6.4 | | |
| N—H at % | 18.6 | 22.5 | 23.2 | 4.6 | | |
| S—H at % | 14.8 | 7.2 | 6.7 | 8.1 | | |
| WER Å/min | 826 | 395 | 468 | 431 | | |

| Run No. | Chamber Near Window Side "A" | Chamber Near Center "C" | Chamber Near Slit Valve Side "B" | Maximum Difference | D/R Å/min | Variation in Film Thickness Uniformity, % (excluding 15 mm from edge of substrate) |
|---|---|---|---|---|---|---|
| 3 | | | | | 2364 | 10.8 |
| Thickness Å | 6605 | 7119 | 6641 | 514 | | |
| RI | 1.88 | 1.89 | 1.87 | 0.02 | | |
| Stress* ×10$^9$ dynes/cm$^2$ | +3.0 | −2.5 | −2 | 5.5 | | |
| N—H at % | 21.6 | 26.1 | 27.5 | 5.9 | | |
| S—H at % | 16.2 | 9.2 | 7.2 | 9 | | |
| WER Å/min | 1137 | 554 | 882 | 583 | | |
| 4 | | | | | 2653 | 9.6 |
| Thickness Å | 7830 | 7775 | 7271 | 559 | | |
| RI | 1.91 | 1.93 | 1.92 | 0.02 | | |
| Stress* ×10$^9$ dynes/cm$^2$ | +2.1 | −2.9 | −0.5 | 5 | | |
| N—H at % | 20.1 | 24.3 | 29.6 | 9.5 | | |
| S—H at % | 23 | 19.6 | 26.9 | 7.3 | | |
| WER Å/min | 784 | 363 | 664 | 421 | | |
| 5 | | | | | 2492 | 10.3 |
| Thickness Å | 7320 | 7929 | 7430 | 609 | | |
| RI | 1.86 | 1.88 | 1.86 | 0.02 | | |
| Stress* ×10$^9$ dynes/cm$^2$ | +4.4 | −1.1 | +3.9 | 5.5 | | |
| N—H at % | 19.2 | 23.2 | 24.8 | 5.6 | | |
| S—H at % | 19.4 | 9.8 | 19.9 | 10.1 | | |
| WER Å/min | 2422 | 821 | 2023 | 1601 | | |
| 6 | | | | | 1374 | 15.7 |
| Thickness Å | 6165 | 7472 | 6086 | 1386 | | |
| RI | 1.91 | 1.9 | 1.92 | 0.02 | | |
| Stress* ×10$^9$ dynes/cm$^2$ | +2.5 | −1.6 | +1.0 | 4.1 | | |
| N—H at % | 17.5 | 21.1 | 18 | 3.6 | | |
| S—H at % | 18.4 | 7.6 | 13.3 | 10.9 | | |
| WER Å/min | 860 | 494 | 483 | 377 | | |
| 7 | | | | | 2286 | 16.2 |
| Thickness Å | 7013 | 8764 | 6999 | 1765 | | |
| RI | 1.91 | 1.9 | 1.91 | 0.01 | | |
| Stress* ×10$^9$ dynes/cm$^2$ | −2.2 | −3.9 | −1.6 | 2.3 | | |
| N—H at % | 20.5 | 20.7 | 20.7 | 0.2 | | |
| S—H | 11.1 | 77 | 11 | 3.4 | | |

TABLE THREE-continued

Properties of the a-SiN$_x$:H Gate Dielectric Film Deposited by PECVD

| | | | | | | |
|---|---|---|---|---|---|---|
| at % | | | | | | |
| WER Å/min | 487 | 443 | 488 | 45 | | |
| 8 | | | | | 1711 | 12.4 |
| Thickness Å | 6230 | 7413 | 6576 | 1183 | | |
| RI | 1.91 | 1.9 | 1.9 | 0.01 | | |
| Stress* ×10⁹ dynes/cm² | −1 | −3.7 | −2 | 2.7 | | |
| N—H at % | 22.5 | 24.5 | 22.9 | 2 | | |
| S—H at % | 11.1 | 7.6 | 10.3 | 3.5 | | |
| WER Å/min | 554 | 529 | 579 | 50 | | |
| 9 | | | | | 1563 | 15.4 |
| Thickness Å | 5421 | 6758 | 5871 | 1337 | | |
| RI | 1.92 | 1.91 | 1.91 | 0.01 | | |
| Stress* ×10⁹ dynes/cm² | −5.3 | −8.1 | −5.3 | 2.8 | | |
| N—H at % | 22 | 24.8 | 22.5 | 2.8 | | |
| S—H at % | 7.8 | 4.8 | 7.9 | 3.1 | | |
| WER Å/min | 381 | 404 | 410 | 29 | | |
| 10 | | | | | 1622 | 13.3 |
| Thickness Å | 5555 | 6788 | 5857 | 1233 | | |
| RI | 1.93 | 1.92 | 1.92 | 0.01 | | |
| Stress* ×10⁹ dynes/cm² | −4.6 | −7.5 | −5.4 | 2.9 | | |
| N—H at % | 22.6 | 25.3 | 23.8 | 2.7 | | |
| S—H at % | 8.5 | 5.1 | 7.8 | 3.3 | | |
| WER Å/min | 353 | 360 | 395 | 42 | | |
| 11 | | | | | 1327 | 8.3 |
| Thickness Å | 5888 | 6940 | 6131 | 1052 | | |
| RI | 1.88 | 1.88 | 1.88 | 0 | | |
| Stress* ×10⁹ dynes/cm² | −2.3 | −4.2 | −2.1 | 2.1 | | |
| N—H at % | 28.4 | 28.3 | 27.6 | 0.8 | | |
| S—H at % | 4.7 | 2.9 | 4.7 | 1.8 | | |
| WER Å/min | 739 | 695 | 767 | 72 | | |

*+ denotes tensile stress and − denotes compressive stress.

TABLE FOUR

Process Conditions For Deposition of the a-SiN$_x$:H Gate Dielectric Film Deposited by PECVD

| Run No. | SiH$_4$ sccm | NH$_3$ sccm | N$_2$ sccm | RF[1] kW | Pr[2] Torr | Elect[3] Spcg Mil | DR[4] Å/min | NH$_3$/ SiH$_4$ | N$_2$/ SiH$_4$ | N$_2$/ NH$_3$ |
|---|---|---|---|---|---|---|---|---|---|---|
| 1 | 2760 | 12340 | 30820 | 11 | 1.5 | 1090 | 2015 | 4.5 | 11 | 2.5 |
| 2 | 2800 | 9600 | 28000 | 15 | 1.5 | 1050 | 2479 | 3.4 | 10 | 2.9 |
| 3 | 2800 | 9600 | 28000 | 15 | 1.8 | 1050 | 2364 | 3.4 | 10 | 2.9 |
| 4 | 3500 | 12000 | 35000 | 15 | 1.5 | 1050 | 2653 | 3.4 | 10 | 2.9 |
| 5 | 3300 | 15600 | 38200 | 14 | 1.8 | 1050 | 2492 | 4.7 | 12 | 2.4 |
| 6 | 2000 | 8800 | 32000 | 9 | 1.4 | 1000 | 1374 | 4.4 | 16 | 3.6 |
| 7 | 3500 | 29000 | 22000 | 15 | 1.5 | 800 | 2286 | 8.3 | 6.3 | 0.8 |
| 8 | 2500 | 20000 | 22000 | 11 | 1.7 | 600 | 1711 | 8 | 8.8 | 1.1 |
| 9 | 3300 | 36000 | 18000 | 11 | 1.3 | 600 | 1563 | 11 | 5.5 | 0.5 |
| 10 | 3300 | 28000 | 18000 | 11 | 1.3 | 600 | 1622 | 8.5 | 5.5 | 0.5 |
| 11 | 1500 | 15000 | 28000 | 8 | 1.5 | 600 | 1327 | 10 | 19 | 1.9 |

[1]RF power at 13.56 MHz.
[2]Process chamber pressure.
[3]Electrode spacing.
[4]Deposition Rate.

A review of the data presented above indicates that it is possible to obtain an a-SiN$_x$:H gate dielectric film useful as a TFT gate dielectric, where large numbers of the TFTs are arrayed over surface areas larger than about 1000 mm×1000 mm. However, to obtain the uniformity of the film thickness and uniformity of film composition, it is necessary to carefully control the process parameters used in production of the a-Si$_x$NH gate dielectric film. With respect to uniformity of chemical composition of the film across the wafer, it is preferred that the S—H bonded structure not vary by more than 4 atomic %. With respect to uniformity of other film properties across the wafer, it is preferred that the variation in stress be less than about 4×10$^9$ dynes/cm$^2$, and that the wet etch rate (WER), which is also an indication of density, not vary more than 100 Å/min over the entire surface of the substrate.

As previously discussed, to meet industry requirements, it is preferred that the film deposition rate is more than 1000 Å/min, and typically more than 1300 Å/min. Further, with respect to film properties of the a-SiN$_x$:H gate dielectric film, the Si—H bonded content of the film should be less than about 15 atomic %; the film stress should range from about 0 to about −10$^{10}$ dynes/cm$^2$; the film thickness across the substrate surface area should vary by less than about 17%; the refractive index (RI) of the film should range from about 1.85 to about 1.95; and, the wet etch rate in HF solution (which is an indication of film density) should be less than 800 Å/min. In addition, the chemical composition of the film, in terms of Si—H bonded content, should be consistently below the 15 atomic % maximum limit.

An a-SiN$_x$:H gate dielectric film exhibiting the physical characteristics listed above provides excellent performance capabilities, and the uniformity of the film across the substrate enables the production of flat panel displays having dimensions in the range of 1870 mm×2200 mm (a surface area of 4.1 m$^2$) and even larger.

We were surprised to discover that by increasing the NH$_3$:SiH$_4$ ratio to range between 5.3 to 10.0, while decreasing the N$_2$:SiH$_4$ ratio to range between 5.5 and 18.7, we were able to deposit a-SiN$_x$:H dielectric film with a film thickness which varied by less than about 16% over the substrate surface, while maintaining a Si—H bonded content in the film of less than 15 atomic %. The resulting N NH$_3$ ratio due to this change ranged from about 0.6 to 1.9, which compared with the previous N$_2$:NH$_3$ ratio of 2.4 to 10. We also maintained a wet etch rate below about 800 Å/min over the a-SiN$_x$:H dielectric film surface using the new precursor source gas composition.

The combination process parameters required to produce the a-SiN$_x$:H gate dielectric film having the properties and uniformity described above include the following:

- a substrate temperature during film deposition ranging from about 320° C. to about 340° C.;
- a process pressure of less than about 2.0 Torr, typically less than about 1.5 Torr;
- a plasma density ranging between about 0.2 W/cm$^2$ and about 0.6 W/cm$^2$;
- a plasma precursor gas mixture in which the precursors gases include N$_2$, NH$_3$, and SiH$_4$, and where the component ratios are NH$_3$:SiH$_4$ ranging from about 5.3 to about 10.0, N$_2$:SiH$_4$ ranging from about 5.5 to about 18.7, and N$_2$:NH$_3$ ranging from about 0.6 to about 2.3, typically from 0.6 to 1.9;
- an electrode spacing in an AKT™ PECVD 25KA System, a parallel plate plasma processing chamber, which spacing is less than about 1000 mils (1 mil=0.001 inch), and which typically ranges between about 800 mils and 400 mils;
- and, a total precursor gas flow rate in the AKT™ PECVD 25KA System ranging from about 20,000 sccm to about 70,000 sccm.

One skilled in the art can calculate an equivalent electrode spacing and precursor gas flow rate when the plasma processing chamber is different from the processing chamber specified above.

The combination process parameters required to produce an a-SiN$_x$:H passivation dielectric film are different from those required to produce a gate dielectric film, as previously described in the Summary of the Invention. For example, the important performance characteristics of the passivation dielectric layer are not ion mobility and voltage threshold (as for the gate dielectric film), but are, instead, breakdown voltage, step coverage, and mechanical properties (such as residual film stress). An acceptable passivation layer may exhibit, for example, a WER of 5000 or higher and a S—H bonded structure content of 20% or higher and still be acceptable. With respect to the ratios of precursor gases used for PECVD of a passivation layer of a-SiN$_x$:H, the ratio of NH$_3$:SiH$_4$ may easily range, for example and not by way of limitation, from about 5.6 to about 11.1, typically from about 5.6 to about 10.6. The ratio of N$_2$:SiH$_4$ may range, for example and not by way of limitation, from about 5.8 to about 20.8, and typically from about 5.8 to about 19.9. The ratio of N$_2$:NH$_3$ may range, for example and not by way of limitation, from about 0.4 to about 2.3, and typically from about 0.6 to about 1.9.

Figure 5A:
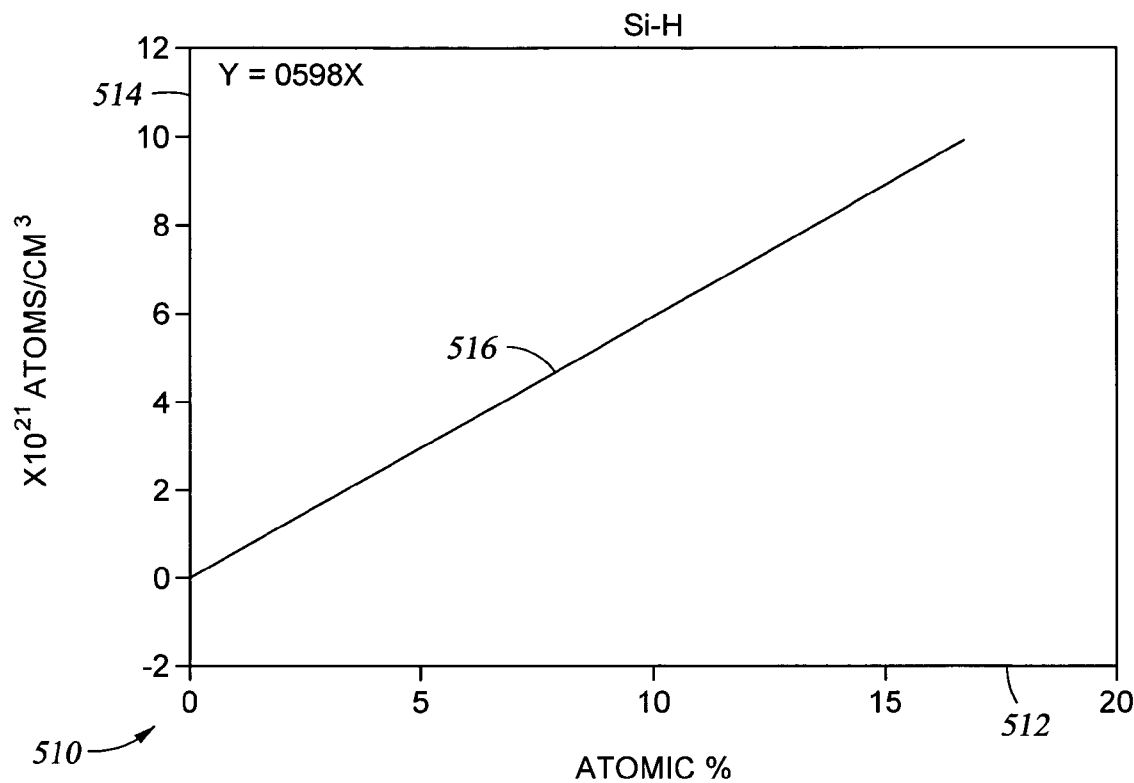
FIG. 5A shows a graph illustrating the relationship between the atomic % of Si—H bonded structure in the a-SiN$_x$:H dielectric film and the concentration of the Si—H bonded structure in terms of atoms which make up that structure/cm$^3$ of the a-SiN$_x$:H dielectric film.

FIG. 5A is a graph 510 which shows the relationship between the atomic weight % of Si—H bonded structure in the a-SiN$_x$:H gate dielectric film and the concentration of the Si—H bonded structure in terms of atoms which make up that structure, per cubic centimeter of the a-SiN$_x$:H film. The atomic weight % of Si—H bonded structure is shown on the "x" axis, which is labeled 512. The a-SiN$_x$:H film density in atoms/cm$^3$ is shown on the "y" axis, which is labeled 514. The relationship represented by curve 516 is y=0.598 x, which is the correlation. This graph is presented for reference purposes to aid in understanding of the description of the invention.

Figure 5B:
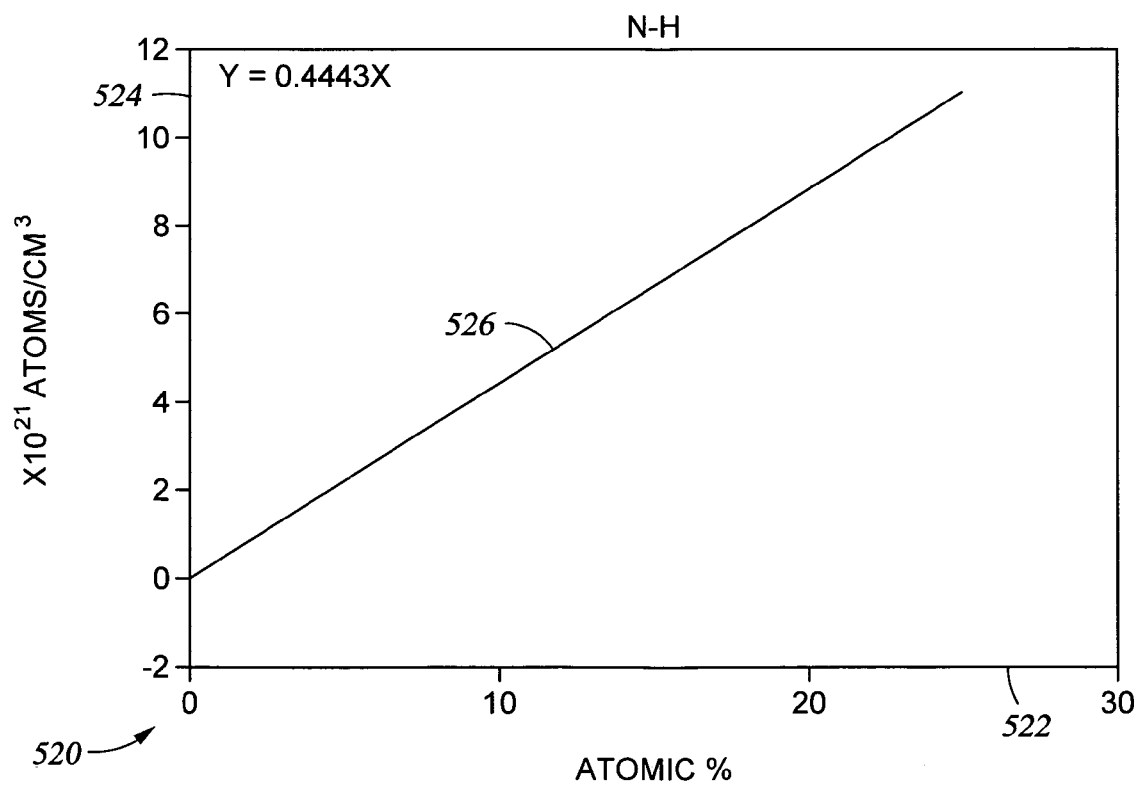
FIG. 5B shows a graph which illustrates the relationship between the atomic % of the N—H bonded structure in the a-SiN$_x$:H dielectric film and the concentration of the N—H bonded structure in terms of atoms which make up that structure/cm$^3$ of the a-SiN$_x$:H dielectric film.

FIG. 5B is a graph 520 which shows the relationship between the atomic weight % of N—H bonded structure in the a-SiN$_x$:H gate dielectric film and the concentration of the N—H bonded structure in terms of atoms which make up that structure, per cubic centimeter of the a-SiN$_x$:H film. The atomic weight % of N—H bonded structure is shown on the "x" axis, which is labeled 522. The a-SiN$_x$:H film density in atoms/cm$^3$ is shown on the "y" axis, which is labeled 524. The relationship represented by curve 526 is y=0.4443 x, which is the correlation. This graph is presented for reference purposes to aid in understanding of the description of the invention.

An a-SiN$_x$:H film deposited according to the method parameters described above can be used in any application in which a-SiN$_x$:H films are useful. However, as mentioned above, a-SiN$_x$:H film deposited according to the present method are particularly useful in the production of large surface area flat panel displays.

Example Two

PECVD Deposition of a-SiN$_x$:H Gate Dielectric Layers of Uniform Thickness by Controlling a Combination of Process Parameters, Using the AKT™ 25 KA PECVD System As discussed above, we have discovered that controlling a combination of PECVD deposition process parameters during deposition of silicon-containing thin film provides improved control over surface standing wave effects. These process parameters include: the spacing between the upper and lower electrodes in the plasma reactor; the RF frequency of the plasma source; the RF power to the plasma source; the process chamber pressure; and the relative concentrations of the various components in the precursor gas composition.

We performed a series of experiments to determine the advantageous ranges for each process parameter, in order to provide maximum control over surface standing wave effects and uniformity of film properties (especially film thickness). A comparison between film uniformity available prior to the present invention and film uniformity now available is presented below.

Figure 6A:
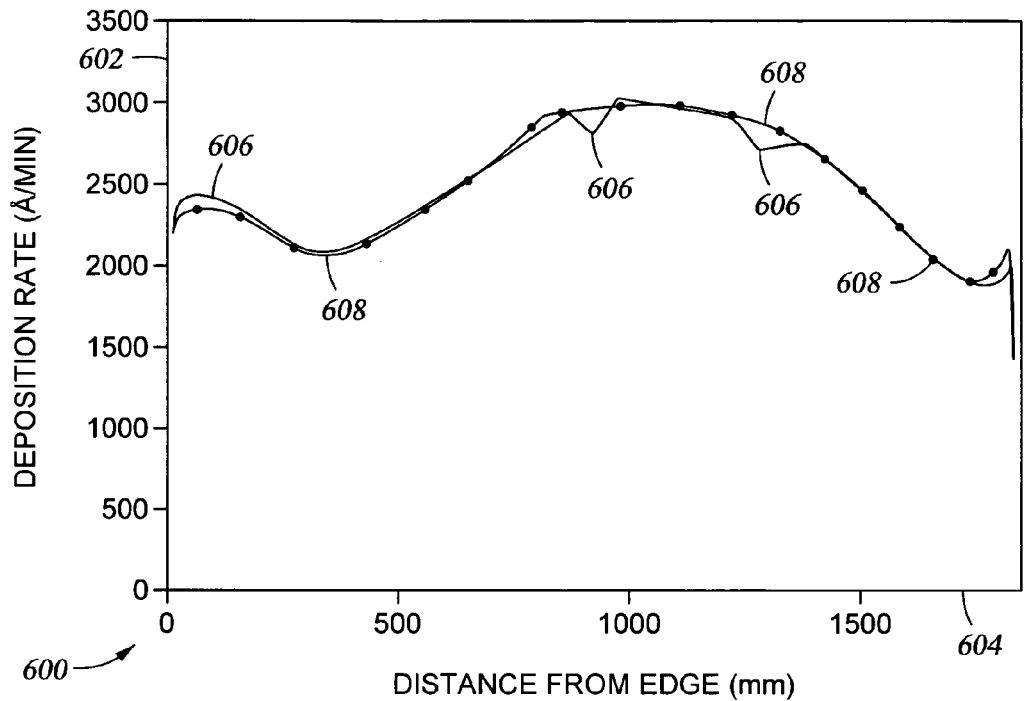
FIGS. 6A-6C are graphs of the film deposition rate (in Å/min) for a PECVD deposited a-SiN$_x$:H film, as a function of the distance of travel (in mm) across a diagonal of a rectangular substrate from edge to edge in mm, where the length of the substrate was 1850 mm and the width of the substrate was 1500 mm (for a total substrate area of 27,750 cm$^2$). The graphs show data for measurements made across each diagonal of each substrate, but plotted on axis 604 based on travel along the 1850 mm dimension of the substrate.

FIG. 6A illustrates data for film uniformity which were available prior to the present invention. FIG. 6A is a graph 600 showing the film deposition rate (i Å/min) for a PECVD-deposited a-SiN$_x$:H film on axis 602 as a function of the distance of travel (in mm) across the diagonal of a rectangular substrate measuring 1850 mm×1500 mm (for a total substrate area of 27,750 cm$^2$). The graph shows data for one diagonal on curve 606 and data for the other diagonal on curve 608, but plotted on axis 604 based on travel along the 1850 mm dimension of the substrate.

The process conditions under which the a-SiNx:H film shown in FIG. 6A was deposited are shown below in Table Five and the properties of the deposited film are shown in Table Six below. The film was deposited in an AKT™ 25 KA PECVD System, which is capable of processing substrates having dimensions of up to 1500 mm×1850 mm.

TABLE FIVE

Process Conditions for PECVD Deposition of an a-SiN$_x$:H Film Prior to the Present Improved Process

| Process Variable | Process Conditions |
|---|---|
| SiH$_4$ Flow (sccm) | 2800 |
| NH$_3$ Flow (sccm) | 9600 |
| N$_2$ Flow (sccm) | 28,000 |
| Total Gas Flow Rate (sccm) | 40,400 |
| RF Power (kW) | 15 |
| Chamber Pressure (Torr) | 1.5 |
| Exterior Heater Temperature (° C.) | 370 |
| Interior Heater Temperature (° C.) | 340 |
| Approximate Substrate Temperature (° C.) | 330 |
| Electrode Spacing (mils) | 1050 |
| Deposition Rate (Å/min) | 2405 |
| Deposition Time (sec) | 180 |

TABLE SIX

Properties of the a-SiN$_x$ Film Deposited Under the Conditions in Table Five (Comparative Example)

| A-Si Film Property | Chamber Near Window Side "A" | Chamber Near Center "C" | Chamber Near Slit Valve Side "B" | Difference | D/R Å/min | Unif |
|---|---|---|---|---|---|---|
| Thickness Å | 6357 | 8385 | 6550 | 2028 | 2405 | |
| RI | 1.93 | 1.9 | 1.91 | 0.03 | | |
| Stress* ×10$^9$ dynes/cm$^2$ | 1.8 | −8.2 | −4 | 10 | | |
| N—H atomic % | 17.3 | 26.4 | 24.1 | 9.1 | | |
| S—H atomic % | 16.9 | 2.7 | 5.7 | 14.2 | | |
| WER Å/min | 673 | 380 | 373 | 300 | | |
| Thickness Uniformity @ −15 mm from edge of substrate (%) | | | | | | 36 |
| Thickness Uniformity @ −20 mm from edge of substrate (%) | | | | | | 24 |

*+ denotes tensile stress and − denotes compressive stress.

Figure 6B:
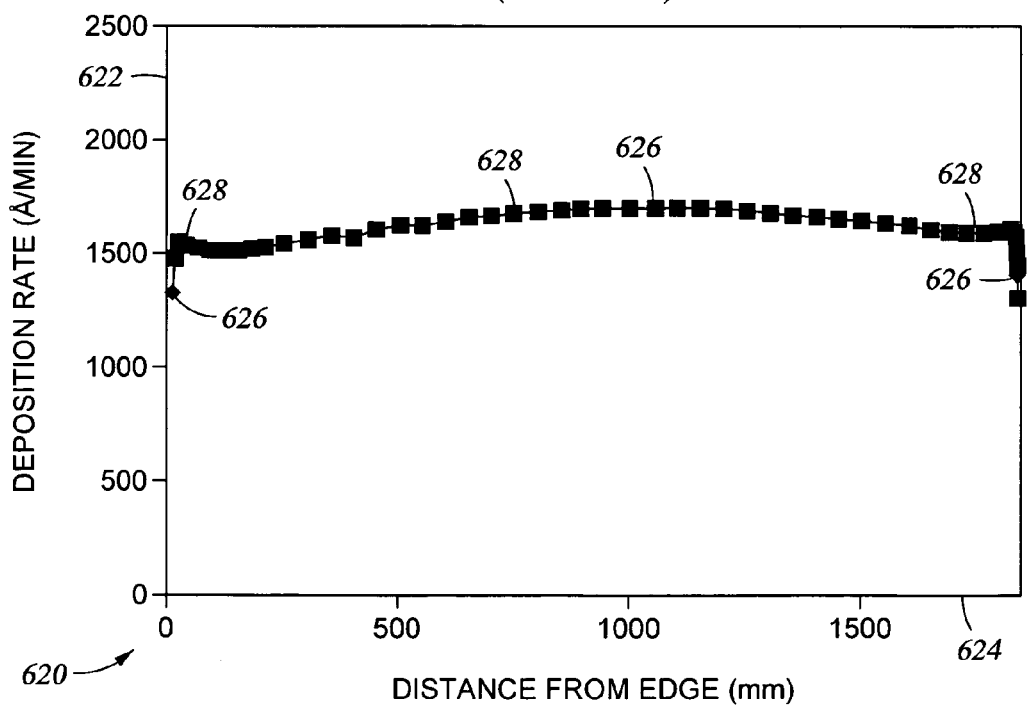

FIG. 6B illustrates data for film uniformity which was obtained using the method of the present invention. FIG. 6B is a graph 620 showing the film deposition rate (in Å/min) of the PECVD-deposited a-SiN$_x$ film on axis 622 as a function of the distance of travel (in mm) across a diagonal of the rectangular substrate. The graph shows data for one diagonal on curve 626 and data for the other diagonal on curve 628, but plotted on axis 624 based on travel along the 1850 mm dimension of the substrate.

The process conditions under which an a-SiNx:H film shown in FIG. 6B was deposited is shown below in Table Seven and the properties of the deposited film are shown in Table Eight below. The film was deposited in an AKT™ 25 KA PECVD System, which is capable of processing substrates having dimensions of up to 1500 mm×1850 mm.

TABLE SEVEN

Process Conditions for PECVD Deposition of an a-SiN$_x$:H Film Current Improved Process Variables, Example "A"

| Process Variable | Process Conditions |
|---|---|
| SiH$_4$ Flow (sccm) | 2550 |
| NH$_3$ Flow (sccm) | 13,500 |
| N$_2$ Flow (sccm) | 15,000 |
| Total Gas Flow Rate (sccm) | 31,050 |
| RF Power (kW) | 10 |
| Chamber Pressure (Torr) | 1.5 |
| Exterior Heater Temperature (° C.) | 370 |
| Interior Heater Temperature (° C.) | 340 |
| Approximate Substrate Temperature (° C.) | 330 |
| Electrode Spacing (mils) | 700 |
| Deposition Rate (Å/min) | 1591 |
| Deposition Time (sec) | 300 |

TABLE EIGHT

Properties of the a-SiN$_x$ Film Deposited Under the Conditions in Table Seven, (Inventive Example "A")

| A-Si Film Property | Chamber Near Window Side "A" | Chamber Near Center "C" | Chamber Near Slit Valve Side "B" | Difference | D/R Å/min | Unif |
|---|---|---|---|---|---|---|
| Thickness Å | 7498 | 8399 | 7645 | 901 | 1591 | |
| RI | 1.93 | 1.92 | 1.93 | 0.01 | | |
| Stress* ×10$^9$ dynes/cm$^2$ | −1 | −2.8 | −0.7 | 2.1 | | |
| N—H atomic % | 18.5 | 19.9 | 18.9 | 1.4 | | |
| S—H atomic % | 14.1 | 11.5 | 14.1 | 2.6 | | |
| WER Å/min | 506 | 504 | 628 | 124 | | |
| Thickness Uniformity @ −15 mm from edge of substrate (%) | | | | | | 6.7 |
| Thickness Uniformity @ −20 mm from edge of substrate (%) | | | | | | 6.7 |

*+ denotes tensile stress and − denotes compressive stress.

Figure 6C:
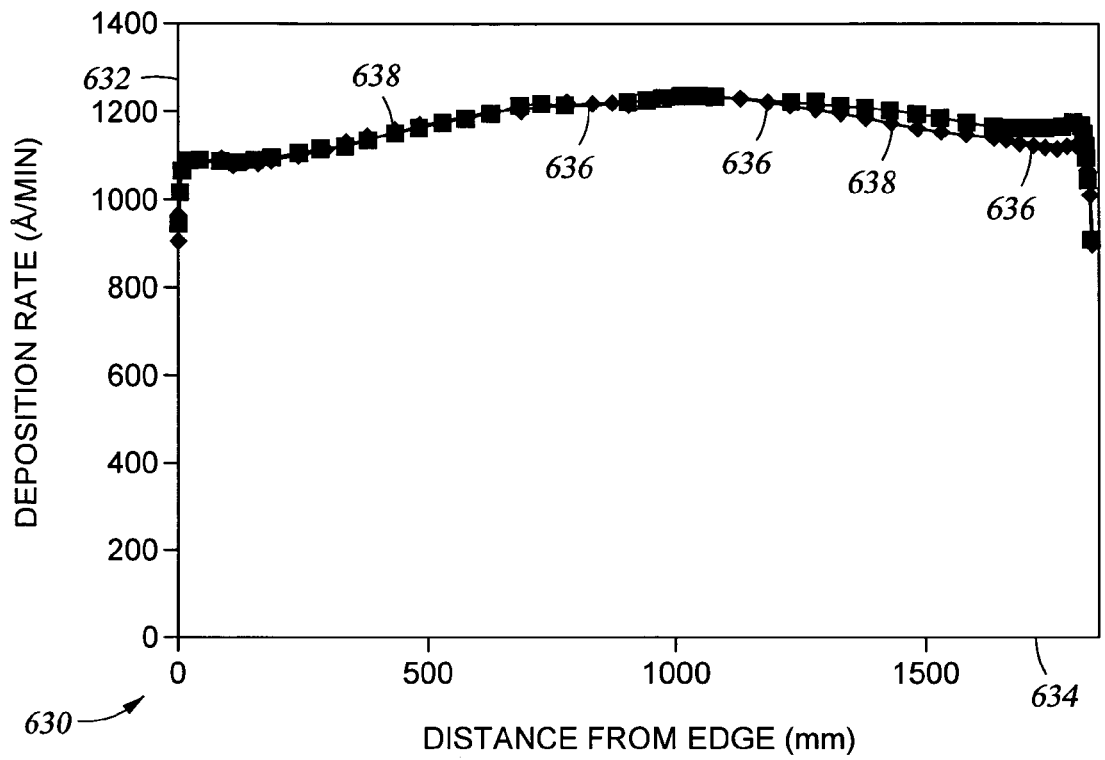

FIG. 6C illustrates data for film uniformity which was obtained using the method of the present invention. FIG. 6C is a graph 630 showing the film deposition rate (in Å/min) of the PECVD-deposited a-SiN$_x$ film on axis 632 as a function of the distance of travel (in mm) across a diagonal of the rectangular substrate. The graph shows data for one diagonal on curve 636 and data for the other diagonal on curve 638, but plotted on axis 634 based on travel along the 1850 mm dimension of the substrate.

The process conditions under which the a-SiN$_x$:H film shown in FIG. 6C was deposited is shown below in Table Nine and the properties of the deposited film are shown in Table Ten below. The film was deposited in an AKT™ 25 KA PECVD System, which is capable of processing substrates having dimensions of up to 1500 mm×1850 mm.

TABLE NINE

Process Conditions for PECVD Deposition of an a-SiN$_x$:H Film Using Current Improved Process Variables, Example "B"

| Process Variable | Process Conditions |
| --- | --- |
| SiH$_4$ Flow (sccm) | 1450 |
| NH$_3$ Flow (sccm) | 13,500 |
| N$_2$ Flow (sccm) | 18,000 |
| Total Gas Flow Rate (sccm) | 32,950 |
| RF Power (kW) | 8 |
| Chamber Pressure (Torr) | 1.2 |
| Exterior Heater Temperature (° C.) | 370 |
| Interior Heater Temperature (° C.) | 340 |
| Approximate Substrate Temperature (° C.) | 330 |
| Electrode Spacing (mils) | 650 |
| Deposition Rate (Å/min) | 1148 |
| Deposition Time (sec) | 300 |

TABLE TEN

Properties of the a-SiN$_x$ Film Deposited Under the Conditions in Table Nine, (Inventive Example "B")

| A-Si Film Property | Chamber Near Window Side "A" | Chamber Near Center "C" | Chamber Near Slit Valve Side "B" | Difference | D/R Å/min | Unif |
| --- | --- | --- | --- | --- | --- | --- |
| Thickness Å | 5471 | 6107 | 5619 | 636 | 1148 | |
| RI | 1.9 | 1.89 | 1.89 | 0 | | |
| Stress* ×10$^9$ dynes/cm$^2$ | −4.6 | −7.1 | −4.4 | 2.7 | | |
| N—H atomic % | 26 | 28.2 | 26.2 | 2.2 | | |
| S—H atomic % | 4.5 | 2.6 | 4.6 | 2.1 | | |
| WER Å/min | 488 | 505 | 574 | 86 | | |
| Thickness Uniformity @ −15 mm from edge of substrate (%) | | | | | | 8.3 |
| Thickness Uniformity @ −20 mm from edge of substrate (%) | | | | | | 7.6 |

*+ denotes tensile stress and − denotes compressive stress.

A comparison of the data presented above shows that by adjusting a combination of process variables, particularly including reducing the spacing between electrodes, lowering of the plasma density (a reduction in the amount of power applied for plasma generation and maintenance), and adjustment of the plasma source gas composition, a very significant improvement in film uniformity across the substrate can be obtained. We were able to reduce the film non-uniformity at 15 mm from the edge of the substrate from about 36% to about 7%. At 20 mm from the edge of the substrate, we were able to reduce the film non-uniformity from about 23% to about 7%.

Figure 7A:
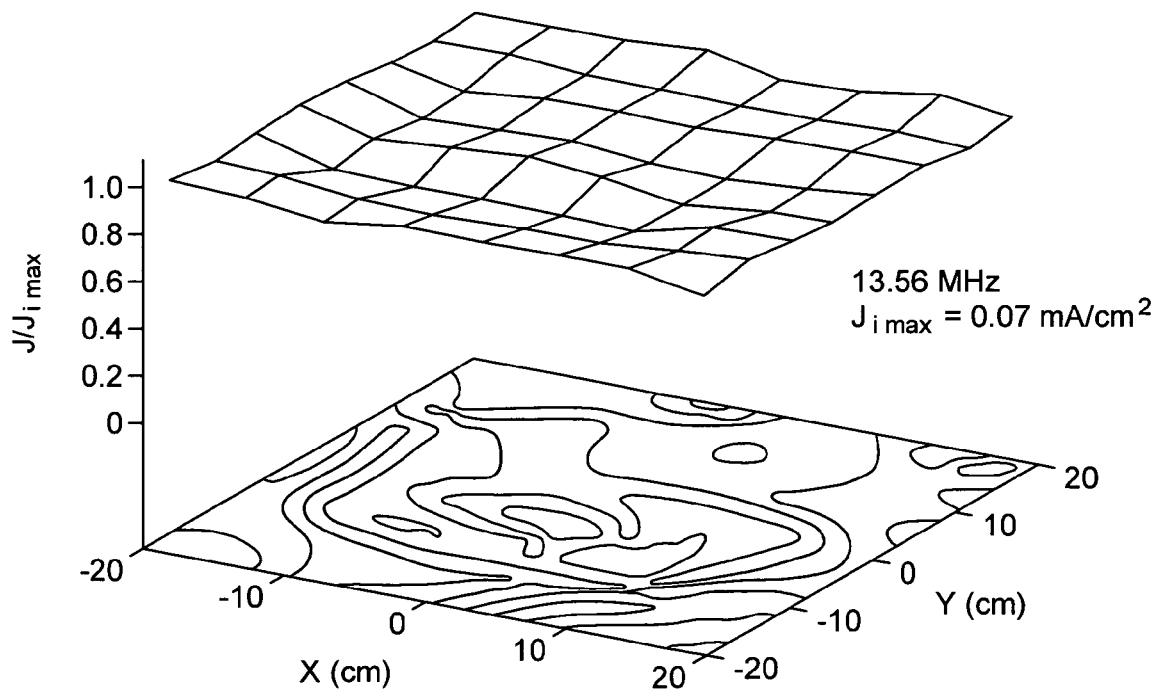
FIGS. 7A-7C are topographical maps and corresponding three dimensional renderings of the relative electron density distribution for a square discharge 20 cm×20 cm at 150 mTorr argon and 50 W of RF power, for a parallel plate processing chamber, where 7A represents an RF frequency of 13.56 MHz, 7B represents an RF frequency of 60 MHz, and 7C represents an RF frequency of 81.36 MHz. Relative ion flux density at the center of the square=1.
Figure 7B:
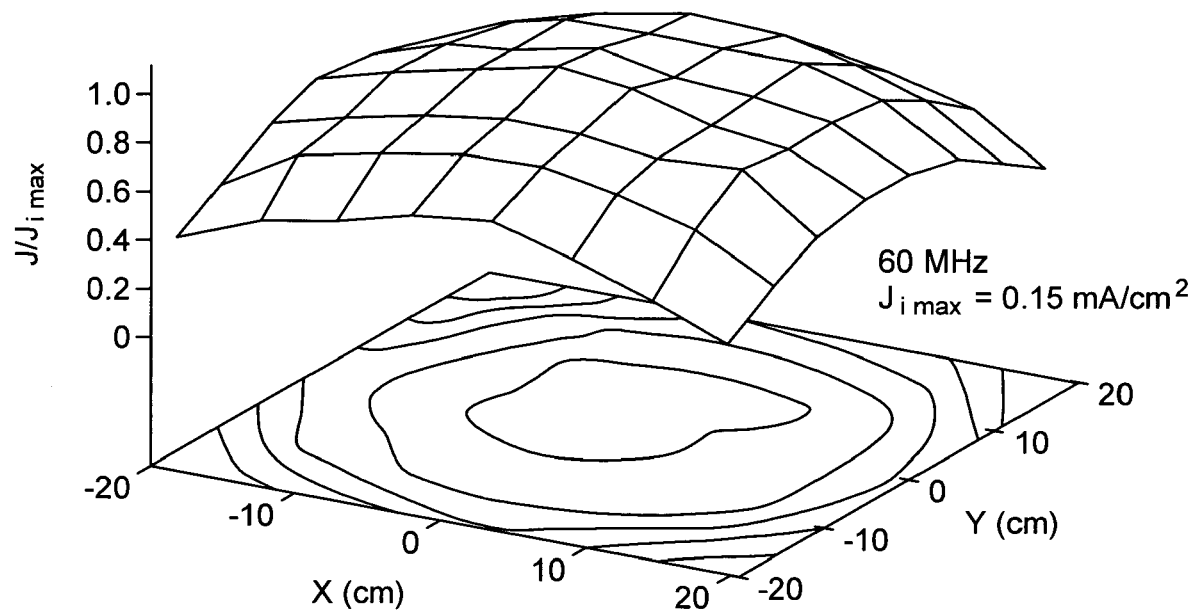
Figure 7C:
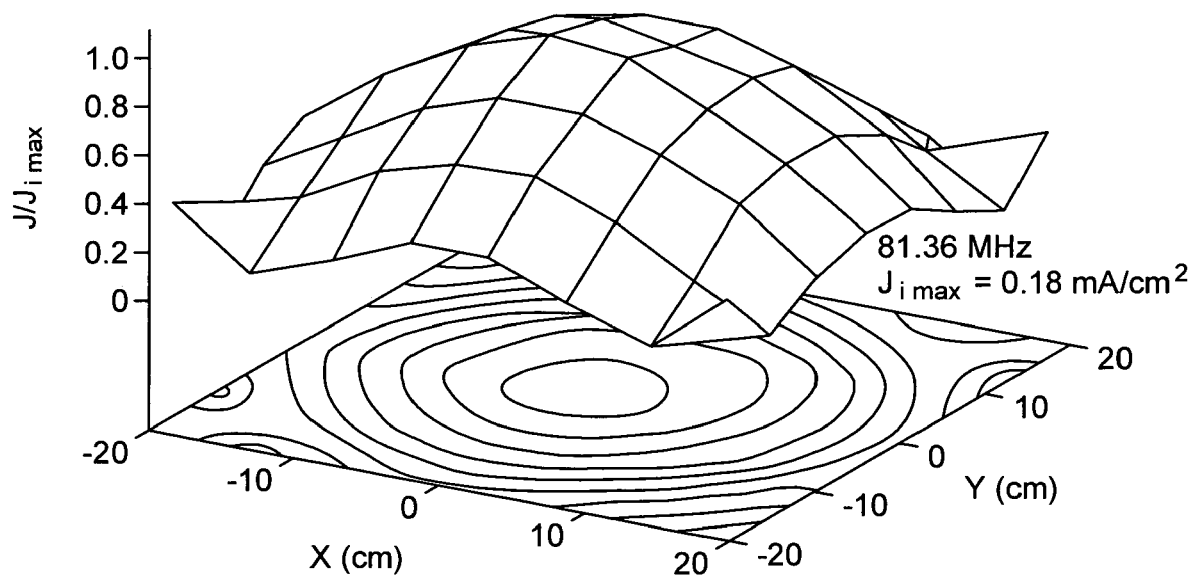

FIGS. 7A-7C are topographical maps and corresponding three dimensional renderings of the relative electron density distribution for a square discharge 20 cm×20 cm at 150 mTorr argon and 50 W of RF power, for a parallel plate processing chamber, where 7A represents an RF frequency of 13.56 MHz; FIG. 7B represents an RF frequency of 60 MHz; and, FIG. 7C represents an RF frequency of 81.36 MHz. All of the experimental examples presented above were for a plasma source power applied at a frequency of 13.56 MHz. However, as the substrates to be processed grow increasingly larger, it may become advantageous to use RF frequency as an additional tool for controlling the uniformity of film thickness across the substrate surface.

As can be seen by comparing FIGS. 7B and 7C with FIG. 7A, an increase in frequency directly relates to a very significant increase in the non-uniformity of plasma density distribution across a substrate surface. An RF frequency of 7 MHz has been demonstrated to provide better results than a RF frequency of 13.56 MHz. However, at 2 MHz, we observed an increase in film roughness and a decrease in film uniformity which has been attributed to ion bombardment of the depositing film surface.

Example Three

Modification of the Diffuser Plate of the Gas Distribution Assembly

Figure 20:
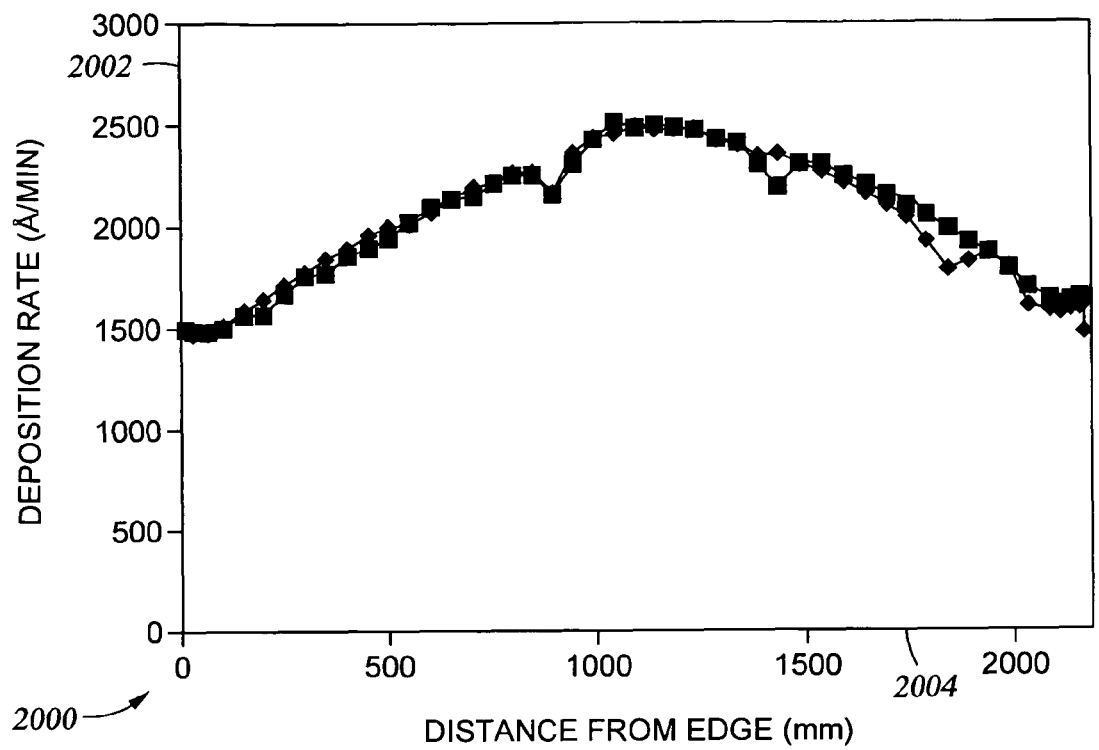
FIG. 20 is a graph of the film thickness (in nm) as a function of the distance of travel (in mm) across the width of the substrate, where the width of the substrate was 2200 mm and the length of the substrate was 1870 mm (for a total substrate area of 41,140 cm$^2$), for an a-SiN$_x$:H film which was PECVD deposited in a process chamber having an electrode spacing of 1050 mils, using a standard (uniform hollow cathode cavity) diffuser plate.

We found that, as substrate sizes increased over 30,000 cm², to 40,000 cm² and beyond, process modifications such as those described in Examples One and Two, above, are not always enough to compensate for surface standing wave effects. For example, FIG. 20 is a graph 2000 of the film thickness 2002 as a function of the distance of travel 2004 (in mm) across the width of the substrate, where the width of the substrate was 2200 mm and the length of the substrate was 1870 mm (for a total substrate area of 41,140 cm²), for an a-SiN$_x$:H film. The a-SiN$_x$:H film was PECVD deposited in an AKT™ 40 K PECVD System (which is described above in "APPARATUS FOR PRACTICING THE INVENTION" and shown schematically in FIGS. 19A-19C) process chamber having an electrode spacing of 600 mils, using a "standard" (uniform hollow cathode cavity) diffuser plate.

We discovered that controlling the plasma density at point locations on the substrate surface has the most significant impact on surface standing wave effects. The plasma density is typically varied across the substrate surface, for example (and not by way of limitation), by equipment modifications, such as by modifying openings in the gas distribution diffuser plate so that there is an increase in hollow cathode effect from the center toward the edge of the diffuser plate. This increase in hollow cathode effect may be provided by gradually increasing diameters, surface areas, or depths, or combinations thereof, of the openings (hollow cathode cavities) from the center toward the edge of the diffuser plate. This provides an increased surface area for hollow cathode cavity effect from the center toward the edge of the diffuser plate. The increased hollow cathode effect adjusts the plasma density so that better uniformity is achieved from center to edge of the substrate.

Provided herein is a modified diffuser plate for a gas distribution assembly for providing gas delivery within a processing chamber. The diffuser plate is illustratively described below with reference to a plasma enhanced chemical vapor deposition system configured to process large area substrates, such as a plasma enhanced chemical vapor deposition (PECVD) system, available from AKT, a division of Applied Materials, Inc., Santa Clara, Calif. However, it should be understood that the diffuser plate has utility in other system configurations in which distributing gas within a process chamber is desired, such as in etch systems and in other chemical vapor deposition systems. The diffuser plate may be sized to fit any substrate shape.

One exemplary gas distribution plate which provides increased surface area for hollow cathode cavity effect from the center toward the edge of the diffuser plate is illustrated in FIG. 3C and described above in "APPARATUS FOR PRACTICING THE INVENTION", above. Examples of standard gas distribution plates which may be modified to provide a more uniform plasma point density over a substrate surface are described in commonly assigned U.S. patent application Ser. No. 09/922,219, filed Aug. 8, 2001 by Keller et al., U.S. Patent Application Ser. No. 10/140,324, filed May 6, 2002 by Yim et al., and 10/337,483, filed Jan. 7, 2003 by Blonigan et al., U.S. Pat. No. 6,477,980, issued Nov. 12, 2002 to White et al., U.S. patent application Ser. No. 10/417,592, filed Apr. 16, 2003 by Choi et al., and U.S. patent application Ser. No. 10/823,347, filed on Apr. 12, 2004 by Choi et al., which are hereby incorporated by reference in their entireties.

As substrate sizes continue to grow in the TFT-LCD industry, film thickness and property uniformity for large area plasma-enhanced chemical vapor deposition (PECVD) becomes more problematic. Noticeable uniformity problems which have been observed during deposition of silicon nitride films include higher deposition rates and more compressive films in the central area of large substrates. The thickness uniformity across the substrate appears "dome shaped", with the film thicker in the center region than at the edge region. The film in the edge region, which has a lower compressive stress, exhibits a higher Si—H content. The manufacturing requirements for TFT-LCD include low Si—H content (for example, <15 atomic %), high deposition rate (for example, >1500 Å/min), and low thickness non-uniformity (for example, <15%) across the substrate. The Si—H content is calculated from FTIR (Fourier Transform Infra-Red) measurements.

Typically, the larger the substrates, the worse the "dome shape" uniformity issues (as illustrated in FIG. 20, described above). While process recipe modifications help reduce non-uniformity, when a substrate exceeds a surface area of about 10,000 cm², process recipe modifications are no longer able to solve the problem. Therefore, the issue was addressed by providing processing apparatus which improved plasma point density across the substrate surface. We have also found that, by modifying processing apparatus to improve plasma point density across the substrate surface, conventional PECVD precursor gas compositions can be used, without the need for process recipe modifications.

Figure 8A:
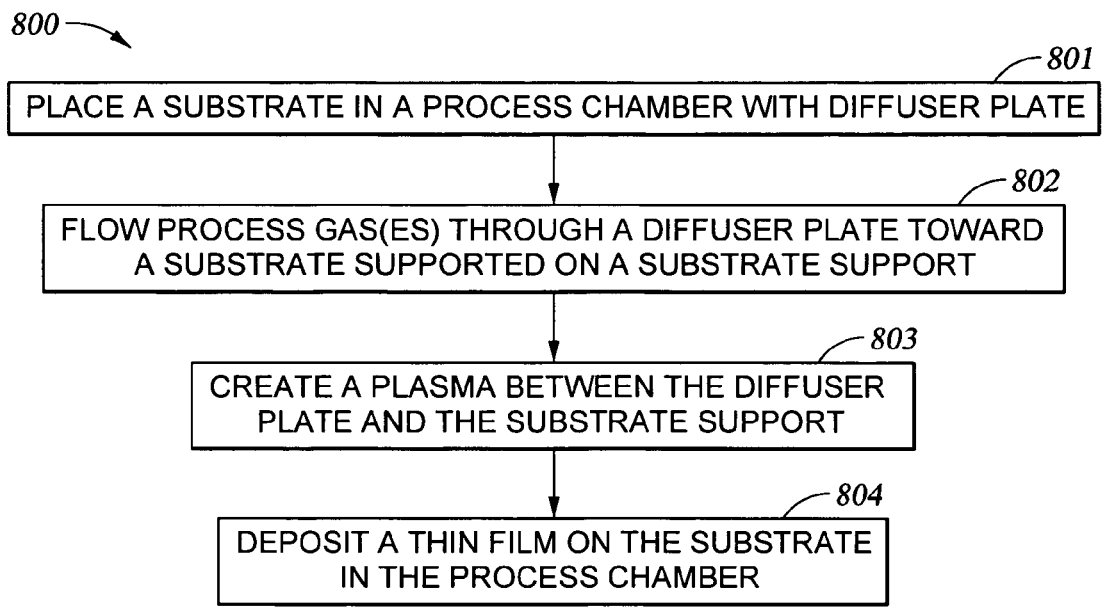
FIG. 8A shows a process flow chart for depositing a thin film on a substrate in a process chamber with a diffuser plate.

A general flowchart outlining a general process for depositing a thin film in a process chamber is shown in FIG. 8A. The process starts at step 801 when a substrate is placed in a process chamber with a diffuser plate. Next, at step 802, process gases are flowed through the diffuser plate toward a substrate supported on a substrate support. Then, at step 803, a plasma is created between the diffuser plate and the substrate support. At step 804, a thin film is deposited on the substrate in the process chamber.

Figure 8B:
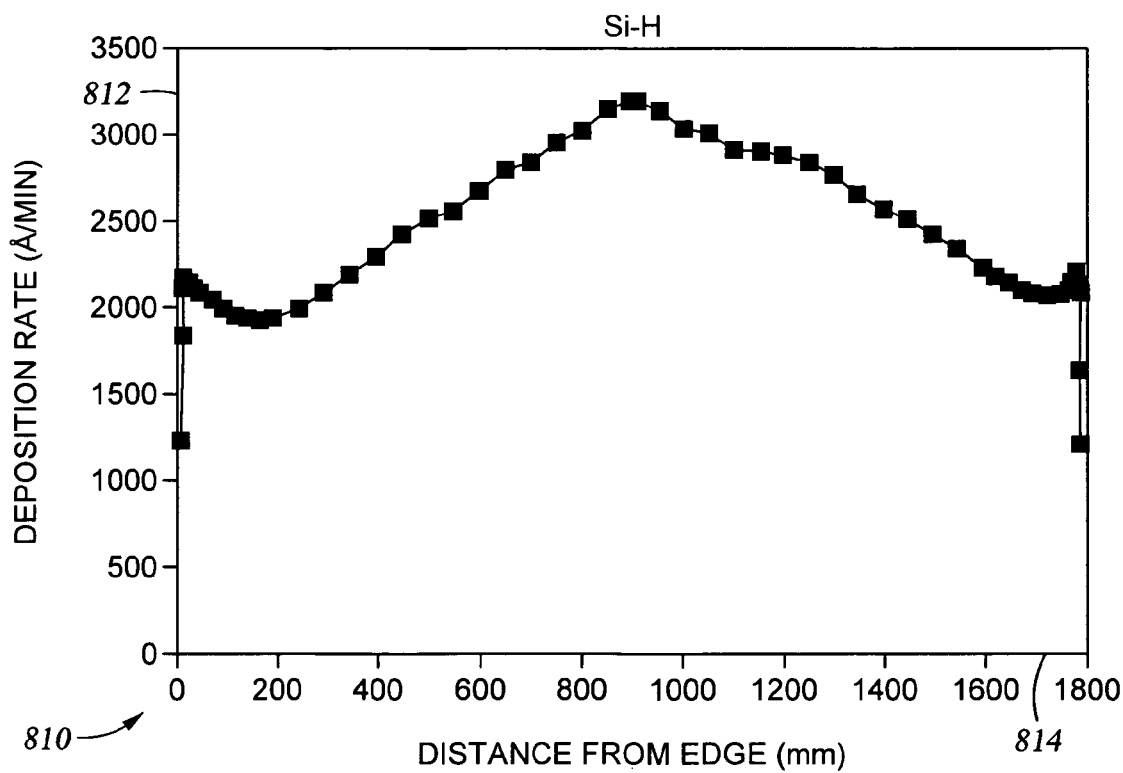
FIG. 8B shows the deposition rate measurement across a 1500 mm by 1800 mm substrate collected from deposition with a diffuser plate with uniform diffuser holes diameters and depths.

FIG. 8B is a graph 810 showing the deposition rate 812 (in Å/min) of a silicon nitride film as a function of the distance of travel 814 (in mm) across a glass substrate upon which the film was deposited. The size of the substrate was 1500 mm by 1800 mm. The diffuser plate used in the deposition chamber had diffuser holes with the design shown in FIG. 3C. The diameter of the first bore 380 was 0.156 inch. The length 390 of the first bore 380 was 1.049 inch. The diameter 394 of the second bore 386 was 0.250 inch. The flaring angle 396 of the second bore 386 was 22 degrees. The length 392 of the second bore 386 was 0.243 inch. The diameter of the orifice hole 384 was 0.016 inch, and the length 376 of the orifice hole 384 was 0.046 inch. The SiN film was deposited using a precursor gas mixture of 2800 sccm $SiH_4$, 9600 sccm $NH_3$, and 28,000 sccm $N_2$. The process chamber pressure during deposition was 1.5 Torr, and an RF source power of 15,000 W was applied. The spacing between the diffuser plate and the substrate support assembly was 1.05 inch (1050 mils). The process temperature was maintained at about 355° C. The average film deposition rate was 2444 Å/min, and the thickness uniformity (with 15 mm edge exclusion) was 25.1%, which is higher than the manufacturing specification (<15%). The thickness profile shows a center thick profile, or "dome shape" profile.

Table Eleven, below, shows the film properties measured from sample wafers placed on a glass substrate in the process chamber during deposition of the film described above.

TABLE ELEVEN

Measurement of Thickness and Film Properties of a SiN Film Deposited on a Substrate

| Measurement Location | Film Thickness (Å) | Refractive Index | Stress (×10⁹ dynes/cm²) | Si—H (atomic %) | Wet Etch Rate (Å/min) |
|---|---|---|---|---|---|
| Edge I | 5562 | 1.92 | −0.7 | 12.5 | 664 |
| Center | 8544 | 1.90 | −6.7 | 4.2 | 456 |
| Edge II | 6434 | 1.91 | −1.2 | 10.8 | 665 |

Edge I and Edge II represent two extreme ends of the substrate, where the substrate had a width of 1800 mm. The refractive index, film stress, Si—H concentration, and wet etch rate data show a more compressive film near the center region in comparison to the edge region of the substrate. The Si—H concentrations at the substrate edges are approaching the manufacturing limit of 15%.

One theory about the cause of the center to edge non-uniformity problem is that excess residual gas between the diffuser plate and the substrate in the center region of the substrate could not be pumped away effectively, which may have resulted in a more rapid deposition rate in the center region and a film exhibiting increased residual compressive stress in the center region of the substrate. A simple test was designed to test this theory. A thermo-resistant tape was used to block two of the pumping channels 314 (shown in FIG. 3B) near two edges of the substrate, which are shown as 901 and 902 in FIG. 9. This caused an increase in the amount of residual gas near the center of the substrate in the PECVD process chamber. The pumping channels 314 near the other two sides were left open, resulting in an asymmetric gas pumping situation. The use of the thermo-resistant tape to block gas flow from two edges of the substrate was expected to worsen the uniformity of film deposition and to result in even worse uniformity across the substrate. However, little change was observed comparing the deposition results between deposition performed with two pumping channels blocked and deposition with all pumping channels open (refer to Table Twelve, below). The diffuser plate used had the same design and dimensions as that used to provide the data shown in FIG. 4B and Table Eleven, above. The SiN films in Table Twelve were deposited using a precursor gas composition of 3300 sccm $SiH_4$, 28,000 sccm $NH_3$, and 18000 sccm $N_2$. The process chamber pressure was 1.3 Torr, and an RF source power of 11,000 W was applied. The spacing between the diffuser plate and the support assembly was 0.6 inch (600 mils). The process temperature was maintained at about 355° C. Referring back to FIG. 9, film thickness and properties were measured at locations 1, 2, 3, 4, and 5 on the substrates.

TABLE TWELVE

SiN Thickness and Film Properties Comparison Between Deposition with All Pumping Channels Open or with Two Pumping Channels Blocked

| | All Pumping Channels Open | | | | Two Pumping Channels Blocked | | | |
|---|---|---|---|---|---|---|---|---|
| Position | Thickness (Å) | RI | Stress* | Si—H** | Thickness (Å) | RI | Stress* | Si—H** |
| 1 | 6156 | 1.92 | −4.6 | 11.1 | 5922 | 1.93 | −3.9 | 11.5 |
| 2 | 7108 | 1.91 | −5.1 | 8.8 | 7069 | 1.92 | −5.1 | 9.1 |
| 3 | 7107 | 1.91 | −5.1 | 8.5 | 7107 | 1.91 | −4.8 | 8.9 |
| 4 | 7052 | 1.91 | −5.0 | 8.1 | 7048 | 1.91 | −4.6 | 8.5 |
| 5 | 6173 | 1.92 | −4.2 | 10.8 | 6003 | 1.92 | −3.8 | 11.2 |

*×10⁹ dynes/cm².

**Atomic %.

The results presented in Table Twelve show little difference between the film deposited with two pumping channels blocked and the film deposited with all pumping channel open. In addition, there was little difference in the film deposited at locations 1 and 5, which should be different if excessive residual process gas was the cause of the problem. Therefore, the theory of excess residual process gas between the diffuser and the substrate was determined not to be correct.

Figure 10:
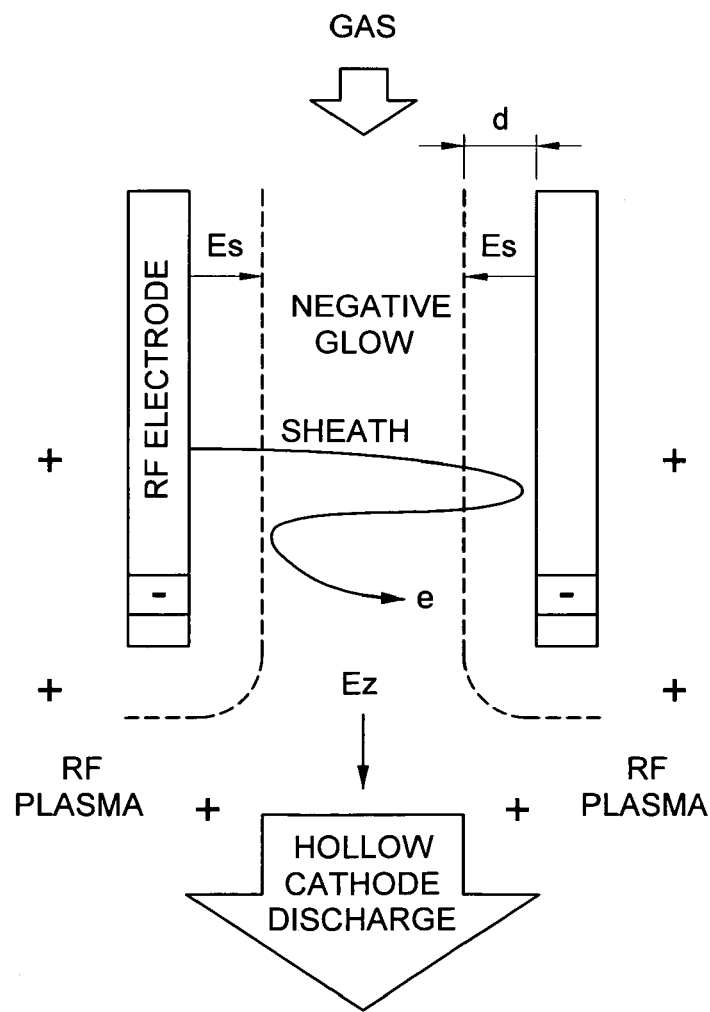
FIG. 10 illustrates the concept of the hollow cathode effect.
Figure 11A:
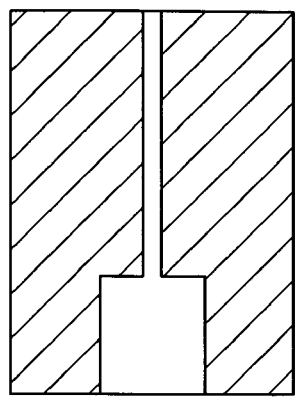
FIGS. 11A-11F show cross-sectional schematics for various designs of hollow cathode cavities.
Figure 11B:
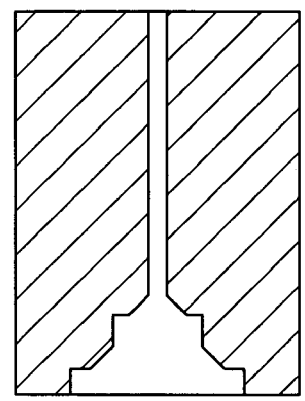
Figure 11C:
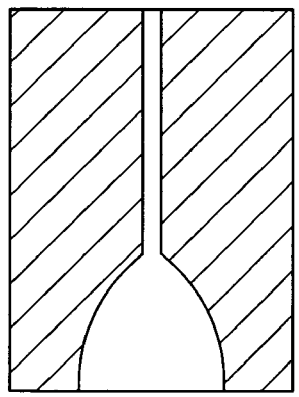
Figure 11D:
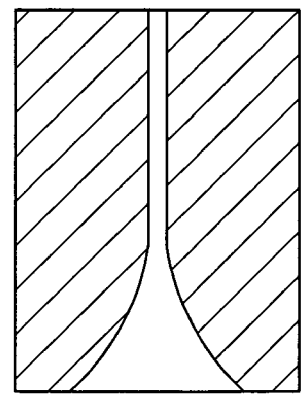
Figure 11E:
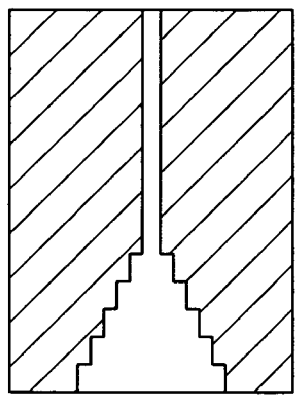
Figure 11F:
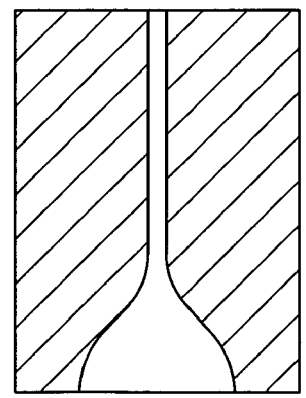

Deposition of films by PECVD depends substantially on the density of the active plasma. The density of the chemically reactive plasma can be altered at a given point by altering the hollow cathode effect at that given point. The driving force in the RF generation of a hollow cathode discharge is the frequency-modulated DC voltage Vs (the self-bias voltage) across the space charge sheath at the RF electrode. An RF hollow cathode and the oscillation movement of electrons between repelling electric fields, Es, of the opposing sheaths are shown schematically in FIG. 10. An electron emitted from the cathode wall, which could be the walls of the reactive gas passages that are close to the process volume 312 (refer to FIG. 3B), is accelerated by the electric field Es across the wall sheath which is shown in FIG. 10. The electron oscillates across the inner space between walls of the electrode due to the repelling fields of the opposite wall sheaths. The electron loses energy by collisions with the gas and creates more ions. The created ions can be accelerated toward the cathode walls, thereby enhancing the emission of secondary electrons, which could create additional ions. The design of the cavities between the cathode walls can be used to enhance the electron emission and ionization of the gas. Flared-cone shaped cathode walls of the kind shown in FIG. 3C, with gas inlet diameters smaller than the gas outlet diameters, are more efficient at ionizing the gas than cylindrical walls. The potential Ez can be adjusted by changing the design of the cathode walls.

By designing the gas diffusion plate so that the hollow cathode cavities which face the substrate increase the Ez toward the edges of the substrate, it is possible to improve the uniformity of plasma point density across the substrate and to thereby improve deposition film uniformity. With reference to FIG. 3C, the walls of the hollow cathode cavities that are close to the process volume 312 are the walls of the second bore 386. The hollow cathode effect mainly occurs in the flared cone 386 that faces the process volume 312. However, as is readily apparent from the data shown in FIG. 8B, the use of the flared cone 386 alone does not solve the film nonuniformity problem. It is necessary to either increase the number of hollow cathode cavities near the edges of the gas diffusion plate or to change the design of the cavities near the edges, so that a higher Ez is achieved near the edges. The gas diffusion plate modifications described herein can be applied using various types of hollow cathode cavity designs. Other examples of hollow cathode cavity design include, but not limited to, the designs shown in FIGS. 11A-11F. By varying the volume and/or the surface area of the hollow cathode cavity, the Ez and plasma ionization rate can be varied.

Figure 12A:
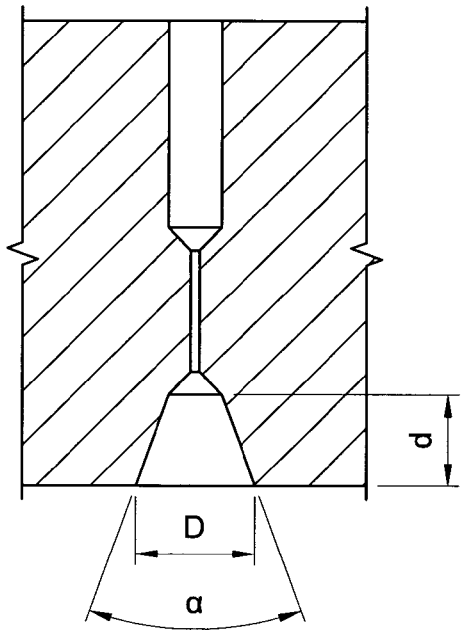
FIG. 12A shows the definition of diameter "D", the depth "d" and the flaring angle "a" of the bore that extends to the downstream end of a gas passage.

Using the design in FIG. 3C as an example, the volume of the second bore 386 of the hollow cathode cavity can be changed by varying the diameter "D" (or diameter 394 in FIG. 3C), the depth "d" (or length 392 in FIG. 3C), and the flaring angle "a" (or flaring angle 396 in FIG. 3C), as shown in FIG. 12A. Changing the diameter, depth, and/or the flaring angle changes the surface area of the bore 386. Since the center of the substrate exhibits a higher film deposition rate and the resulting films have a higher compressive stress, a higher plasma density at the center of the substrate (relative to the edge) is likely the cause. By increasing the bore depth, the diameter, the flaring angle, or a combination of these three parameters of the hollow cathode cavity from the center toward the edge of the diffuser plate, the active surface area of the hollow cathode is increased toward the edge of the gas diffusion plate. This produces an increase in plasma density from the center region of the substrate toward the edge, to improve the film thickness and film property uniformities across the entire substrate.

Figure 12B:
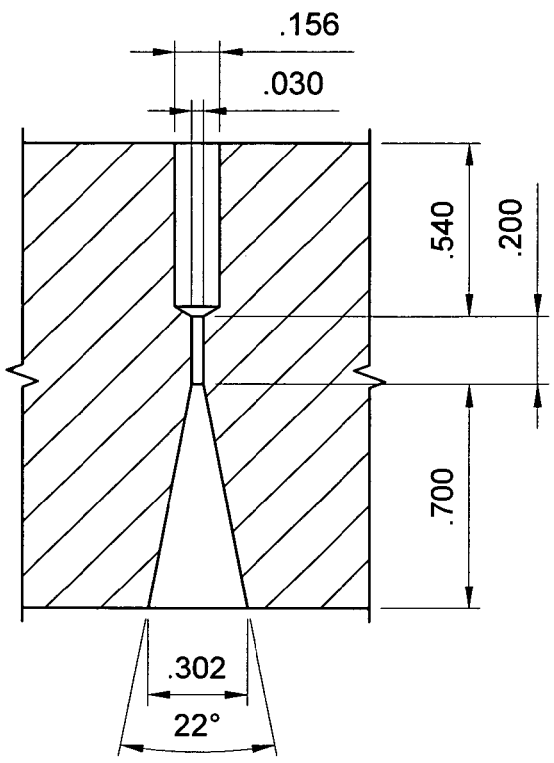
FIGS. 12B-12D show the dimensions of gas passages of varying depths.
Figure 12C:
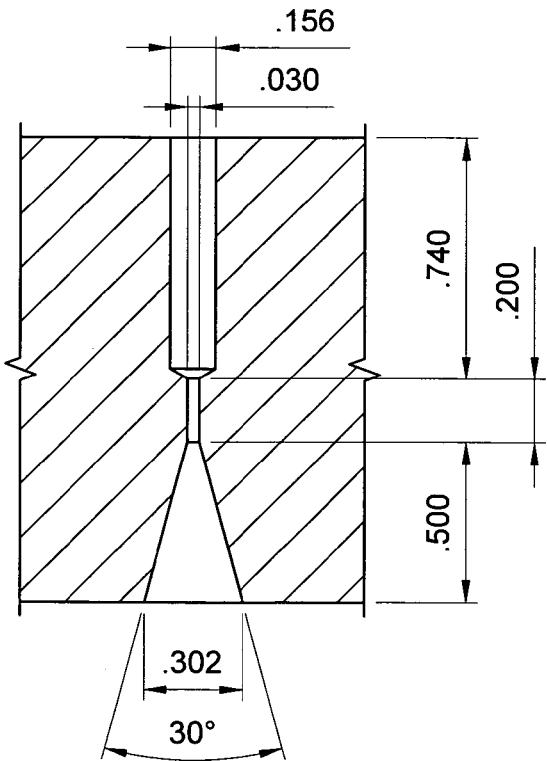
Figure 12D:
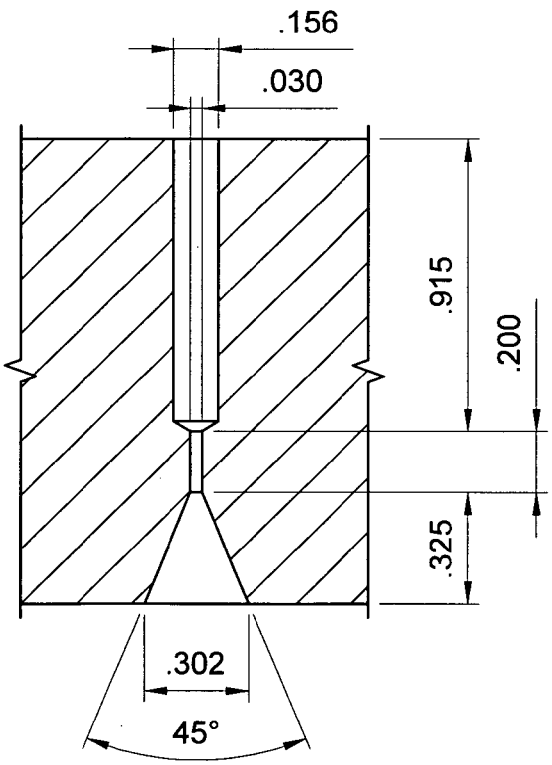
Figure 12E:
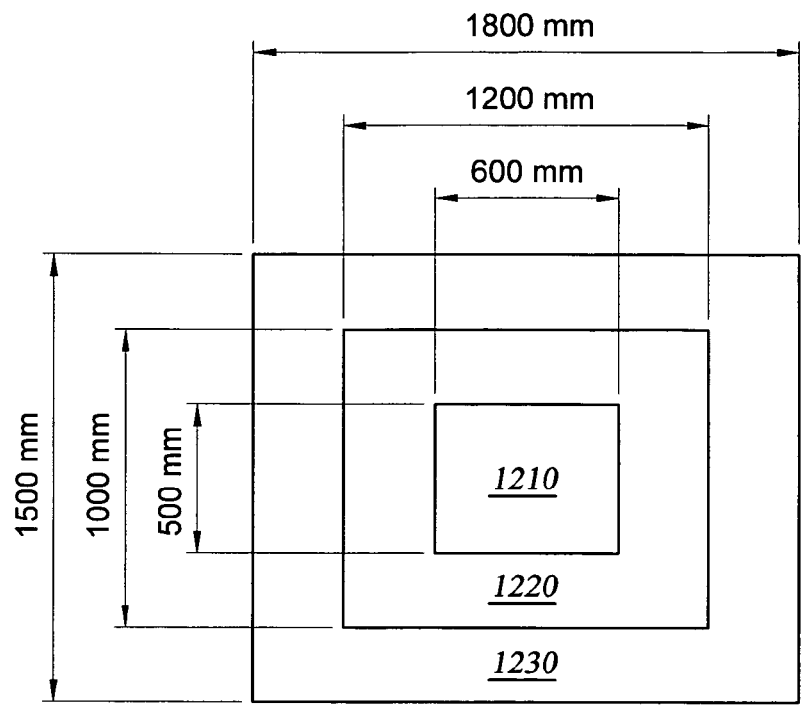
FIG. 12E shows a distribution of gas passages across a diffuser plate for an invention embodiment.

FIGS. 12B, 12C, and 12D show three diffuser passage (or diffuser hole) designs that are arranged on a diffuser plate which is shown in FIG. 12E. The FIGS. 12B, 12C, and 12D designs have the same cone (or bore) diameter, but the cone (or bore) depth and total cone (bore) surface areas are largest for the FIG. 12B design and smallest for the FIG. 12D design. The cone flaring angles have been changed to match the final cone diameter. The cone depth for FIG. 12B is 0.7 inch, the cone depth for FIG. 12C is 0.5 inch, and the cone depth for FIG. 12D is 0.325 inch. The smallest rectangle 1210 in FIG. 12E is 500 mm by 600 mm, and the diffuser holes have a cone depth of 0.325 inch, a cone diameter of 0.302 inch, and a flare angle of 45° (refer to FIG. 12D). This provides the minimum hollow cathode active surface area of the three designs shown. The medium rectangle in FIG. 12E is 1000 mm by 1200 mm. The diffuser holes in the area 1220 between the medium rectangle and the smallest rectangle have a cone depth of 0.5 inch, a cone diameter of 0.302 inch, and a flare angle of 30° (refer to FIG. 12C). This provides a middle range hollow cathode active surface area. The largest rectangle in FIG. 12E is 1500 mm by 1800 mm. The diffuser holes in the area 1230 between the largest rectangle and the medium rectangle have a cone depth of 0.7 inch, a cone diameter of 0.302 inch, and a flare angle of 22° (refer to FIG. 12B). This provides the maximum hollow cathode active surface area of the three designs shown. The orifice holes diameters are all 0.03 inch, and the orifice hole depths are all 0.2 inch for FIGS. 12B, 12C, and 12D. The thickness of the three diffuser plates are all 1.44 inch. The diameters for the first bore 380 for FIGS. 12B, 12C, and 12D are all 0.156 inch, and the first bore depths are 0.54 inch (FIG. 12B), 0.74 inch (FIG. 12C), and 0.915 inch (FIG. 12C), respectively.

Figure 13:
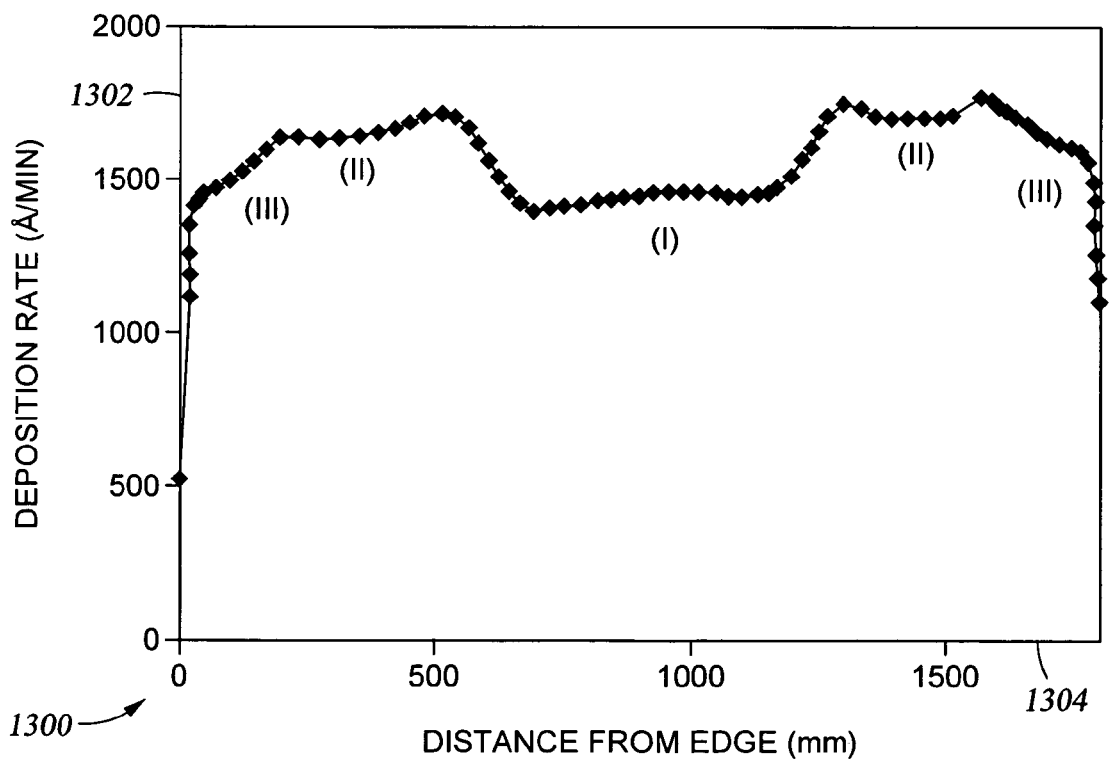
FIG. 13 shows the deposition rate measurement across a 1500 mm by 1800 mm substrate collected from deposition with a diffuser plate with a distribution of gas passages across the diffuser plate as shown in FIG. 12E.

FIG. 13 is a graph 1300 showing the deposition rate 1302 (in Å/min) of a silicon nitride film as a function of the distance of travel 1304 (in mm) across a glass substrate upon which the film was deposited. Region I correlates with the area under "0.325 inch depth" cones, while Regions II and III correlate with the area under "0.5 inch depth" cones and "0.7 inch depth" cones, respectively. Although the film thickness distribution is still not completely uniform across the substrate, it is improved considerably over the previous distribution shown in FIG. 8B, which was obtained using a constant hollow cathode surface area across the gas diffusion plate.

Figure 9:
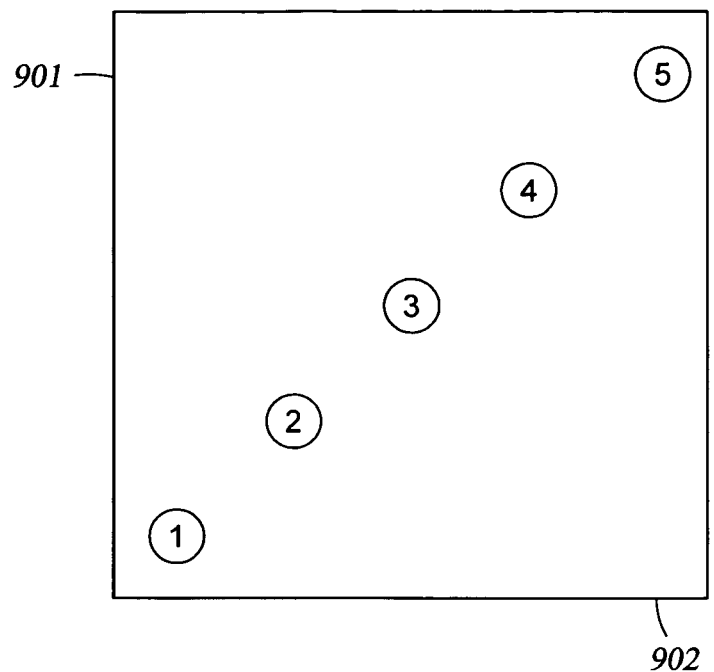
FIG. 9 shows two sides (901 and 902) of the substrate that are close to the sides with pumping channels closed and the 5 measurement locations on a substrate.

Table Thirteen, below, shows the measurement of film thickness and properties across the substrate. The SiN film in Table Thirteen was deposited using a precursor gas mixture of 3300 sccm $SiH_4$, 28,000 sccm $NH_3$, and 18,000 sccm $N_2$. The process chamber pressure was 1.3 Torr, and an RF source power of 11,000 W was applied. The spacing between the diffuser plate and the support assembly was 0.6 inch (600 mils). The process temperature was maintained at about 355° C. The locations 1, 2, 3, 4, and 5 were as indicated in FIG. 9.

TABLE THIRTEEN

SiN Film Thickness and Property Measurement with Diffuser Plate with Three Regions of Varying Cone Depths

| Position | Cone Depth (inch) | Thickness (Å) | RI | Stress (×10⁹ dynes/cm²) | Si—H (atomic %) |
|---|---|---|---|---|---|
| 1 | 0.7 | 6060 | 1.924 | −4.09 | 9.10 |
| 2 | 0.5 | 6631 | 1.921 | −5.49 | 9.66 |
| 3 | 0.325 | 5659 | 1.915 | −2.02 | 12.34 |
| 4 | 0.5 | 6956 | 1.916 | −5.45 | 9.37 |
| 5 | 0.7 | 6634 | 1.917 | −4.14 | 8.83 |

The results show that reducing the cone depth and the cone surface area reduces the film deposition rate. The results also show that reducing the volume and/or surface area of the hollow cathode cavity reduces the film deposition rate. The reduction in the film deposition rate reflects a reduction in plasma ionization rate. Since the change of cone depth and total cone surface area from Region I to Region II to Region III is not smooth, the deposition rates across the substrate show three regions. Regions I, II, and III on the substrate match the diffuser hole regions 1210, 1220, and 1230. This indicates that changing the hollow cathode cavity design changes the plasma ionization rate and emphasizes the importance of making the changes smooth and gradual.

Figure 14A:
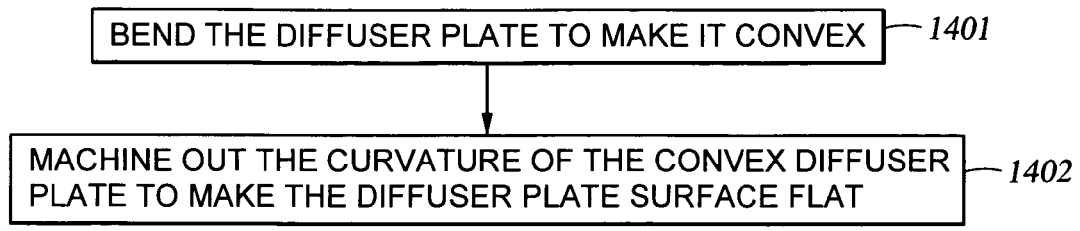
FIG. 14A shows the process steps for making a diffuser plate.

There are many ways to gradually increase the hollow cathode cavity effect from the inner regions of the diffuser plate toward the outer regions of the diffuser plate, to improve plasma uniformity across the diffuser plate. One way is to first deform a diffuser plate, which has identical gas diffusing passages across the diffuser plate, to a pre-determined curvature and afterwards machine the diffuser plate surface which faces the substrate to provide a flat surface. FIG. 14A shows the process steps for this concept. The process starts by deforming the diffuser plate to make the surface which is to face the substrate convex at step 1401 (as shown in FIG. 14B), followed by machining flat the convex surface of the diffuser plate, to make the diffuser plate surface flat at step 1402 (as shown in FIG. 14C).

Figure 14B:
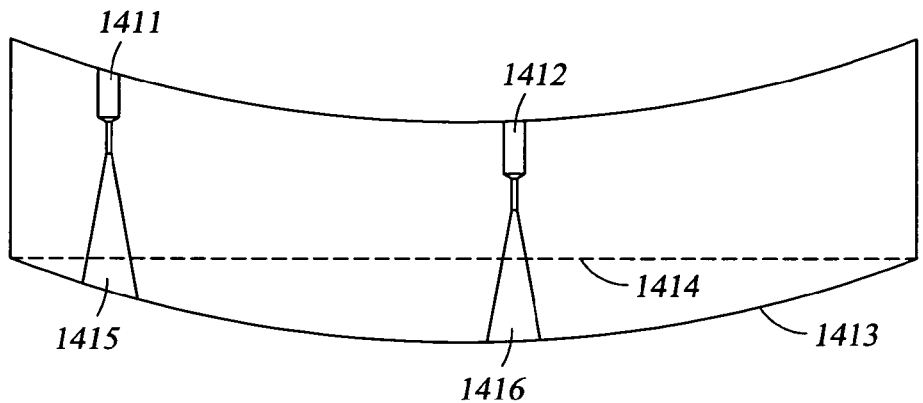
FIG. 14B shows a deformed diffuser plate.

FIG. 14B shows a schematic drawing of a convex diffuser plate with an exemplary diffuser hole (or gas passage) 1411 at the edge (and outer region) and an exemplary diffuser hole 1412 in the center (and inner region) as diffuser holes. The diffuser holes 1411 and 1412 were identical (not shown) before the deformation process, and the design is shown in FIGS. 3C and 12A. However, other different, varying diffuser hole designs may be used to carry out the invention. The design in FIG. 3C is merely used for example. Diffuser plate downstream surface 374 faces the process volume 312. The gradually changing distance between the 1413 surface and the flat 1414 surface (dotted due to its non-existence) shows the curvature. The edge diffuser cone 1415 and center diffuser cone 1416 are identical in size and shape prior to the deformation process.

Figure 14C:
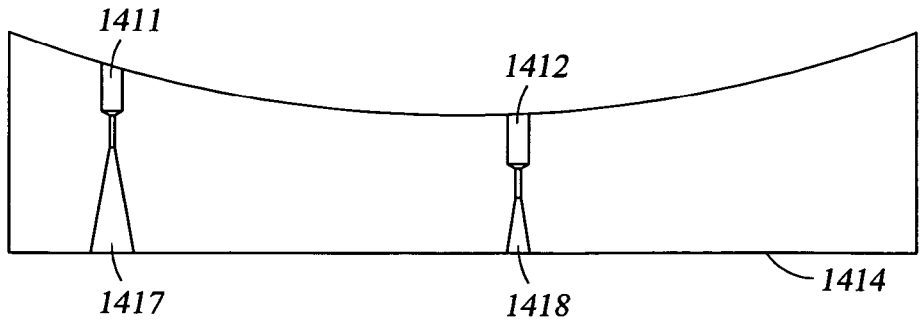
FIG. 14C shows a diffuser plate that was previously deformed as shown in FIG. 14B, where the side of the plate which faces the substrate during deposition has been machined to be flat.

FIG. 14C shows the schematic drawing of a diffuser plate after the surface has been machined to be flat, at the 1414 surface. The surface facing the process volume 312 after machining to the 1414 surface provides a center cone 1418 which is significantly shorter than the edge cone 1417. Since the change of the cone size (volume and/or surface area) is created by deforming the diffuser plate followed by machining to a flat surface, the change of the cone size (volume and/or surface area) from center to edge is gradual. The center cone 1418 would have a diameter "D" and depth "d" smaller than the diameter and depth of the edge cone 1417. (The definition of cone diameter "D" and cone depth "d" can be found in the description of FIG. 12A.)

Figure 14D:
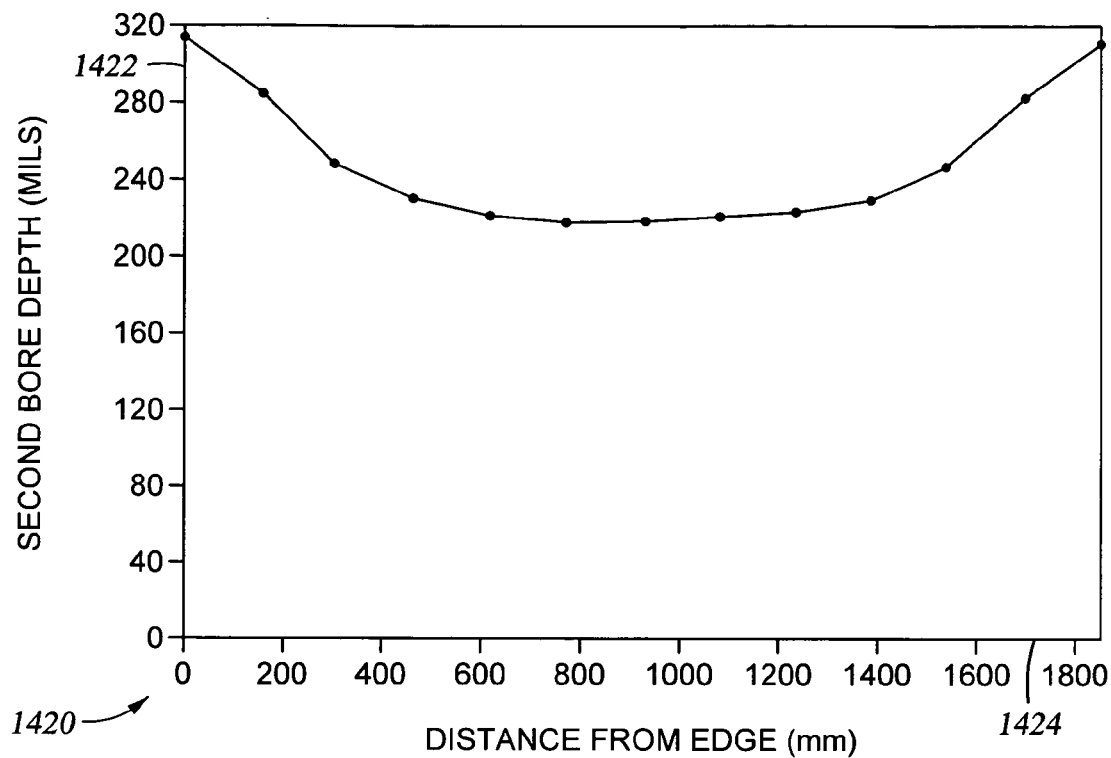
FIG. 14D shows a plot of one embodiment distribution of depths of diffuser bores of a diffuser plate used to process 1500 mm by 1850 mm substrates.

FIG. 14D shows the depth "d" of the second bores 386 that extend to the downstream side of an exemplary diffuser plate, which is used to process 1500 mm by 1850 mm substrates. FIG. 14D is a graph 1420 showing the second bore depth 1422 (in mil) as a function of the position 1424 (in mm) across the width of the diffuser plate. The diffuser plate has diffuser holes with the design shown in FIG. 12A. The diameter of the first bore 380 was 0.156 inch. The length 390 of the first bore 380 was 1.049 inch. The diameter 394 of the second bore 386 was 0.250 inch. The flaring angle 396 of the second bore 386 was 22 degrees. The length 392 of the second bore 386 was 0.243 inch. The diameter of the orifice hole 384 was 0.016 inch, and the length 376 of the orifice hole 384 was 0.046 inch. The measurement of depths of the second bores in FIG. 14D shows a gradual increase in bore depth 392 (or "d" in FIG. 12A) from the center of the diffuser plate toward the edge of the diffuser plate. Due to the deformation and machining processes, the diameter 396 (or "D" in FIG. 7A) of the bore 386 also gradually increases from the center of the diffuser plate toward the edge of the diffuser plate.

Figure 14E:
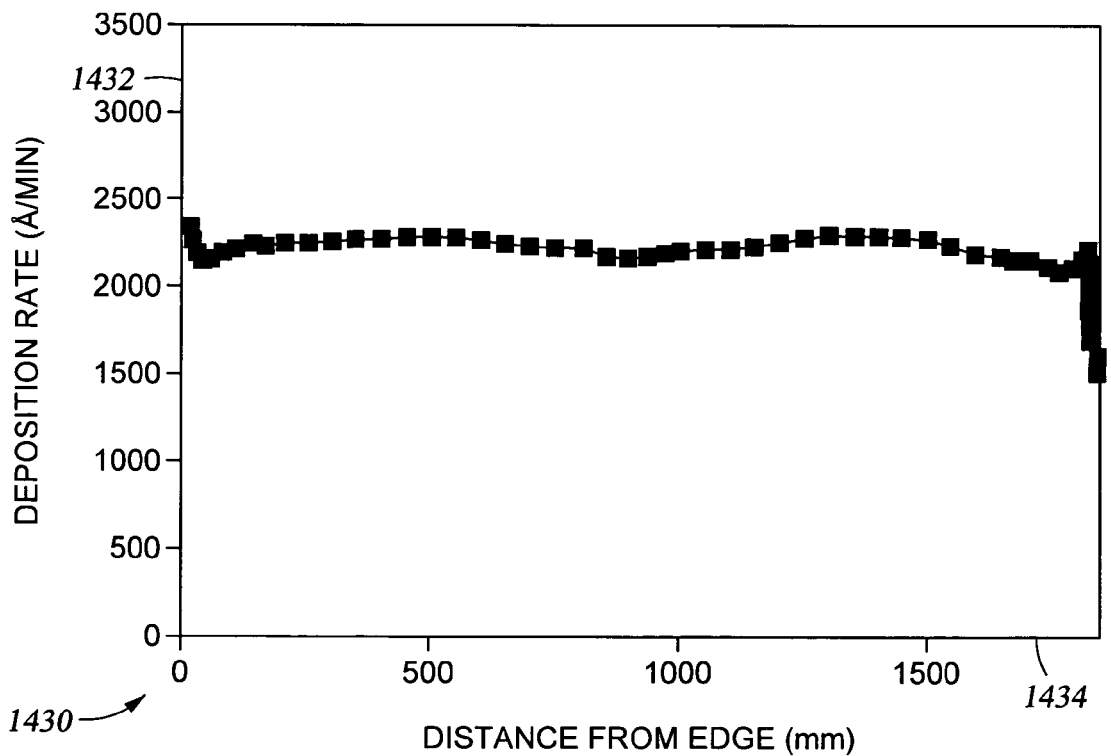
FIG. 14E shows a plot of deposition rates across a 1500 mm by 1850 mm substrate, with measurements made across a diagonal from edge to edge of the substrate.

FIG. 14E is a graph 1430 showing the deposition rate 2237 (in Å/min) of a silicon nitride film as a function of the distance of travel 1434 (in mm) across a glass substrate upon which the film was deposited using a gas diffusion plate fabricated in the manner described above. The SiN film was deposited in a PECVD chamber having a diffuser plate where the hollow cathode cavity is increased from the center toward the edge of the diffuser plate, and where the second bore depth ("d" in FIG. 12A) profile is shown in FIG. 14D. The size of the substrate was 1500 mm by 1850 mm, which is only slightly larger than the size of substrate (1500 mm×1800 mm) of FIG. 8B and Table Eleven. Typically, the diffuser plate sizes scale up with the substrate sizes. The diffuser plate used to process 1500 mm by 1850 mm substrates is about 1530 mm by 1860 mm, which is slightly larger than the diffuser plate used to process 1500 mm by 1800 mm substrates (diffuser plate about 1530 mm by 1829 mm). The thickness uniformity has improved to 5.0%, which is much smaller than the 25.1% thickness uniformity for the films in FIG. 8B.

Table Fourteen, below, presents the film property distribution across the substrate. The diffuser plate includes diffuser holes with the overall gas passage design shown in FIG. 12A. The diameter of the first bore 380 was 0.156 inch, as described above. The length 390 of the first bore 380 was 1.049 inch. The diameter 394 of the second bore 386 was 0.250 inch, as described above. The flaring angle 396 of the second bore 386 was 22 degrees. The length 392 of the second bore 386 was 0.243 inch. The diameter of the orifice hole 384 was 0.016 inch, as described above, and the length 376 of the orifice hole 384 was 0.046 inch.

The SiN films in FIG. 14E and Table Fourteen were deposited using a precursor gas mixture of 2800 sccm $SiH_4$, 9600 sccm $NH_3$, and 28,000 sccm $N_2$. The process chamber pressure was 1.5 Torr, and an RF power of 15,000 W was applied. The spacing between the diffuser plate and the support assembly was 1.05 inch (1050 mils). The process temperature was maintained at about 355° C. Edge I and Edge II represent two extreme ends of the substrate, as described in the Table Eleven measurement description. The film thickness and film property data presented in Table Fourteen show a much smaller center to edge variation than the data in Table Eleven.

TABLE FOURTEEN

SiN Film Thickness and Property Measurement Using a Diffuser Plate with Gradually Varied Bore Depths and Diameters from Center to Edge for a 1500 mm by 1850 mm Substrate

| Measurement Location | Film Thickness (Å) | Refractive Index | Stress (×10⁹ dynes/cm²) | Si—H (atomic %) | Wet Etch Rate (Å/min) |
|---|---|---|---|---|---|
| Edge I | 6405 | 1.92 | −0.7 | 13.3 | 451 |
| Center | 6437 | 1.91 | −1.8 | 12.7 | 371 |
| Edge II | 6428 | 1.92 | −1.2 | 11.9 | 427 |

Comparing the data in Table Fourteen with the data in Table Eleven (which were collected from deposition with a diffuser plate having a constant bore 386 diameter and depth across the diffuser plate, the variation in thickness, stress, Si—H content, and wet etch rate were all much less for films shown in Table Fourteen. The results show that uniformity of film thickness and film properties can be greatly improved by gradually increasing the diameters and depths of the bores which extend to the downstream side of the diffuser plate, from the center toward the edge of the diffuser plate. The wet etch rates in the tables above were measured by immersing the samples in a BOE 6:1 solution.

Figure 14F:
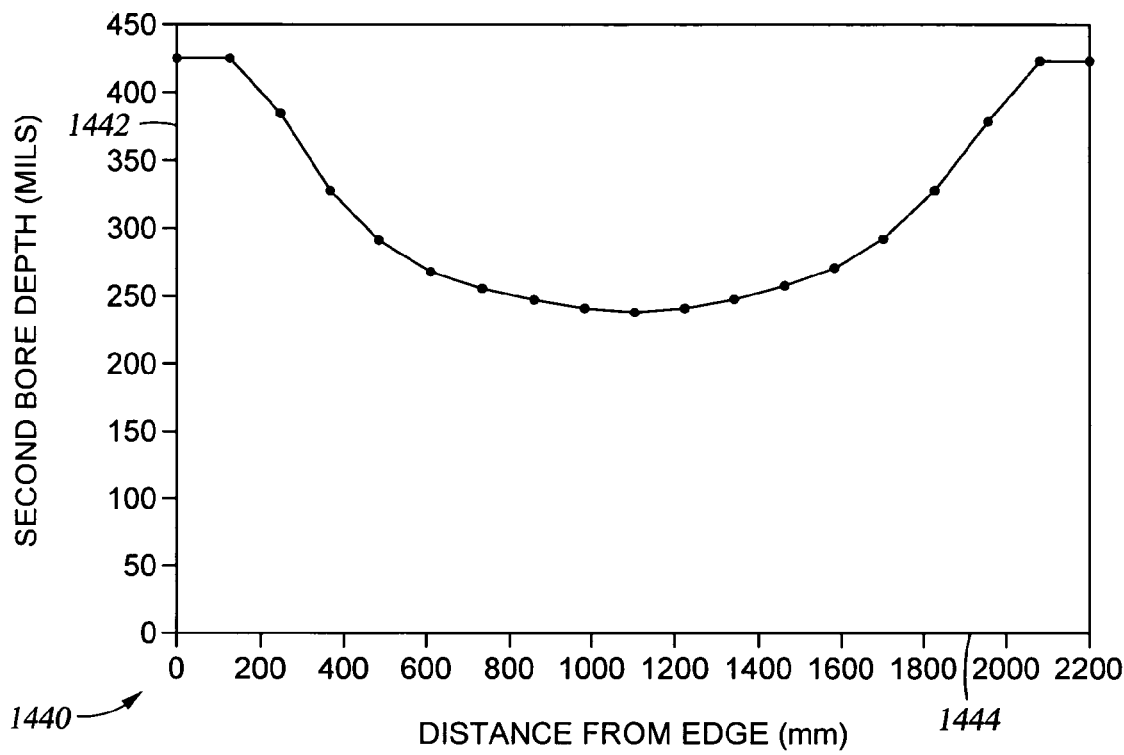
FIG. 14F shows a plot of one embodiment distribution of depths of diffuser bores of a diffuser plate used to process 1870 mm by 2200 mm substrates.

FIG. 14F shows the depth "d" measurement of the bores 386 across an exemplary diffuser plate which is used to process 1870 mm by 2200 mm substrates. FIG. 14F is a graph 1440 showing the second bore depth 1442 (in mil) as a function of its position 1444 (in mm) across the width of the diffuser plate. The measurement of depths of the bores in FIG. 14F shows a gradual increase in bore depth from the center to the edge of the diffuser plate. The downstream bore diameter would also gradually increase proportionately from the center toward the edge of the diffuser plate.

Figure 14G:
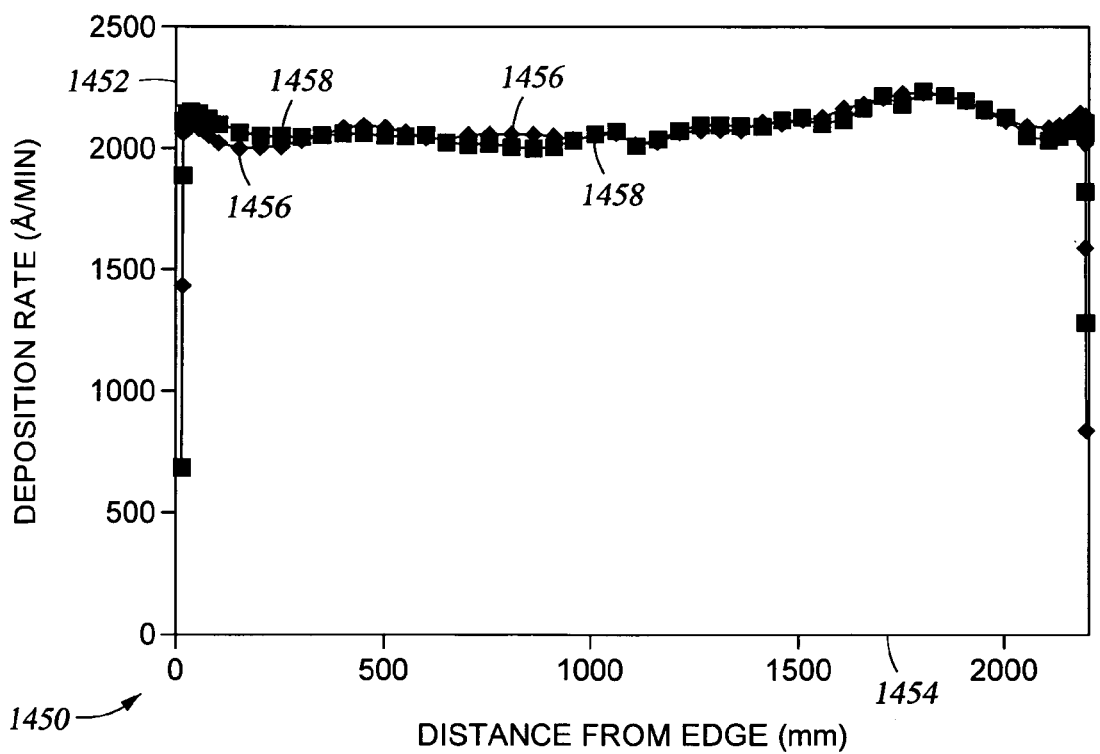
FIG. 14G shows a plot of deposition rates across an 1870 mm by 2200 mm substrate, with measurements made across a diagonal from edge to edge of the substrate.

FIG. 14G is a graph 1450 showing the deposition rate 2043 (in Å/min) of silicon nitride films as a function of the distance of travel 1454 (in mm) across a glass substrate upon which the films were deposited. Plots 1456 and 1458 show the deposition rates, with measurements made across two diagonals from edge to edge of the substrate and then plotted on a 2200 mm size. The SiN films were deposited in a PECVD chamber having a diffuser plate with a design similar to the one shown in FIGS. 14B, 14C, and 14F. The size of the substrate was 1870 mm by 2200 mm. Table Fifteen shows the film property distribution across the substrate. The diffuser plate includes diffuser holes with the general design shown in FIG. 12A. The diameter of the first bore 380 was 0.156 inch. The length 390 of the first bore 380 was 0.915 inch. The diameter 394 of the second bore 386 was 0.302 inch. The flaring angle 396 of the second bore 386 was 22 degrees. The length 392 of the second bore 386 was 0.377 inch. The diameter of the orifice hole 384 was 0.018 inch, and the length 376 of the orifice hole 384 was 0.046 inch.

The SiN films in Table Fifteen, below, were deposited using a precursor gas mixture of 5550 sccm SiH₄, 24,700 sccm NH₃, and 61,700 sccm N₂. The process chamber pressure was 1.5 Torr, and an RF source power of 19,000 W was applied. The spacing between the diffuser plate and the support assembly was 1.0 inch (1000 mils). The process temperature was maintained at about 350° C. Edge I and Edge II represent two extreme ends of the substrate, as described in the Table Eleven measurement description.

The film thickness and property data presented in Table Fifteen show a much smaller center to edge variation than the data in Table Eleven. The film thickness uniformity was 5.6%, which is much better than the 25.1% thickness uniformity for the film in FIG. 8B. The data shown in FIG. 8B and Table Eleven are film thickness and property data on a smaller substrate (1500 mm by 1800 mm) compared with the substrate (1870 mm by 2200 mm) used to generate the data presented in FIG. 14G and Table Fifteen. Film thickness and film property uniformities are expected to be worse for larger substrates. The film thickness uniformity of 5.6% and the improved film property data presented in Table Fifteen show that the modified diffuser plate design, with gradually increasing diameters and depths of diffuser bores extending from the center toward the outer edge of the surface on the downstream side of the diffuser plate, greatly improves the plasma density uniformity and film deposition thickness and physical property uniformity.

TABLE FIFTEEN

SiN Film Thickness and Property Measurement Using a Diffuser Plate with Gradually Varied Bore Depths and Diameters from Center to Edge for an 1870 mm by 2200 mm Substrate

| Measurement Location | Film Thickness (Å) | Refractive Index | Stress (×10⁹ dynes/cm²) | Si—H (atomic %) | Wet Etch Rate (Å/min) |
|---|---|---|---|---|---|
| Edge I | 6602 | 1.92 | −0.3 | 14.8 | 661 |
| Center | 6562 | 1.93 | −1.5 | 13.5 | 555 |
| Edge II | 6985 | 1.91 | −1.0 | 12.6 | 642 |

Although the sizes of the diffuser bores are non-uniform across the diffuser plate downstream surface, the overall distribution profiles of the diffuser bores shown in FIGS. 14D and 14F are symmetrical (e.g., the diffuser bore size increases uniformly from the center to the edges of the diffuser plate). In an alternative embodiment of the present invention, the diffuser bore distribution profile may be asymmetrical. In this case, the diffuser bore size does not increase uniformly from the center to the edges of the diffuser plate. For example, one edge of the diffuser plate may have larger diffuser bores, or a greater number of large diffuser bores, than the opposing edge of the diffuser plate. Such a design would typically be used if the configuration of the processing chamber interior is asymmetrical, for example, if there is a vacuum port on one side of the chamber and not on the other side. There are a number of apparatus conformations which can be compensated for by adjustment of gas diffusion plate hollow cathode design.

Although the exemplary diffuser plate described herein is rectangular, the invention applies to diffuser plate of other shapes and sizes. It is also important to mention that the downstream surface of the gas diffusion plate does not have to be machined to be completely flat across the entire surface. As long as the diameters and depths of the bores are increased gradually from center to edge of the diffuser plate and the downstream surface of the gas diffusion plate is properly positioned relative to the underlying substrate, the diffuser plate may exhibit some curvature. For example, the downstream surface of the diffuser plate may be flat or concave or convex. Concave surfaces are typically preferred in order to maintain the shape of the diffuser plate over time under high temperature processing conditions.

Figure 15A:
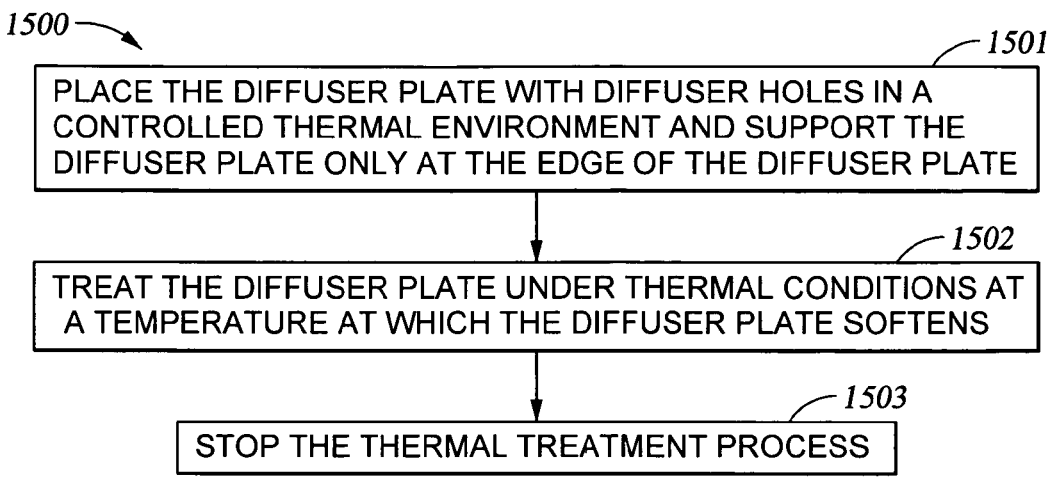
FIG. 15A shows the process steps for deforming a diffuser plate using a thermal process.
Figure 15B:
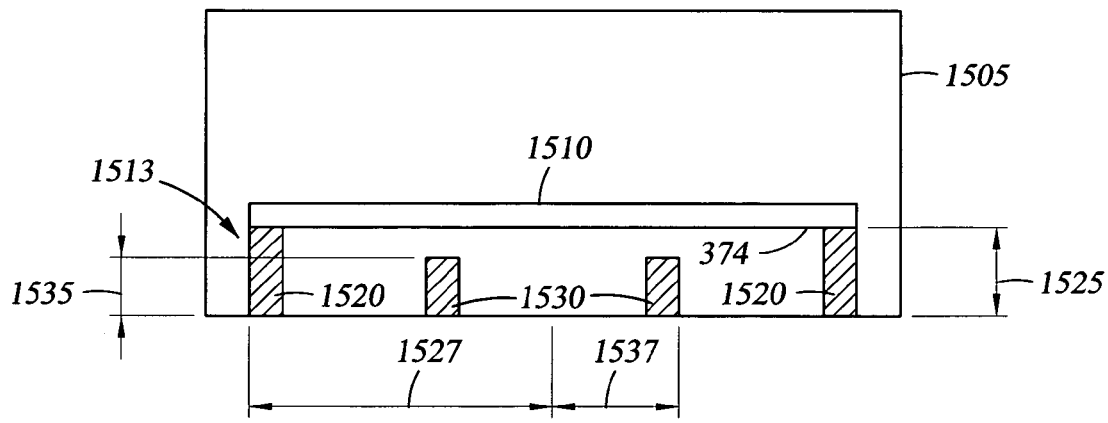
FIG. 15B shows the diffuser plate on supports in a thermal environment that could be used to deform the diffuser plate.

There are also many ways to create curvature of the diffuser plate. One method is to thermally treat the diffuser plate at a temperature at which the diffuser plate softens (such as a temperature of greater than 400° C. for aluminum) for a period of time while supporting only the edge of the diffuser plate. When the metal diffuser plate softens under the high temperature treatment, gravity will pull the center of the diffuser plate down and the diffuser plate will become curved. FIG. 15A shows the process steps for a process 1500 for such thermal treatment. Referring to FIGS. 15A and 15B, at step 1501, the diffuser plate 1510, which already has diffuser holes formed in it, is placed in an environment 1505 or chamber that can be thermally controlled. The diffuser plate 1510 is placed downstream side 374 (refer to FIG. 3C) facing down on a support fixture 1513, including support 1520 that only supports the edge of the diffuser plate 1510.

Figure 15C:
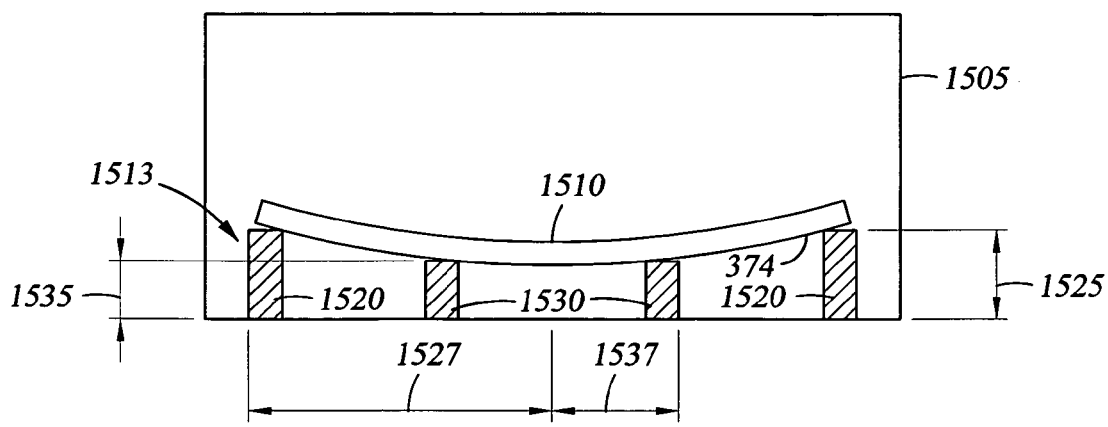
FIG. 15C shows the convex (bent) diffuser plate on the supports in the thermal environment.

Next, at step 1502, the temperature of the environment is raised and the diffuser plate 1510 is thermally treated at a temperature at which the diffuser plate softens. In one method embodiment, the thermal environment is maintained at a constant treatment temperature (iso-thermal) once the desired treatment temperature has been reached. After the diffuser plate 1510 has reached the desired deformation curvature, the thermal treatment process is stopped at step 1503. Note that in the support fixture 1513, optional diffuser support 1530 could be placed under diffuser plate 1510 at support height 1535 which is lower than the support height 1525 of support 1520, and at a support distance 1537 which is shorter than the support distance 1527 of support 1520. The optional support 1530 can help determine the diffuser curvature and is typically made of elastic materials which will not damage the diffuser plate, and which are able to withstand temperatures greater than the thermal conditioning temperature. The optional support can be (for example and not by way of limitation) a continuously curved single block or multiple short metal blocks which act as support shims within the support fixture 1513. FIG. 15C shows the curved diffuser plate 1510 resting on the diffuser plate supports 1520 and 1530 after the bending process.

Figure 16A:
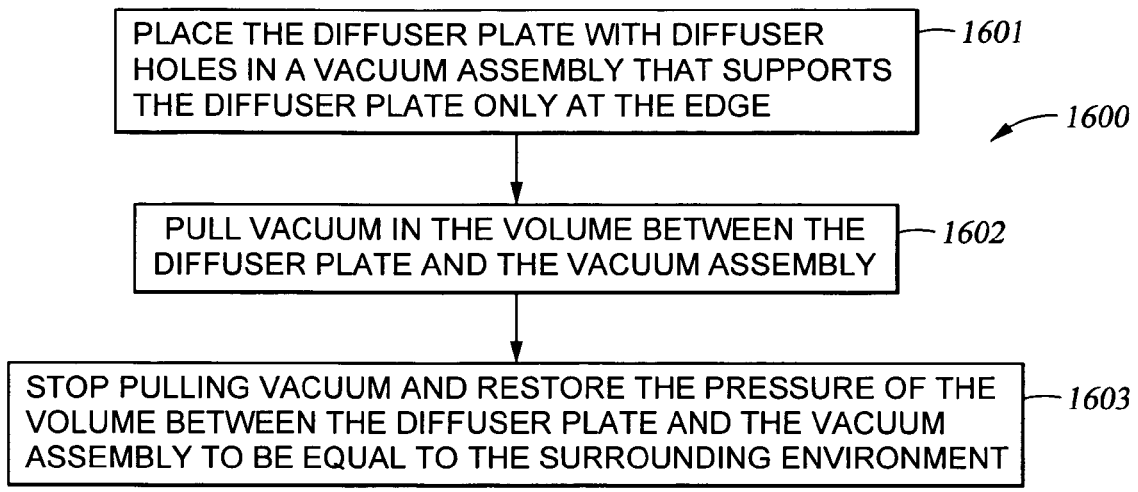
FIG. 16A shows the process steps for bending a diffuser plate using a vacuum process.
Figure 16B:
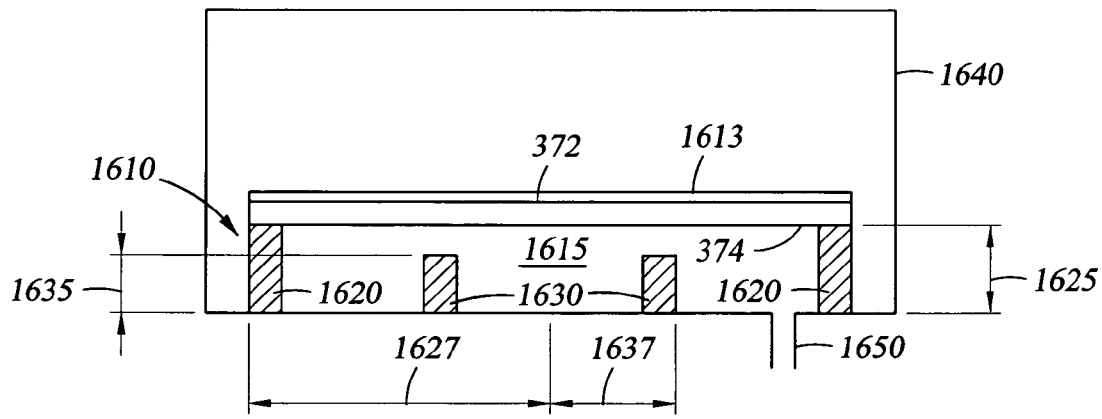
FIG. 16B shows the diffuser plate on a vacuum assembly.
Figure 16C:
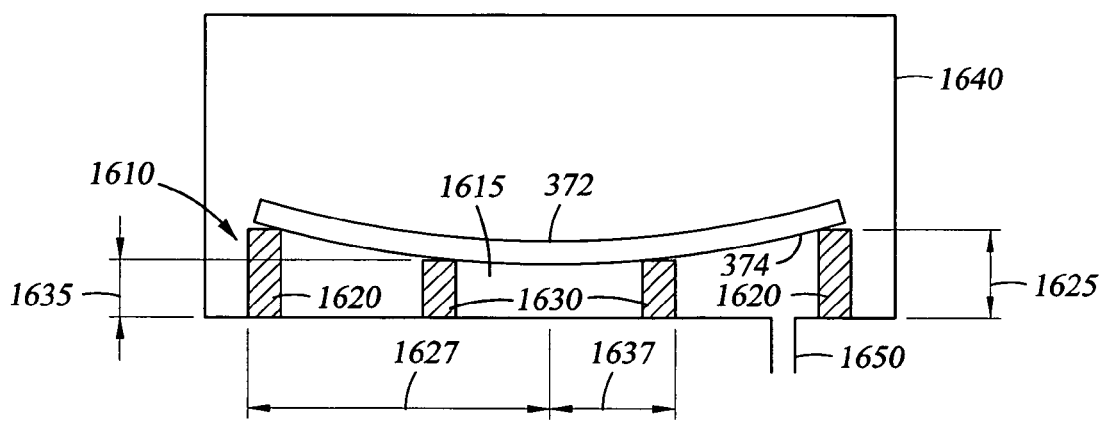
FIG. 16C shows the convex (bent) diffuser plate on the vacuum assembly.

Another method of creating deformation curvature is to use vacuum to apply a pressure which smoothly deforms the diffuser plate into a convex shape. FIG. 16A shows the process steps of a process 1600 for deforming a diffuser plate 1610 using such a vacuum process. Referring to FIGS. 16A and 16B, at step 1601, the diffuser plate 1610 (which already has diffuser holes formed in it) is placed downstream side 374 facing down on a vacuum assembly 1605. The upstream end 372 of the diffuser plate 1610 is sealed with a cover 1613. The material used to form cover 1613 which seals against surface 374 of diffuser plate 1610 must be strong enough to maintain its integrity under vacuum, while providing a seal against the surface of upstream end 374 of gas diffusion plate 1610. Initially, the vacuum assembly 1605 only supports the diffuser plate 1610 at the edge by means of diffuser plate holder 1620. The vacuum assembly 1605 is configured to have a pump channel 1650 through which a vacuum is applied in the volume 1615 between the diffuser plate 1610 and the vacuum assembly 1605 when the surface of upstream end 372 of the diffuser plate 1610 is covered. The pumping channel 1650 shown in FIGS. 16B and 16C is merely used to demonstrate the concept. There could be more than one pumping channel placed at different locations in the vacuum assembly 1605.

Next, at step 1602, a vacuum is pulled in the volume 1615 between the diffuser plate 1610 and the diffuser plate holder 1620. When the diffuser plate 1610 has reached the desired curvature, the vacuum process is stopped at step 1603 and the pressure of the volume 1615 between the diffuser plate 1610 and the vacuum assembly 1605 is restored to be equal to the surrounding environment 1640, to allow the diffuser plate 1610 to be removed from the vacuum assembly 1605. Note that in the vacuum assembly 1605, at least one optional diffuser support, such as diffuser support 1630, may be placed under diffuser plate 1610 at a support height 1635 which is lower than the support height 1625 of the diffuser plate support 1620, and at a support distance 1637 which is shorter than the support distance 1627 of support 1620. An optional support, such as support 1630, can help determine the diffuser curvature and is typically made of elastic materials which will not damage the diffuser plate 1610 and which are able to withstand temperatures greater than the thermal conditioning temperature. The optional support can be (for example and not by way of limitation) a continuously curved single block or multiple short metal blocks. FIG. 16C shows the curved diffuser plate 1610 resting on the diffuser plate supports 1620 and 1630 after the bending process.

Figures 17A, 17B:
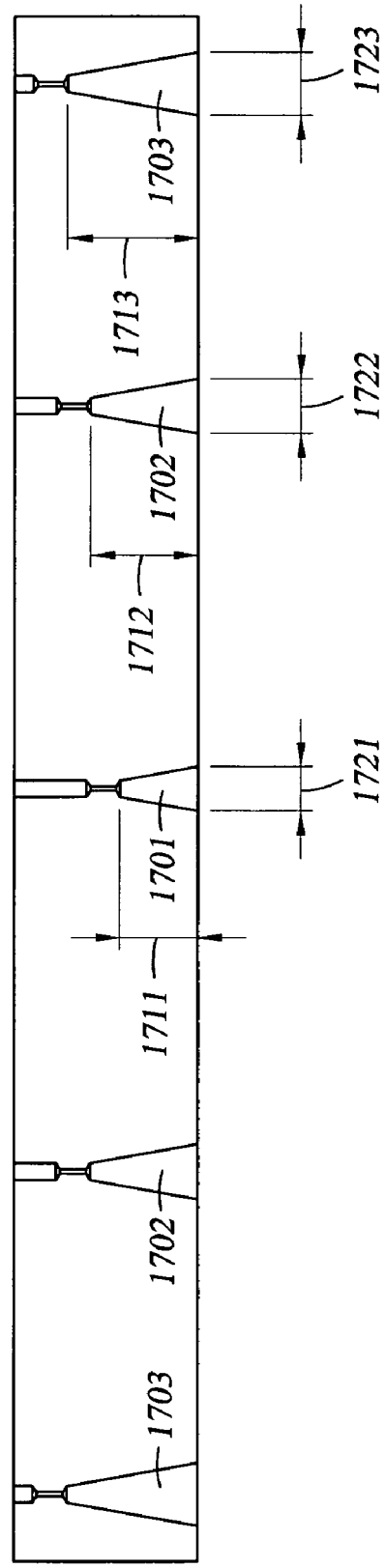
FIG. 17A shows the process steps for creating a diffuser plate with varying diameters and depths of bores that extends to the downstream side of the diffuser plate.
FIG. 17B shows the cross section of a diffuser plate with varying diameters and depths of bores within the diffuser plate.
Figure 17C:
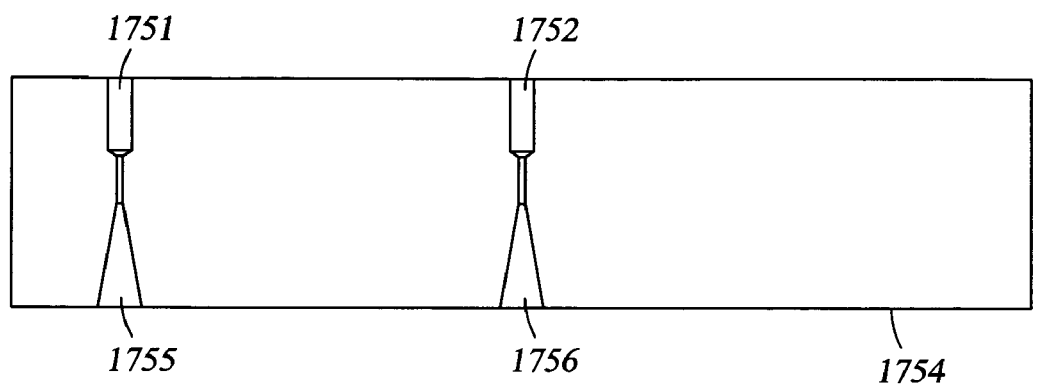
FIG. 17C shows a diffuser plate with substantially identical diffuser holes from center to edge of the diffuser plate.

Another method of producing the desired downstream cone (386 in FIG. 3C) depth, cone diameter, cone flaring angle, or a combination of these three parameters is by drilling the diffuser holes with varying cone depth, cone diameter, or cone flaring angles from the center to the edge of the diffuser plate. Drilling can be performed by computer numerically controlled (CNC) machining. FIG. 17A shows the process steps for a process 1700 for such a drilling process. The process 1700 starts at step 1730 by creating bores that extend to the downstream side of a diffuser plate, with gradually increasing bore depths and/or bore diameters from the center to the edge of the diffuser plate. The cone flaring angle may also be varied from the center to the edge of the diffuser plate.

Next, at step 1740, the process is completed by creating the remaining portions of the gas passages of the diffuser plate. The downstream cones can be created using drill tools. If drill tools with the same flaring angle are used across the diffuser plate, the cone flaring angles would remain constant while the cone depth and/or cone diameter are varied. The cone diameter is determined by the flaring angle and the cone depth. It is important to vary the cone depth smoothly and gradually to ensure smooth deposition thickness and film property change across the substrate.

FIG. 17B shows an illustration of one embodiment of varying cone depths and cone diameters. Diffuser hole 1701 is near the center of the diffuser plate 1710 and has the smallest cone depth 1711 and cone diameter 1721. Diffuser hole 1702 is between the center and edge of the diffuser plate 1710 and has a medium cone depth 1712 and cone diameter 1722. Diffuser hole 1703 is near the edge of the diffuser plate and has the largest cone depth 1713 and cone diameter 1723. The cone flaring angle of all diffuser holes are the same for the diffuser plate design shown in FIG. 17B in this illustration. However, it is possible to optimize deposition uniformity by varying the cone design across the diffuser plate in a number of manners which involve varying combinations of cone diameters, cone depths, and flaring angles. Changing the cone depth and cone flaring angle (which affects the cone diameter) affects the total cone surface area, which alters the hollow cathode effect. As previously mentioned, a smaller cone surface area lowers the plasma ionization efficiency.

Figure 17D:
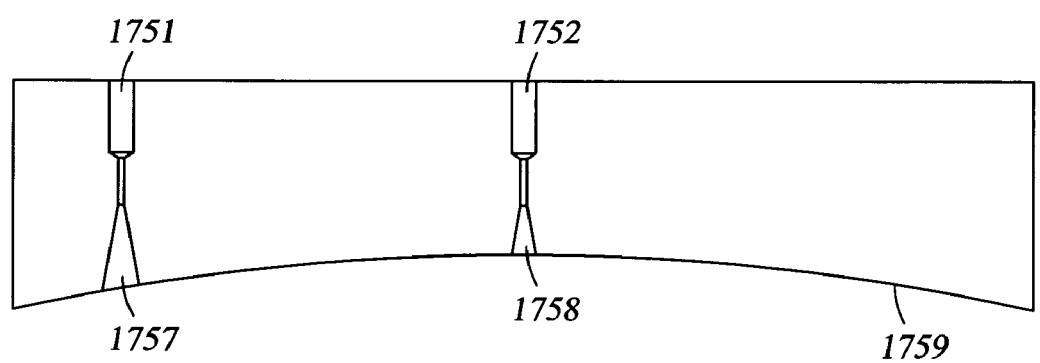
FIG. 17D shows the diffuser plate of FIG. 17C after the bottom surface has been machined into a concave shape.

Yet another method of obtaining the desired downstream bore (386 in FIG. 3C) depth ("d") and bore diameter ("D") is by drilling identical diffuser holes having identical downstream bores 1755 and 1756 across the diffuser plate, and subsequently machining out the downstream surface 1754 to a concave shaped surface 1759 (shown in FIG. 17D). Machining can be performed by computer numerically controlled machining or other types of controlled machining to make the machining process repeatable.

Figure 17E:
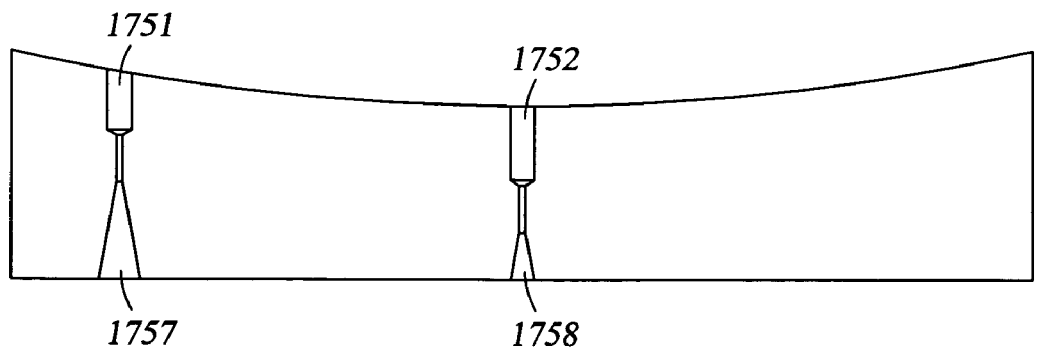
FIG. 17E shows the diffuser plate of FIG. 17D after its bottom surface has been pulled substantially flat.

After machining the downstream surface 1754 to a concave shape (surface 1759), the downstream bore 1758 at the center (inner region) of the diffuser plate has a smaller diameter ("D") and a smaller length ("d") than the downstream bore 1757 at the edge (outer region) of the diffuser plate. The diffuser plate can be left as shown in FIG. 17D, or the downstream surface 1759 can be pulled flat, as shown in FIG. 17E, or pulled to other curvatures (not shown), to be used in a process chamber to achieve the desired film deposition results.

Figure 17F:
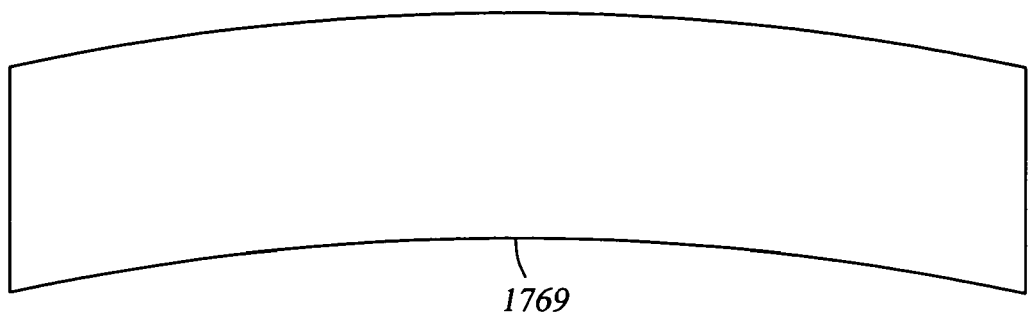
FIG. 17F shows a diffuser plate, without any diffuser holes, where the bottom surface has been deformed into a concave shape.
Figure 17G:
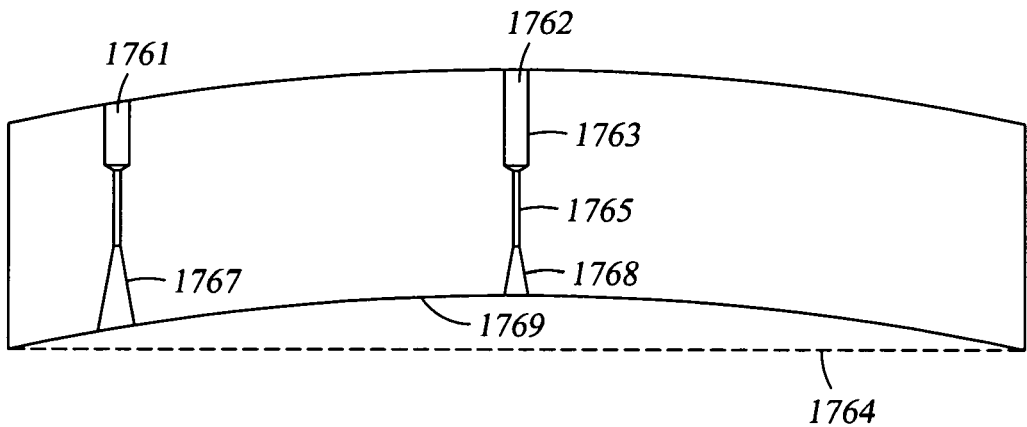
FIG. 17G shows the diffuser plate of FIG. 17F with diffuser holes.
Figure 17H:
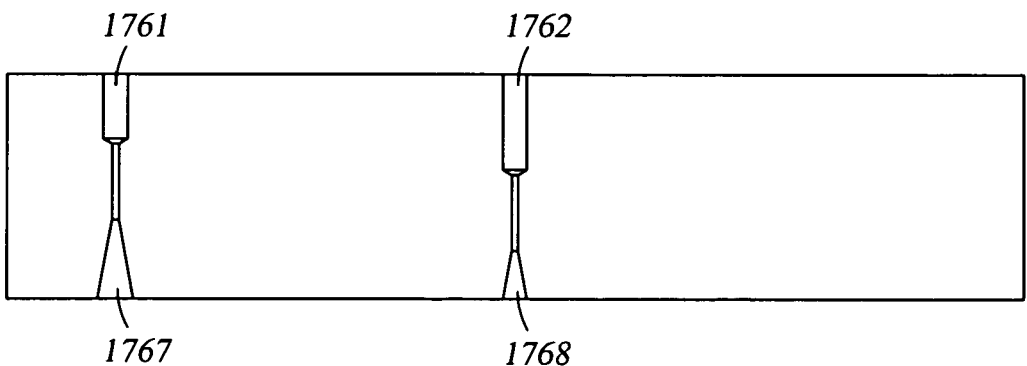
FIG. 17H shows the diffuser plate of FIG. 17G after its bottom surface has been pulled substantially flat.

Yet another method of obtaining the desired downstream bore (386 in FIG. 3C) depth ("d") and bore diameter ("D") is by beginning with a diffuser plate having a concave shape before the formation of diffuser holes in the diffuser plate, as shown in FIG. 17F. Referring to FIG. 17G, the downstream bores are drilled to the same depth in downstream surface 1769 using the same type of drill from a fictitious flat surface 1764, as shown in FIG. 17G. Although downstream bore 1768 at the center of the diffuser plate is drilled to the same depth from the fictitious surface 1764 as the downstream bore 1767, the diameter and length of the downstream bore 1768 are smaller than the diameter and length of the downstream bore 1767. The rest of the diffuser holes, which include orifice holes 1765, upstream bores 1763, and connecting bottoms, are machined to complete the diffuser holes. All orifice holes and upstream bores typically have identical diameters, by way of example and not by way of limitation. The diameters and lengths of the orifice holes are typically kept the same across the diffuser plate (as shown in FIG. 17G). The orifice holes control the back pressure. By keeping the diameters and the lengths of the orifice holes the same across the diffuser plate, the back pressure, which affects the gas flow, can be kept the same across the diffuser plate. The diffuser plate can be left as shown in FIG. 17G, or the downstream surface 1769 can be pulled flat, as shown in FIG. 17H, or pulled to other curvatures (not shown), to be used in a process chamber to achieve the desired film deposition results.

The changes in diameters and/or lengths of the hollow cathode cavities do not have to be perfectly continuous from the center to the edge of the diffuser plate, as long the changes are smooth and gradual. These changes can be accomplished using a number of uniform zones arranged in a concentric pattern, as long as the change from zone to zone is sufficiently small. However, there needs to be an overall increase in the size (volume and/or surface area) of the hollow cathode cavity from the center toward the edge of the diffuser plate.

Figure 17I:
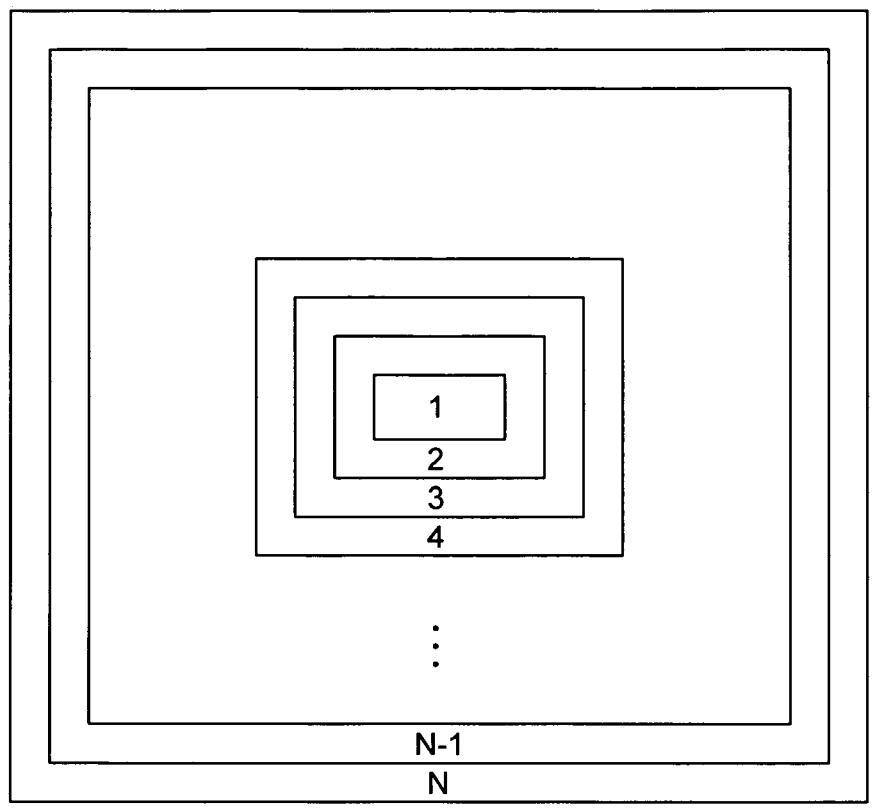
FIG. 17I shows a diffuser plate with multiple zones where the size and/or shape of the diffuser holes may be varied in each zone.

FIG. 17I shows a schematic plot of the bottom view (downstream side) of a diffuser plate which has been divided into N concentric zones. Concentric zones are defined as areas between an inner boundary and an outer boundary, which both have the same geometric shape as the overall shape of the diffuser plate. Within each zone, the diffuser holes are identical. From Zone 1 to Zone N, the hollow cathode cavities gradually increase in size (volume and/or surface area). The increase can be accomplished by an increase in the hollow cathode cavity diameter, length, flaring angle, or a combination of these parameters.

Figure 17J:
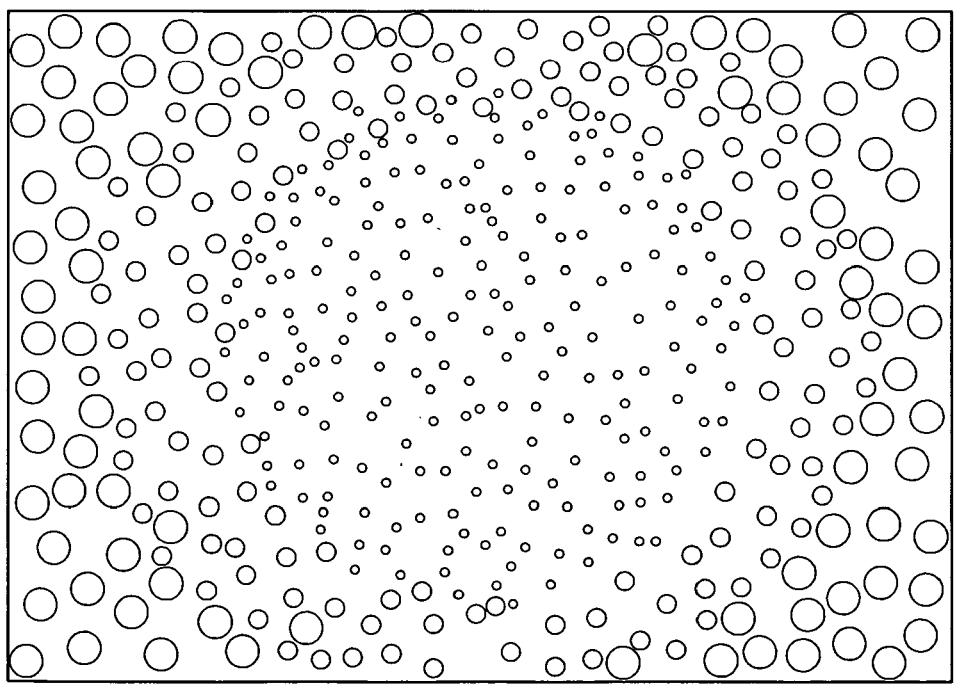
FIG. 17J shows a diffuser plate with varying hollow cathode cavity diameters, where the outer region hollow cathode cavity volume and/or cavity surface area is greater than the inner region hollow cathode cavity volume and/or cavity surface area.
Figure 17K:
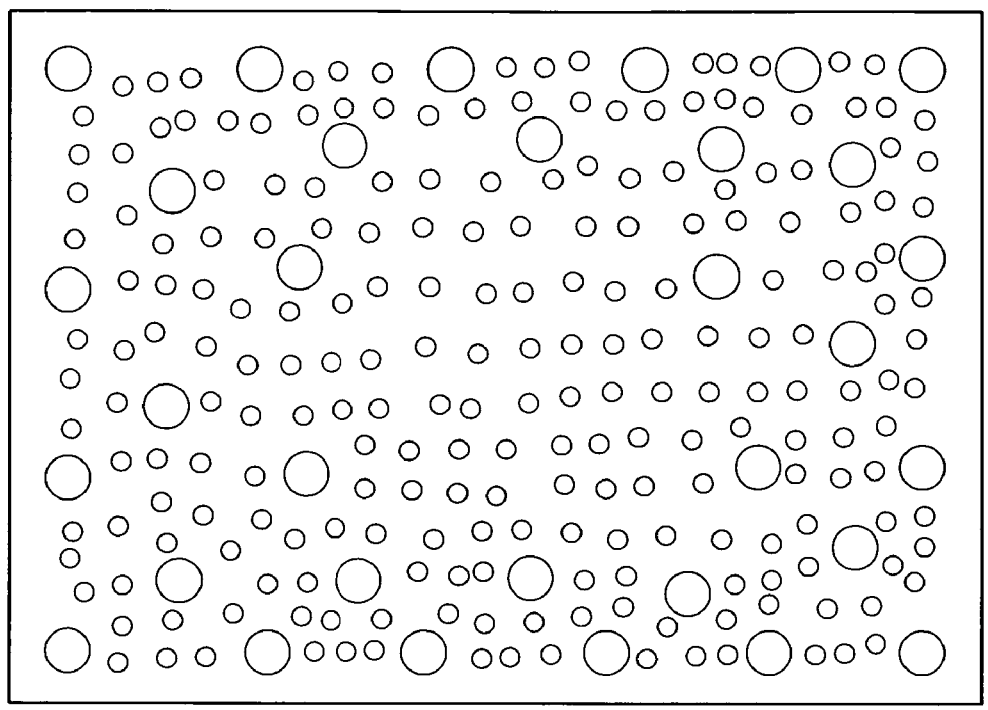
FIG. 17K shows a diffuser plate where most of the hollow cathode cavities are the same, with a few larger hollow cathode cavities near the edge of the diffuser plate.

The increase in diameters and/or lengths of the hollow cathode cavities from the center to the edge of the diffuser plate do not need to apply to all of the diffuser holes in the diffuser plate, as long as there is an overall increase in the size (volume and/or surface area) of the hollow cathode cavities per downstream diffuser plate surface area of the hollow cathode cavities. For example, some diffuser holes could be kept the same throughout the diffuser plate, while the rest of the diffuser holes have a gradual increase in the size (volumes and/or surface areas) of the hollow cathode cavities. In another example, the diffuser holes have a gradual increase in size (volumes and/or surface areas) of the hollow cathode cavities, while there are some small hollow cathode cavities at the edge of the diffuser plate, as shown in FIG. 17J. Yet in another example, most of the hollow cathode cavities are uniform across the diffuser plate, while there are a few larger hollow cathode cavities towards the edge of the diffuser plate, as shown in FIG. 17K.

We can define the hollow cathode cavity volume density as the cumulative volume of the hollow cathode cavities per downstream diffuser plate surface. Similarly, we can define the hollow cathode cavity surface area density of the hollow cathode cavity as the total surface area of the hollow cathode cavities per downstream diffuser plate surface area of the hollow cathode cavities. The results presented in the Tables Thirteen, Fourteen, and Fifteen, above, show that plasma and process uniformities can be improved by a gradual increase in either the hollow cathode cavity volume density or the hollow cathode cavity surface area density of the hollow cathode cavities from the inner regions to the outer regions of the diffuser plate, or from the center to the edge of the diffuser plate.

Another way to change the film deposition thickness and property uniformity is by changing the numerical density of the diffuser holes across the diffuser plate, while keeping the diffuser hole sizes identical. The numerical density of the diffuser holes is calculated by dividing the total surface of holes of bores 386 (refer to FIG. 3C) intersecting the downstream side 374 by the total surface of downstream side 374 of the diffuser plate in the measured region. The numerical density of the diffuser holes can be varied from about 10% to about 100%, and is typically varied from about 30% to about 100%.

To reduce the "dome shape" problem, the diffuser hole numerical density should be lowered in the inner region compared to the outer region, to reduce the plasma density in the inner region. The changes in the diffuser hole density from the inner region to the outer region should be gradual and smooth to ensure uniform and smooth deposition and film property profiles.

Figure 18:
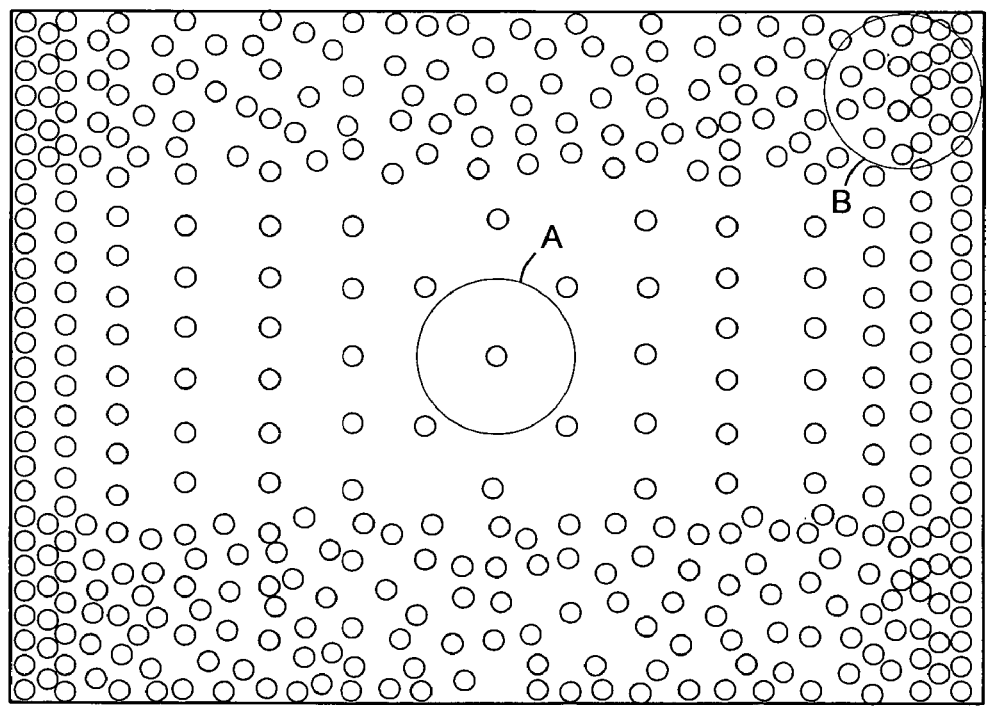
FIG. 18 shows the downstream side view of a diffuser plate with varying diffuser hole densities.

FIG. 18 shows the gradual change of diffuser hole numerical density from low in the center (region A) to high at the edge (region B) of the diffuser plate. The lower numerical density of diffuser holes in the center region of the diffuser plate would reduce the plasma density in the center region and reduce the "dome shape" problem. The arrangement of the diffuser holes in FIG. 18 is merely used to demonstrate the increasing diffuser hole numerical density from center to edge. The present invention applies to any diffuser hole arrangement or pattern. The numerical density change concept can also be combined with the diffuser hole design change concept to improve center to edge uniformity. When the numerical density of the gas passages is varied to achieve plasma uniformity, the spacing of hollow cathode cavities at the downstream end surface of the diffuser plate may exceed 0.6 inch in some areas.

The inventive concept of a gradual increase in hollow cathode cavity size (volume and/or surface area) from the center to the edge of the diffuser plate can be accomplished by a combination of the hollow cathode cavity size (volume and/or surface area) and shape variation, with or without diffuser hole numerical density variation, using one of the applicable diffuser plate fabrication methods previously described, such as the deformation method or variable hollow cathode cavity machining method. For example, the concept of increasing the density of the diffuser holes from the center to the edge of the diffuser plate can be used while increasing the diameter of the hollow cathode cavity (or downstream bore) from the center to the edge of the diffuser plate. The diffuser plate may be kept flat and the diffuser holes drilled by the CNC method. The possible combinations are numerous. Therefore, the general concept of the invention is very capable of meeting a variety of film thickness and film property uniformity requirements.

Up to this point, the various embodiments of the invention have been described with respect to increasing the diameters and the lengths of the hollow cathode cavities from the center of the diffuser plate to the edge of the diffuser plate, to improve the plasma uniformity across the substrate. There are situations that might require the diameters and the lengths of the hollow cathode cavities to decrease from the center of the diffuser plate to the edge of the diffuser plate. For example, the power source might be lower near the center of the substrate, and the hollow cathode cavities need to be larger near the center of the substrate to compensate for the lower power source. The concept of the invention, therefore, also applies to decreasing the sizes (volumes and/or areas) of hollow cathode cavities from the center of the diffuser plate toward the edge of the diffuser plate.

The concept of the invention applies to any design of gas diffuser holes, which includes any hollow cathode cavity design, and to any shapes and sizes of gas diffuser plates. The concept of the invention applies to a diffuser plate that utilizes multiple designs of gas diffuser holes, which includes multiple designs of hollow cathode cavities. The concept of the invention applies to diffuser plates of any curvature and diffuser plates made of any material, for example, aluminum (Al), tungsten (W), chromium (Cr), tantalum (Ta), or combinations thereof, among others, and by any methods, for example, cast, brazed, forged, hot iso-statically pressed or sintered. The concept of the invention also applies to diffuser plates made of multiple layers of materials that are pressed or glued together. In addition, the concept of the invention can be used in a chamber that is part of a cluster system, a stand-alone system, an in-line system, or any other applicable system.

Example Four

PECVD Deposition of a-SiN$_x$:H Gate Dielectric Layers and a-Si Layers of Uniform Thickness by Controlling a Combination of Process Parameters Using the AKT™ 40 K PECVD System with a Modified Diffuser Plate As discussed above, when a substrate exceeds a surface area of about 30,000 cm$^2$, process recipe modifications provide only a limited amount of help in correcting for film uniformity issues. We discovered that we could obtain much more effective results with respect to control of film uniformity issues by providing processing apparatus which improved plasma point density across the substrate surface.

We performed a series of experiments to determine the advantageous ranges for each process parameter, in order to provide maximum control over surface standing wave effects and uniformity of film properties (especially film thickness), when PECVD deposition is performed in a PECVD chamber having a modified diffuser plate. The experiments described below were performed in an AKT™ 40 K PECVD System, which is capable of processing substrates having dimensions of up to 1870 mm×2200 mm. The AKT™ 40 K PECVD System, which is described above in "APPARATUS FOR PRACTICING THE INVENTION" and shown schematically in FIGS. 19A-19C, included a gas distribution assembly having a diffuser plate which was modified as described in Example Three, above.

Tables Sixteen and Seventeen, below, present advantageous operating ranges for each process parameter during PECVD deposition of a-Si$_x$NH gate dielectric layers and a-Si layers.

TABLE SIXTEEN

Process Conditions for PECVD Deposition of a-SiN$_x$:H Films in an AKT ™ 40 K PECVD System

| | Typical Process Conditions | Advantageous Process Conditions |
|---|---|---|
| SiH$_4$ Flow (sccm) | 1000-9000 | 1200-7000 |
| NH$_3$ Flow (sccm) | 10,000-50,000 | 15,000-50,000 |
| N$_2$ Flow (sccm) | 20,000-120,000 | 20,000-90,000 |
| Total Gas Flow Rate (sccm) | 40,000-150,000 | 60,000-120,000 |
| RF Power (kW) | 5-30 | 7-22 |
| RF Power Density (W/cm$^2$) | 0.125-0.75 | 0.175-0.55 |
| Chamber Pressure (Torr) | 0.7-2.5 | 0.9-1.8 |
| Substrate Temp. (° C.) | 100-400 | 240-340 |
| Electrode Spacing (mils) | 400-1200 | 450-1100 |
| NH$_3$:SiH$_4$ | 2-30 | 2-15 |
| N$_2$:SiH$_4$ | 5-80 | 5-60 |
| NH$_3$:N$_2$ | 0.1-3 | 0.15-2.0 |
| % vol. H$_2$ | 0-30 | 15-25 |

TABLE SEVENTEEN

Process Conditions for PECVD Deposition of a-Si Films in an AKT ™ 40 K PECVD System

| | Typical Process Conditions | Advantageous Process Conditions |
|---|---|---|
| SiH$_4$ Flow (sccm) | 2000-20,000 | 3000-12,000 |
| H$_2$ Flow (sccm) | 10,000-80,000 | 15,000-60,000 |
| Total Gas Flow Rate (sccm) | 15,000-100,000 | 20,000-70,000 |
| RF Power (kW) | 1.5-20 | 1.5-14 |
| RF Power Density (W/cm$^2$) | 0.0375-0.5 | 0.0375-0.35 |
| Chamber Pressure (Torr) | 1.0-4.0 | 1.5-3.0 |
| Substrate Temp. (° C.) | 100-400 | 240-340 |
| Electrode Spacing (mils) | 400-1200 | 400-1000 |
| H$_2$:SiH$_4$ | 2-10 | 3-6 |

Table Eighteen, below, presents typical film properties of a-SiN$_x$:H and a-Si films deposited according to the process conditions presented in Tables Sixteen and Seventeen, respectively.

TABLE EIGHTEEN

Typical Film Properties of a-SiN$_x$:H and a-Si Films

| Film Property | a-SiN$_x$:H Films | a-Si Films |
|---|---|---|
| Deposition Rate (Å/min) | 700-2500 | 200-2500 |
| Thickness Uniformity - 15[1] | ≦10 | ≦10 |
| Thickness Uniformity - 20[2] | ≦10 | ≦10 |
| Film Stress (dynes/cm$^2$) | $-9 \times 10^9$ to $+3 \times 10^9$ | $-9 \times 10^9$ to $-3 \times 10^9$ |
| Refractive Index | 1.85-1.95 | — |
| Wet Etch Rate (Å/min)[3] | 300-5000 | — |
| Si—H (%) | 0.1-22 | — |
| N—H (%) | 15-35 | — |
| Peak Position of Si—H Bond | — | 1995 |
| Width of Si—H Bond Peak | — | 95 |

[1]Variation in film thickness uniformity, excluding 15 mm from edge of substrate.
[2]Variation in film thickness uniformity, excluding 20 mm from edge of substrate.
[3]In Buffer Oxide Etchant 6:1.

Figure 21:
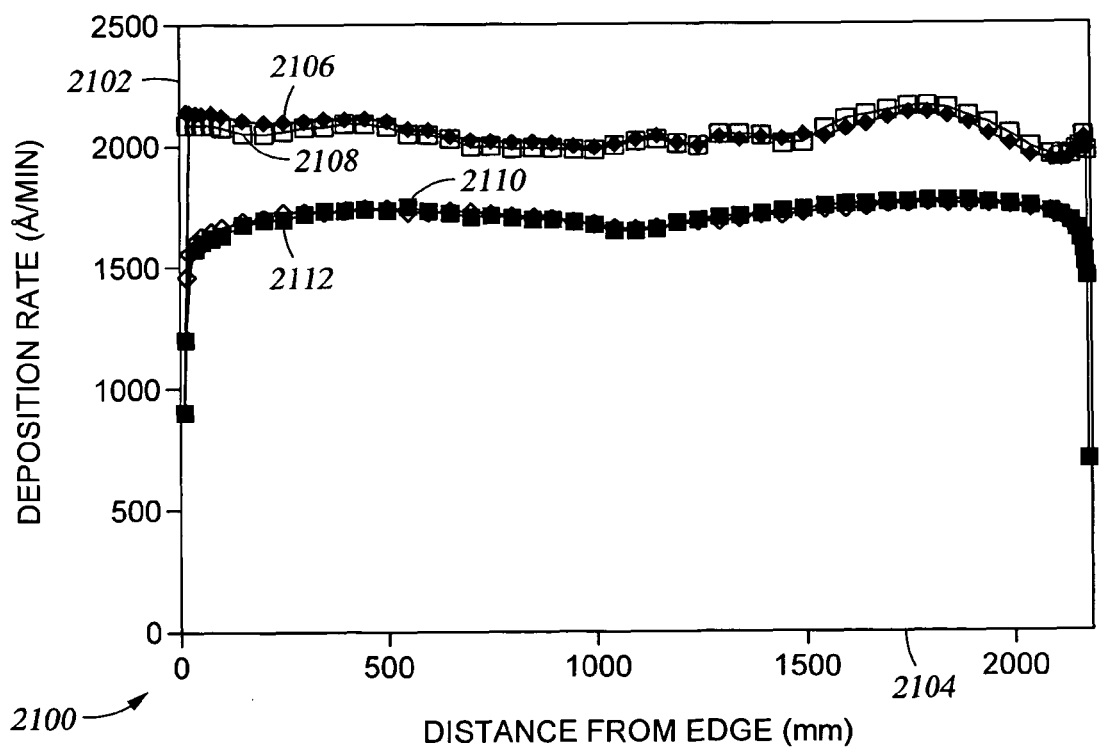
FIG. 21 is a graph of the film thickness (in nm) as a function of the distance of travel (in mm) across the width of the substrate, where the width of the substrate was 2200 mm and the length of the substrate was 1870 mm (for a total substrate area of 41,140 cm$^2$), for a-SiN$_x$:H and a-Si films which were PECVD deposited in a process chamber having an electrode spacing of 1050 mils, and using a differential hollow cathode cavity diffuser plate, where the diffuser plate was similar to that illustrated in FIG. 17D.

FIG. 21 shows film thickness data for a-SiN$_x$:H films and a-Si films which were PECVD deposited in an AKT™ 40 K PECVD System having an electrode spacing of 1000 mils, and using a modified diffuser plate having a diffuser cone depth ("d") profile as shown in FIG. 14F. FIG. 21 is a graph 2100 of the film deposition rate 2102 as a function of the distance of travel 2104 (in mm) across the width of the substrate, where the width of the substrate was 2200 mm, for the a-SiN$_x$:H films 2106, 2108, and a-Si films 2110, 2112. The variation in film thickness across the substrate surface (excluding 15 mm from the edge of the substrate) was 10% or less for both the a-SiN$_x$:H films and the a-Si films. The films were deposited under the following processing conditions: For the a-SiN$_x$:H films: 5000 sccm SiH$_4$; 22,200 sccm NH$_3$; 55,500 sccm N$_2$; 18 kW RF power to the plasma; 1.5 Torr process chamber pressure; 330° C. substrate temperature; and 1050 mils spacing between the upper and lower electrodes within the PECVD processing chamber. For the a-Si films: 10,000 sccm SiH$_4$; 36,000 sccm H$_2$; 10 kW RF power to the plasma; 2.5 Torr process chamber pressure; 330° C. substrate temperature; and 700 mils spacing between the upper and lower electrodes within the PECVD processing chamber.

While the invention has been described in detail above with reference to several embodiments, various modifications within the scope and spirit of the invention will be apparent to those of working skill in this technological field. For example, with respect to other active matrix displays, such as light-emitting diodes, layers of material other than silicon nitride-containing films may be deposited using the method of the invention. For example, organic-based, carbon-containing films may be deposited using the method. One skilled in the art, upon reading applicants' disclosure, can adjust other process variables, such as substrate temperature, process chamber pressure, precursor gas mixture, total precursor gas flow rate, and electrode spacing to provide the uniform film thickness and film physical properties desired. In many instances, the plasma point density at particular locations adjacent the gas distribution plate surface or on a substrate surface may be adjusted to compensate for the shape and size of the substrate so that a uniform thickness of deposited film is achieved. The plasma point density at particular locations adjacent the gas diffusion plate surface or on a substrate surface may also be adjusted to compensate for process chamber design features, to help ensure deposition of a film having a uniform thickness.

Accordingly, the scope of the invention should be measured by the appended claims.

We claim:

1. A method of improving film deposition uniformity of a PECVD deposited silicon nitride-comprising passivation dielectric film and obtaining a breakdown voltage of about 5 MV/cm or higher over a substrate surface having an equivalent radius of about 0.5 meter or greater, the method comprising:
   providing a substrate surface having an equivalent radius of about 0.5 meter or greater within a PECVD processing chamber;
   supplying a plasma source gas comprising NH$_3$, SiH$_4$, N$_2$, and H$_2$, where the ratio of NH$_3$:SiH$_4$ ranges from about 5.6 to about 11.1, where the ratio of N$_2$:SiH$_4$ ranges from about 5.8 to about 20.8, and wherein an amount of H$_2$ added to the plasma source gas is controlled so that the amount of H$_2$ does not exceed 30 volume % of the total gas flow to said processing chamber, whereby film uniformity across said substrate surface varies by less than about 10%, and a breakdown voltage of said silicon nitride-comprising passivation dielectric film does not fall below about 5 MV/cm.

2. A method in accordance with claim 1, wherein a plasma sheath thickness, s, between a parallel plate electrode and a plasma region present within said processing chamber is more than about 20 mils.

3. A method in accordance with claim 1, wherein spacing between electrodes within said processing chamber ranges between about 400 mils and 1200 mils.

4. A method in accordance with claim 1, wherein power applied to said PECVD processing chamber to produce said plasma is RF power which is applied at a frequency ranging between about 27.12 MHZ and about 7 MHZ.

5. A method in accordance with claim 1, wherein the total gas flow to said processing chamber is such that the volumetric gas turnover is at least 0.015 process chamber volumes per minute.

6. A method in accordance with claim 5, wherein said volumetric gas turnover ranges from about 0.015 to about 0.08 processing chamber volumes per minute.

7. A method in accordance with claim 6, wherein said volumetric gas turnover ranges from about 0.02 to about 0.07 processing chamber volumes per minute.

8. A method in accordance with claim 1, wherein the temperature of said substrate ranges from about 100° C. to about 400° C. during deposition of said silicon nitride-comprising passivation dielectric film.

9. A method in accordance with claim 8, wherein the temperature of said substrate ranges from about 240° C. to about 340° C. during deposition of said silicon nitride-comprising passivation dielectric film.

10. A method in accordance with claim 1, wherein a ratio of NH$_3$ to SiH$_4$ within said plasma source gas is within a range of about 2:1 to about 30:1.

11. A method in accordance with claim 10, wherein a ratio of NH$_3$ to SiH$_4$ within said plasma source gas is within a range of about 2:1 to about 15:1.

12. A method in accordance with claim 10, wherein RF power is provided to said processing chamber at a power density within the range of about 0.175 W/cm$^2$ to about 0.55 W/cm$^2$.

13. A method in accordance with claim 1, wherein a ratio of N$_2$ to SiH$_4$ within said plasma source gas is within a range of about 5:1 to about 80:1.

14. A method in accordance with claim 13, wherein a ratio of N$_2$ to SiH$_4$ within said plasma source gas is within a range of about 5:1 to about 60:1.

15. A method in accordance with claim 1, wherein a ratio of NH$_3$ to N$_2$ within said plasma source gas is within a range of about 1:10 to about 3:1.

16. A method in accordance with claim 15, wherein a ratio of NH$_3$ to N$_2$ within said plasma source gas is within a range of about 1:7 to about 2:1.

17. A method in accordance with claim 1, wherein said H$_2$ comprises about 15 volume % to about 25 volume % of said plasma source gas.

18. A method in accordance with claim 1, wherein a process chamber pressure during film deposition is within the range of about 0.7 Torr to about 2.5 Torr.

19. A method in accordance with claim 18, wherein said process chamber pressure is within the range of about 0.9 Torr to about 1.8 Torr.

20. A method in accordance with claim 1, wherein RF power is provided to said processing chamber at a power density within the range of about 0.125 W/cm$^2$ to about 0.75 W/cm$^2$.

* * * * *